US009885959B2

(12) United States Patent
Kudo et al.

(10) Patent No.: US 9,885,959 B2
(45) Date of Patent: Feb. 6, 2018

(54) ILLUMINATION OPTICAL APPARATUS HAVING DEFLECTING MEMBER, LENS, POLARIZATION MEMBER TO SET POLARIZATION IN CIRCUMFERENCE DIRECTION, AND OPTICAL INTEGRATOR

(71) Applicant: NIKON CORPORATION, Tokyo (JP)

(72) Inventors: Takehito Kudo, Kumagaya (JP); Shigeru Hirukawa, Kita-ku (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 13/890,547

(22) Filed: May 9, 2013

(65) Prior Publication Data

US 2013/0308114 A1    Nov. 21, 2013

Related U.S. Application Data

(63) Continuation of application No. 11/902,282, filed on Sep. 20, 2007, now Pat. No. 9,164,393, which is a
(Continued)

(30) Foreign Application Priority Data

Apr. 9, 2003  (JP) .................................. 2003-105920
Aug. 25, 2003 (JP) .................................. 2003-299628
(Continued)

(51) Int. Cl.
 *G03F 7/20* (2006.01)
 *G03B 27/42* (2006.01)
(52) U.S. Cl.
 CPC ......... *G03F 7/70191* (2013.01); *G03B 27/42* (2013.01); *G03F 7/701* (2013.01);
(Continued)

(58) Field of Classification Search
 CPC .. G03F 7/70191; G03F 7/701; G03F 7/70158; G03F 7/70566
(Continued)

(56) References Cited

U.S. PATENT DOCUMENTS 3,146,294 A    8/1964  Koester et al.
3,180,216 A    4/1965  Osterberg
(Continued)

FOREIGN PATENT DOCUMENTS

CN    1453645 A    5/2003
CN    1501175 A    6/2004
(Continued)

OTHER PUBLICATIONS

May 2, 2013 Office Action issued in Taiwanese Patent Application No. 101102214 (with translation).
(Continued)

*Primary Examiner* — Chia-How Michael Liu
(74) *Attorney, Agent, or Firm* — Oliff PLC

(57) ABSTRACT

An illumination optical apparatus illuminates a pattern on a mask with illumination light. The illumination optical apparatus includes an optical integrator arranged in an optical path of the illumination light, a deflecting member arranged in the optical path on an incidence side of the optical integrator, which deflects the illumination light, a lens element arranged in the optical path between the deflecting member and the optical integrator, which distributes the illumination light in a region, on a pupil plane of the illumination optical apparatus, away from an optical axis of the illumination optical apparatus, and a polarization member arranged in the optical path between the lens element and the optical integrator, which changes a polarization state of the illumination light so that a polarization direction of the
(Continued)

illumination light in the region is substantially coincident with a circumferential direction about the optical axis.

38 Claims, 22 Drawing Sheets

Related U.S. Application Data continuation of application No. 11/246,642, filed on Oct. 11, 2005, now Pat. No. 7,446,858, which is a continuation of application No. PCT/JP2004/004522, filed on Mar. 30, 2004.

(30) Foreign Application Priority Data

| Aug. 29, 2003 | (JP) | ................................ 2003-307806 |
| Sep. 19, 2003 | (JP) | ................................ 2003-329194 |
| Sep. 22, 2003 | (JP) | ................................ 2003-329309 |

(52) U.S. Cl.
CPC ...... *G03F 7/70108* (2013.01); *G03F 7/70158* (2013.01); *G03F 7/70566* (2013.01)

(58) Field of Classification Search
USPC ..................................................... 355/71, 67
See application file for complete search history.

(56) References Cited

U.S. PATENT DOCUMENTS

| 3,758,201 A | 9/1973 | MacNeille |
| 3,892,469 A | 7/1975 | Lotspeich |
| 3,892,470 A | 7/1975 | Lotspeich |
| 4,103,260 A | 7/1978 | Buchman |
| 4,175,830 A | 11/1979 | Marié |
| 4,198,123 A | 4/1980 | Kremen |
| 4,211,471 A | 7/1980 | Marié |
| 4,286,843 A | 9/1981 | Reytblatt |
| 4,346,164 A | 8/1982 | Tabarelli et al. |
| 4,370,026 A | 1/1983 | Dubroeucq et al. |
| 4,744,615 A | 5/1988 | Fan et al. |
| 4,755,027 A | 7/1988 | Schäfer |
| 4,952,815 A | 8/1990 | Nishi |
| 4,981,342 A | 1/1991 | Fiala |
| 5,072,126 A | 12/1991 | Progler |
| 5,216,541 A | 6/1993 | Takesue et al. |
| 5,251,222 A | 10/1993 | Hester et al. |
| 5,253,110 A | 10/1993 | Ichihara et al. |
| 5,272,501 A | 12/1993 | Nishi et al. |
| 5,312,513 A | 5/1994 | Florence et al. |
| 5,345,292 A | 9/1994 | Shiozawa et al. |
| 5,348,837 A | 9/1994 | Fukuda et al. |
| 5,365,371 A | 11/1994 | Kamon |
| 5,382,999 A | 1/1995 | Kamon |
| 5,436,761 A | 7/1995 | Kamon |
| 5,448,336 A | 9/1995 | Shiraishi |
| 5,459,000 A | 10/1995 | Unno |
| 5,467,166 A | 11/1995 | Shiraishi |
| 5,473,465 A | 12/1995 | Ye |
| 5,541,026 A | 7/1996 | Matsumoto |
| 5,559,583 A | 9/1996 | Tanabe |
| 5,610,683 A * | 3/1997 | Takahashi ........................ 355/53 |
| 5,610,684 A | 3/1997 | Shiraishi |
| 5,621,498 A | 4/1997 | Inoue et al. |
| 5,627,626 A | 5/1997 | Inoue et al. |
| 5,631,721 A | 5/1997 | Stanton et al. |
| 5,663,785 A | 9/1997 | Kirk et al. |
| 5,673,103 A | 9/1997 | Inoue et al. |
| 5,675,401 A | 10/1997 | Wangler et al. |
| 5,677,755 A | 10/1997 | Oshida et al. |
| 5,677,757 A | 10/1997 | Taniguchi et al. |
| 5,684,567 A | 11/1997 | Shiozawa |
| 5,691,803 A | 11/1997 | Song et al. |
| 5,707,501 A | 1/1998 | Inoue et al. |
| 5,739,898 A | 4/1998 | Ozawa et al. |
| 5,838,408 A | 11/1998 | Inoue et al. |
| 5,841,500 A | 11/1998 | Patel |
| 5,933,219 A | 8/1999 | Unno |
| 5,969,441 A | 10/1999 | Loopstra et al. |
| 6,031,658 A | 2/2000 | Riza |
| 6,191,829 B1 | 2/2001 | Hashimoto |
| 6,191,880 B1 | 2/2001 | Schuster |
| 6,208,407 B1 | 3/2001 | Loopstra |
| 6,211,944 B1 | 4/2001 | Shiraishi |
| 6,229,647 B1 | 5/2001 | Takahashi et al. |
| 6,233,041 B1 | 5/2001 | Shiraishi |
| 6,238,063 B1 | 5/2001 | Tanitsu et al. |
| 6,252,647 B1 | 6/2001 | Shiraishi |
| 6,252,712 B1 | 6/2001 | Fürter et al. |
| 6,259,512 B1 | 7/2001 | Mizouchi |
| 6,304,317 B1 | 10/2001 | Taniguchi et al. |
| 6,333,776 B1 | 12/2001 | Taniguchi |
| 6,341,007 B1 | 1/2002 | Nishi et al. |
| 6,361,909 B1 | 3/2002 | Gau et al. |
| 6,366,404 B1 | 4/2002 | Hiraiwa et al. |
| 6,373,614 B1 | 4/2002 | Miller |
| 6,392,800 B2 | 5/2002 | Schuster |
| 6,400,441 B1 | 6/2002 | Nishi et al. |
| 6,404,482 B1 | 6/2002 | Shiraishi |
| 6,406,148 B1 | 6/2002 | Marshall et al. |
| 6,452,662 B2 | 9/2002 | Mulkens et al. |
| 6,466,303 B1 | 10/2002 | Omura et al. |
| 6,483,573 B1 | 11/2002 | Schuster |
| 6,498,869 B1 | 12/2002 | Yao |
| 6,522,483 B2 | 2/2003 | Kreuzer |
| 6,535,273 B1 | 3/2003 | Maul |
| 6,538,247 B2 | 3/2003 | Iizuka |
| 6,549,269 B1 | 4/2003 | Nishi et al. |
| 6,577,379 B1 | 6/2003 | Boettiger et al. |
| 6,583,931 B2 | 6/2003 | Hiraiwa et al. |
| 6,590,634 B1 | 7/2003 | Nishi et al. |
| 6,597,430 B1 | 7/2003 | Nishi et al. |
| 6,636,295 B2 | 10/2003 | Shiozawa |
| 6,646,690 B1 | 11/2003 | Takezawa |
| 6,661,499 B2 | 12/2003 | Omura et al. |
| 6,665,119 B1 | 12/2003 | Kurtz et al. |
| 6,674,514 B2 | 1/2004 | Shinoda |
| 6,680,798 B2 | 1/2004 | Kreuzer |
| 6,698,891 B2 | 3/2004 | Kato |
| 6,710,855 B2 | 3/2004 | Shiraishi |
| 6,762,824 B2 | 7/2004 | Mori |
| 6,769,273 B1 | 8/2004 | Nakagawa et al. |
| 6,771,350 B2 | 8/2004 | Nishinaga |
| 6,774,984 B2 | 8/2004 | Gerhard |
| 6,836,365 B2 | 12/2004 | Goto |
| 6,836,380 B2 | 12/2004 | Kreuzer |
| 6,842,223 B2 | 1/2005 | Tyminski |
| 6,844,982 B2 | 1/2005 | Omura |
| 6,856,379 B2 | 2/2005 | Schuster |
| 6,870,668 B2 | 3/2005 | Ozawa |
| 6,876,437 B2 | 4/2005 | Kawahara |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,913,373 B2 | 7/2005 | Tanaka et al. |
| 6,934,009 B2 | 8/2005 | Terashi |
| 6,958,806 B2 | 10/2005 | Mulder et al. |
| 6,965,484 B2 | 11/2005 | Shaver |
| 6,970,233 B2 | 11/2005 | Blatchford |
| 6,977,718 B1 | 12/2005 | LaFontaine |
| 6,999,157 B2 | 2/2006 | Kohno |
| 7,009,686 B2 | 3/2006 | Kawashima et al. |
| 7,031,077 B2 | 4/2006 | Kreuzer |
| 7,038,763 B2 | 5/2006 | Mulder et al. |
| 7,061,583 B2 | 6/2006 | Mulkens et al. |
| 7,095,546 B2 | 8/2006 | Mala et al. |
| 7,098,992 B2 | 8/2006 | Ohtsuki et al. |
| 7,130,025 B2 | 10/2006 | Tsuji |
| 7,145,720 B2 | 12/2006 | Krahmer et al. |
| 7,217,503 B2 | 5/2007 | Saitoh et al. |
| 7,239,446 B2 | 7/2007 | Kreuzer |
| 7,245,353 B2 | 7/2007 | Mulkens et al. |

(56) References Cited

U.S. PATENT DOCUMENTS

| | | |
|---|---|---|
| 7,245,355 B2 | 7/2007 | Mulkens et al. |
| 7,295,286 B2 | 11/2007 | Matsuura |
| 7,345,740 B2 | 3/2008 | Wagner et al. |
| 7,408,616 B2 | 8/2008 | Gruner et al. |
| 7,433,046 B2 | 10/2008 | Everett et al. |
| 7,446,858 B2 | 11/2008 | Kudo et al. |
| 7,508,493 B2 | 3/2009 | Takeuchi et al. |
| 7,847,921 B2 | 12/2010 | Gruner et al. |
| 2001/0012154 A1 | 8/2001 | Schuster |
| 2001/0019404 A1 | 9/2001 | Schuster et al. |
| 2001/0035942 A1 | 11/2001 | Hara et al. |
| 2001/0046038 A1 | 11/2001 | Mulkens et al. |
| 2001/0052968 A1 | 12/2001 | Shiozawa |
| 2002/0001134 A1 | 1/2002 | Shinoda |
| 2002/0008863 A1 | 1/2002 | Taniguchi et al. |
| 2002/0024008 A1 | 2/2002 | Iizuka |
| 2002/0027719 A1 | 3/2002 | Kreuzer |
| 2002/0080338 A1 | 6/2002 | Taniguchi |
| 2002/0085176 A1 | 7/2002 | Hiraiwa et al. |
| 2002/0085276 A1 | 7/2002 | Tanitsu et al. |
| 2002/0101572 A1 | 8/2002 | Shiraishi |
| 2002/0126380 A1 | 9/2002 | Schuster |
| 2002/0152452 A1 | 10/2002 | Socha |
| 2002/0167653 A1 | 11/2002 | Mulkens et al. |
| 2002/0176166 A1 | 11/2002 | Schuster |
| 2002/0177048 A1 | 11/2002 | Saitoh et al. |
| 2002/0177054 A1 | 11/2002 | Saitoh et al. |
| 2002/0186462 A1 | 12/2002 | Gerhard |
| 2002/0191288 A1 | 12/2002 | Gruner et al. |
| 2002/0196416 A1 | 12/2002 | Shiraishi |
| 2003/0007158 A1 | 1/2003 | Hill |
| 2003/0011756 A1 | 1/2003 | Omura et al. |
| 2003/0025890 A1 | 2/2003 | Nishinaga |
| 2003/0038225 A1 | 2/2003 | Mulder et al. |
| 2003/0038931 A1 | 2/2003 | Toyoda et al. |
| 2003/0043356 A1 | 3/2003 | Shiraishi |
| 2003/0053036 A1 | 3/2003 | Fujishima et al. |
| 2003/0086071 A1 | 5/2003 | McGuire, Jr. |
| 2003/0098959 A1 | 5/2003 | Hagiwara et al. |
| 2003/0103196 A1 | 6/2003 | Hirukawa |
| 2003/0128349 A1 | 7/2003 | Unno |
| 2003/0133099 A1 | 7/2003 | Shiode |
| 2003/0160949 A1 | 8/2003 | Komatsuda et al. |
| 2003/0174400 A1 | 9/2003 | Patel et al. |
| 2003/0206289 A1 | 11/2003 | Matsuyama |
| 2003/0214571 A1 | 11/2003 | Ishikawa et al. |
| 2003/0227607 A1 | 12/2003 | Kato et al. |
| 2004/0004771 A1 | 1/2004 | Omura |
| 2004/0012764 A1 | 1/2004 | Mulder et al. |
| 2004/0053148 A1 | 3/2004 | Morohoshi |
| 2004/0057034 A1 | 3/2004 | Zinn et al. |
| 2004/0057036 A1 | 3/2004 | Kawashima et al. |
| 2004/0100629 A1 | 5/2004 | Stokowski et al. |
| 2004/0104654 A1 | 6/2004 | Lee et al. |
| 2004/0119954 A1 | 6/2004 | Kawashima et al. |
| 2004/0120044 A1 | 6/2004 | Kreuzer |
| 2004/0150806 A1 | 8/2004 | Brunotte et al. |
| 2004/0160582 A1 | 8/2004 | Lof et al. |
| 2004/0169924 A1 | 9/2004 | Flagello et al. |
| 2004/0174512 A1 | 9/2004 | Toyoda et al. |
| 2004/0180278 A1 | 9/2004 | Sato et al. |
| 2004/0184019 A1 | 9/2004 | Totzeck et al. |
| 2004/0207386 A1 | 10/2004 | Durr |
| 2004/0227923 A1 | 11/2004 | Flagello et al. |
| 2004/0240073 A1 | 12/2004 | Gerhard |
| 2005/0024612 A1 | 2/2005 | Hirukawa et al. |
| 2005/0041232 A1 | 2/2005 | Yamada et al. |
| 2005/0094268 A1 | 5/2005 | Fiolka et al. |
| 2005/0095749 A1 | 5/2005 | Krellmann et al. |
| 2005/0128458 A1 | 6/2005 | Blatchford |
| 2005/0134825 A1 | 6/2005 | Schuster |
| 2005/0146704 A1 | 7/2005 | Gruner et al. |
| 2005/0168790 A1 | 8/2005 | Latypov et al. |
| 2005/0237509 A1 | 10/2005 | Blatchford |
| 2005/0237527 A1 | 10/2005 | Mori |
| 2005/0264885 A1 | 12/2005 | Albert |
| 2005/0270608 A1 | 12/2005 | Shiozawa et al. |
| 2006/0012769 A1 | 1/2006 | Suzuki |
| 2006/0050261 A1 | 3/2006 | Brotsack |
| 2006/0055834 A1 | 3/2006 | Tanitsu et al. |
| 2006/0055909 A1 | 3/2006 | Fiolka et al. |
| 2006/0072095 A1 | 4/2006 | Kudo et al. |
| 2006/0077370 A1 | 4/2006 | Mulkens et al. |
| 2006/0092398 A1 | 5/2006 | McCarthy |
| 2006/0132748 A1 | 6/2006 | Fukuhara |
| 2006/0139611 A1 | 6/2006 | Wagner et al. |
| 2006/0146384 A1 | 7/2006 | Schultz et al. |
| 2006/0158624 A1 | 7/2006 | Toyoda |
| 2006/0164711 A1 | 7/2006 | Govil et al. |
| 2006/0170901 A1 | 8/2006 | Tanitsu et al. |
| 2006/0171138 A1 | 8/2006 | Muramatsu et al. |
| 2006/0203214 A1 | 9/2006 | Shiraishi |
| 2006/0203341 A1 | 9/2006 | Schuster |
| 2006/0232841 A1 | 10/2006 | Toishi et al. |
| 2006/0291057 A1 | 12/2006 | Fiolka et al. |
| 2007/0008511 A1 | 1/2007 | Deboeij et al. |
| 2007/0019179 A1 | 1/2007 | Fiolka et al. |
| 2007/0058151 A1 | 3/2007 | Eurlings et al. |
| 2007/0081114 A1 | 4/2007 | Fiolka et al. |
| 2007/0146676 A1 | 6/2007 | Tanitsu et al. |
| 2007/0183017 A1 | 8/2007 | Hembd |
| 2007/0201338 A1 | 8/2007 | Yaoita et al. |
| 2007/0263199 A1 | 11/2007 | Fiolka et al. |
| 2007/0296936 A1 | 12/2007 | Kato et al. |
| 2007/0296941 A1 | 12/2007 | Omura |
| 2008/0021948 A1 | 1/2008 | Wilson et al. |
| 2008/0024747 A1 | 1/2008 | Kudo et al. |
| 2008/0030706 A1 | 2/2008 | Yamamoto |
| 2008/0030707 A1 | 2/2008 | Tanaka et al. |
| 2008/0068572 A1 | 3/2008 | Kudo et al. |
| 2008/0316459 A1 | 12/2008 | Fiolka et al. |
| 2008/0316598 A1 | 12/2008 | Fiolka et al. |
| 2009/0002675 A1 | 1/2009 | Fiolka et al. |
| 2009/0073411 A1 | 3/2009 | Tanitsu |
| 2009/0073414 A1 | 3/2009 | Tanitsu et al. |
| 2009/0073441 A1 | 3/2009 | Tanitsu et al. |
| 2009/0091730 A1 | 4/2009 | Tanaka |
| 2009/0097007 A1 | 4/2009 | Tanaka |
| 2009/0109417 A1 | 4/2009 | Tanitsu |
| 2009/0116093 A1 | 5/2009 | Tanitsu |
| 2009/0122292 A1 | 5/2009 | Shiraishi |
| 2009/0128886 A1 | 5/2009 | Hirota |
| 2009/0147233 A1 | 6/2009 | Toyoda |
| 2009/0147234 A1 | 6/2009 | Toyoda |
| 2009/0147235 A1 | 6/2009 | Toyoda |
| 2009/0185154 A1 | 7/2009 | Tanitsu |
| 2009/0185156 A1 | 7/2009 | Kudo et al. |
| 2009/0284729 A1 | 11/2009 | Shiraishi |
| 2009/0316132 A1 | 12/2009 | Tanitsu et al. |
| 2009/0323041 A1 | 12/2009 | Toyoda |
| 2010/0141921 A1 | 6/2010 | Omura |
| 2010/0141926 A1 | 6/2010 | Omura |
| 2010/0142051 A1 | 6/2010 | Omura |
| 2011/0037962 A1 | 2/2011 | Tanitsu |
| 2011/0069296 A1 | 3/2011 | Gruner et al. |
| 2011/0205519 A1 | 8/2011 | Kanayamaya et al. |
| 2011/0273692 A1 | 11/2011 | Toyoda |
| 2011/0273693 A1 | 11/2011 | Toyoda |
| 2011/0273697 A1 | 11/2011 | Tanitsu et al. |
| 2011/0273698 A1 | 11/2011 | Toyoda |
| 2011/0299055 A1 | 12/2011 | Toyoda |

FOREIGN PATENT DOCUMENTS

| | | |
|---|---|---|
| CN | 1573571 A | 2/2005 |
| DE | 206 607 | 2/1984 |
| DE | 221 563 A1 | 4/1985 |
| DE | 224 448 A1 | 7/1985 |
| DE | 242 880 A1 | 2/1987 |
| DE | 100 29 938 A1 | 7/2001 |
| DE | 101 23 725 A1 | 11/2002 |
| DE | 102 06 061 A1 | 9/2003 |
| DE | 103 43 333 A1 | 4/2005 |
| DE | 10 2006 015213 A1 | 10/2007 |

(56) References Cited

FOREIGN PATENT DOCUMENTS

| | | |
|---|---|---|
| EP | 0 023 231 A1 | 2/1981 |
| EP | 0 208 552 A2 | 1/1987 |
| EP | 0 230 931 A2 | 8/1987 |
| EP | 0 564 264 A1 | 10/1993 |
| EP | 0 656 555 A1 | 6/1995 |
| EP | 0 764 858 | 8/1996 |
| EP | 0 744 664 A2 | 11/1996 |
| EP | 0 779 530 A1 | 6/1997 |
| EP | 0 937 999 A1 | 8/1999 |
| EP | 1 014 196 A2 | 6/2000 |
| EP | 1 071 292 A2 | 1/2001 |
| EP | 1069600 A1 | 1/2001 |
| EP | 1 139 521 A1 | 10/2001 |
| EP | 1 211 561 A2 | 6/2002 |
| EP | 1 260 849 A1 | 11/2002 |
| EP | 1 280 007 A2 | 1/2003 |
| EP | 1 489 462 A2 | 12/2004 |
| EP | 1 577 709 A2 | 9/2005 |
| EP | 1 662 553 A1 | 5/2006 |
| EP | 1 674 935 A2 | 6/2006 |
| EP | 1 681 710 A1 | 7/2006 |
| EP | 1 693 885 A1 | 8/2006 |
| EP | 1 798 758 A1 | 6/2007 |
| EP | 1 840 945 A1 | 10/2007 |
| EP | 1 953 805 A1 | 8/2008 |
| FR | 2 474 708 | 7/1981 |
| GB | 856621 A | 12/1960 |
| JP | A-44-4993 | 2/1969 |
| JP | A-56-6666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A-61-091662 | 5/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-62-265722 | 11/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258550 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |
| JP | A-4-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A-4-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A-5-21314 | 1/1993 |
| JP | A-5-45886 | 2/1993 |
| JP | A-5-62877 | 3/1993 |
| JP | A-5-90128 | 4/1993 |
| JP | A-5-109601 | 4/1993 |
| JP | A-5-127086 | 5/1993 |
| JP | A-5-129184 | 5/1993 |
| JP | A-5-134230 | 5/1993 |
| JP | A-5-160002 | 6/1993 |
| JP | A-5-175098 | 7/1993 |
| JP | A-5-199680 | 8/1993 |
| JP | A-5-217837 | 8/1993 |

(56) References Cited

FOREIGN PATENT DOCUMENTS

| | | |
|---|---|---|
| JP | A-5-217840 | 8/1993 |
| JP | A-5-226225 | 9/1993 |
| JP | A-5-241324 | 9/1993 |
| JP | A-5-243364 | 9/1993 |
| JP | A-5-259069 | 10/1993 |
| JP | A-5-283317 | 10/1993 |
| JP | A-5-304072 | 11/1993 |
| JP | A-5-319774 | 12/1993 |
| JP | A-5-323583 | 12/1993 |
| JP | A 5-326370 | 12/1993 |
| JP | A-6-29204 | 2/1994 |
| JP | A-6-42918 | 2/1994 |
| JP | A-6-53120 | 2/1994 |
| JP | A-6-97269 | 4/1994 |
| JP | A-6-104167 | 4/1994 |
| JP | A-6-118623 | 4/1994 |
| JP | A-6-120110 | 4/1994 |
| JP | B2-6-29102 | 4/1994 |
| JP | A-6-36054 | 5/1994 |
| JP | A-6-124126 | 5/1994 |
| JP | A-6-124872 | 5/1994 |
| JP | A-6-124873 | 5/1994 |
| JP | A-6-140306 | 5/1994 |
| JP | A-6-148399 | 5/1994 |
| JP | A-6-163350 | 6/1994 |
| JP | A-6-168866 | 6/1994 |
| JP | A-6-177007 | 6/1994 |
| JP | A-6-181157 | 6/1994 |
| JP | H06-177006 A | 6/1994 |
| JP | A-6-186025 | 7/1994 |
| JP | A-6-188169 | 7/1994 |
| JP | A-6-196388 | 7/1994 |
| JP | A-6-204113 | 7/1994 |
| JP | A-6-204121 | 7/1994 |
| JP | A-6-229741 | 8/1994 |
| JP | A-6-241720 | 9/1994 |
| JP | A-6-244082 | 9/1994 |
| JP | A-6-267825 | 9/1994 |
| JP | A-06-281869 | 10/1994 |
| JP | A-6-283403 | 10/1994 |
| JP | A-06-291023 | 10/1994 |
| JP | A-6-310399 | 11/1994 |
| JP | A-6-325894 | 11/1994 |
| JP | A-6-326174 | 11/1994 |
| JP | A-6-349701 | 12/1994 |
| JP | A-7-57992 | 3/1995 |
| JP | A-7-57993 | 3/1995 |
| JP | A-7-69621 | 3/1995 |
| JP | A-7-92424 | 4/1995 |
| JP | A-7-122469 | 5/1995 |
| JP | A-7-132262 | 5/1995 |
| JP | A-7-134955 | 5/1995 |
| JP | A-7-135158 | 5/1995 |
| JP | A-7-135165 | 5/1995 |
| JP | A-7-147223 | 6/1995 |
| JP | A-7-161622 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A-7-183201 | 7/1995 |
| JP | A-7-183214 | 7/1995 |
| JP | A-7-190741 | 7/1995 |
| JP | H07-176476 A | 7/1995 |
| JP | A-7-201723 | 8/1995 |
| JP | A-7-220989 | 8/1995 |
| JP | A-7-220990 | 8/1995 |
| JP | A-7-220995 | 8/1995 |
| JP | A-7-221010 | 8/1995 |
| JP | A-7-230945 | 8/1995 |
| JP | A-7-239212 | 9/1995 |
| JP | A-7-243814 | 9/1995 |
| JP | A-7-245258 | 9/1995 |
| JP | A-7-263315 | 10/1995 |
| JP | A-7-283119 | 10/1995 |
| JP | A-7-297272 | 11/1995 |
| JP | A-7-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | A-8-288213 | 11/1996 |
| JP | A-8-297699 | 11/1996 |
| JP | A-8-316125 | 11/1996 |
| JP | A-8-316133 | 11/1996 |
| JP | A-8-330224 | 12/1996 |
| JP | A-8-334695 | 12/1996 |
| JP | A-8-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-09-160219 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-9-184918 | 7/1997 |
| JP | A-9-186082 | 7/1997 |
| JP | A-9-190969 | 7/1997 |
| JP | A-9-213129 | 8/1997 |
| JP | A 9-219358 | 8/1997 |
| JP | A-9-219358 | 8/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-251208 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-503300 | 3/1998 |
| JP | A-10-92735 | 4/1998 |
| JP | A-10-97969 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |

(56) References Cited

FOREIGN PATENT DOCUMENTS

| | | |
|---|---|---|
| JP | A-H10-134028 | 5/1998 |
| JP | A-10-163099 | 6/1998 |
| JP | A-10-163302 | 6/1998 |
| JP | A-10-169249 | 6/1998 |
| JP | A-10-189427 | 7/1998 |
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | A-10-294268 | 11/1998 |
| JP | A-10-303114 | 11/1998 |
| JP | A-10-340846 | 12/1998 |
| JP | A-11-3849 | 1/1999 |
| JP | A-11-3856 | 1/1999 |
| JP | A-11-8194 | 1/1999 |
| JP | A-11-14876 | 1/1999 |
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-204432 | 7/1999 |
| JP | A-11-218466 | 8/1999 |
| JP | A-11-219882 | 8/1999 |
| JP | A-11-233434 | 8/1999 |
| JP | A-11-238680 | 8/1999 |
| JP | A-11-239758 | 9/1999 |
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |
| JP | A-11-312631 | 11/1999 |
| JP | A-11-354624 | 12/1999 |
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-58441 | 2/2000 |
| JP | A-2000-81320 | 3/2000 |
| JP | A-2000-92815 | 3/2000 |
| JP | A-2000-97616 | 4/2000 |
| JP | A-2000-106340 | 4/2000 |
| JP | A-2000-114157 | 4/2000 |
| JP | A-2000-121491 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-286176 | 10/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-23996 | 1/2001 |
| JP | A-2001-37201 | 2/2001 |
| JP | A-2001-44097 | 2/2001 |
| JP | A-2001-74240 | 3/2001 |
| JP | A-2001-83472 | 3/2001 |
| JP | A-2001-85307 | 3/2001 |
| JP | A-2001-97734 | 4/2001 |
| JP | A-2001-100311 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | A-2001-272764 | 10/2001 |
| JP | A-2001-274083 | 10/2001 |
| JP | A-2001-282526 | 10/2001 |
| JP | A-2001-284228 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | B2-3246615 | 1/2002 |
| JP | A-2002-43213 | 2/2002 |
| JP | A-2002-57097 | 2/2002 |
| JP | 2002-075859 A | 3/2002 |
| JP | A-2002-66428 | 3/2002 |
| JP | A-2002-71513 | 3/2002 |
| JP | A-2002-75816 | 3/2002 |
| JP | A-2002-075816 | 3/2002 |
| JP | A-2002-075835 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | A-2002-162655 | 6/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |

(56) References Cited

FOREIGN PATENT DOCUMENTS

| | | |
|---|---|---|
| JP | A-2002-305140 | 10/2002 |
| JP | A-2002-323658 | 11/2002 |
| JP | A-2002-324743 | 11/2002 |
| JP | A-2002-329651 | 11/2002 |
| JP | A-2002-334836 | 11/2002 |
| JP | 2002-359176 A | 12/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |
| JP | A-2002-367523 | 12/2002 |
| JP | A-2002-367886 | 12/2002 |
| JP | A-2002-373849 | 12/2002 |
| JP | A-2003-15040 | 1/2003 |
| JP | A-2003-015314 | 1/2003 |
| JP | A-2003-17003 | 1/2003 |
| JP | A-2003-17404 | 1/2003 |
| JP | A-2003-28673 | 1/2003 |
| JP | A-2003-35822 | 2/2003 |
| JP | A-2003-43223 | 2/2003 |
| JP | A-2003-45219 | 2/2003 |
| JP | A-2003-45712 | 2/2003 |
| JP | A-2003-59799 | 2/2003 |
| JP | A-2003-59803 | 2/2003 |
| JP | A-2003-059821 | 2/2003 |
| JP | A-2003-59821 | 2/2003 |
| JP | A-2003-59826 | 2/2003 |
| JP | 2003-068607 A | 3/2003 |
| JP | A-2003-68600 | 3/2003 |
| JP | A-2003-068604 | 3/2003 |
| JP | A-2003-75703 | 3/2003 |
| JP | A-2003-81654 | 3/2003 |
| JP | A-2003-84445 | 3/2003 |
| JP | A-2003-90978 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A2003-173957 | 6/2003 |
| JP | A-2003-188087 | 7/2003 |
| JP | A-2003-224961 | 8/2003 |
| JP | A-2003-229347 | 8/2003 |
| JP | A-2003-233001 | 8/2003 |
| JP | A-2003-234285 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |
| JP | A-2003-273338 | 9/2003 |
| JP | A-2003-282423 | 10/2003 |
| JP | A-2003-297727 | 10/2003 |
| JP | A-2003-532281 | 10/2003 |
| JP | A-2003-532282 | 10/2003 |
| JP | A-2003-311923 | 11/2003 |
| JP | A-2004-7417 | 1/2004 |
| JP | A-2004-14642 | 1/2004 |
| JP | A-2004-14876 | 1/2004 |
| JP | A-2004-15187 | 1/2004 |
| JP | A-2004-22708 | 1/2004 |
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-051717 | 2/2004 |
| JP | A-2004-63847 | 2/2004 |
| JP | A-2004-71851 | 3/2004 |
| JP | A-2004-078136 | 3/2004 |
| JP | A-2004-85612 | 3/2004 |
| JP | A-2004-87987 | 3/2004 |
| JP | A-2004-95653 | 3/2004 |
| JP | U-3102327 | 3/2004 |
| JP | A-2004-98012 | 4/2004 |
| JP | A-2004-101362 | 4/2004 |
| JP | A-2004-103674 | 4/2004 |
| JP | A-2004-104654 | 4/2004 |
| JP | A-2004-111569 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-207696 | 7/2004 |
| JP | A-2004-207711 | 7/2004 |
| JP | A-2004-260115 | 7/2004 |
| JP | A-2004-520618 | 7/2004 |
| JP | A-2004-221253 | 8/2004 |
| JP | A-2004-224421 | 8/2004 |
| JP | A-2004-228497 | 8/2004 |
| JP | A-2004-241666 | 8/2004 |
| JP | A-2004-247527 | 9/2004 |
| JP | A-2004-258670 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004-304135 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | A-2004-342987 | 12/2004 |
| JP | A-2004-349645 | 12/2004 |
| JP | A-2004-356410 | 12/2004 |
| JP | A-2005-5295 | 1/2005 |
| JP | A-2005-5395 | 1/2005 |
| JP | A-2005-005521 | 1/2005 |
| JP | A-2005-5521 | 1/2005 |
| JP | A-2005-11990 | 1/2005 |
| JP | A-2005-012190 | 1/2005 |
| JP | A-2005-12228 | 1/2005 |
| JP | A-2005-19628 | 1/2005 |
| JP | A-2005-19864 | 1/2005 |
| JP | A-2005-26634 | 1/2005 |
| JP | A-2005-51147 | 2/2005 |
| JP | A-2005-55811 | 3/2005 |
| JP | A-2005-64210 | 3/2005 |
| JP | A-2005-64391 | 3/2005 |

(56) References Cited

FOREIGN PATENT DOCUMENTS

| | | |
|---|---|---|
| JP | A-2005-79222 | 3/2005 |
| JP | A-2005-79584 | 3/2005 |
| JP | A-2005-79587 | 3/2005 |
| JP | A-2005-86148 | 3/2005 |
| JP | A-2005-91023 | 4/2005 |
| JP | A-2005-93324 | 4/2005 |
| JP | A-2005-093522 | 4/2005 |
| JP | A-2005-93948 | 4/2005 |
| JP | A-2005-97057 | 4/2005 |
| JP | A-2005-108925 | 4/2005 |
| JP | A-2005-108934 | 4/2005 |
| JP | A-2005-114882 | 4/2005 |
| JP | A-2005-116570 | 4/2005 |
| JP | A-2005-116571 | 4/2005 |
| JP | A-2005-116831 | 4/2005 |
| JP | A-2005-123586 | 5/2005 |
| JP | A-2005-127460 | 5/2005 |
| JP | A-2005-136404 | 5/2005 |
| JP | 2005/050718 | 6/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-167254 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |
| JP | A-2005-209705 | 8/2005 |
| JP | A-2005-209706 | 8/2005 |
| JP | A-2005-524112 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-302826 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A-2006-1821 | 1/2006 |
| JP | A-2006-5197 | 1/2006 |
| JP | A-2006-17895 | 1/2006 |
| JP | A-2006-19702 | 1/2006 |
| JP | A-2006-019702 | 1/2006 |
| JP | A-2006-24706 | 1/2006 |
| JP | A-2006-24819 | 1/2006 |
| JP | A-2006-32750 | 2/2006 |
| JP | A-2006-41302 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-100363 | 4/2006 |
| JP | A-2006-100686 | 4/2006 |
| JP | A-2006-113437 | 4/2006 |
| JP | A-2006-513442 | 4/2006 |
| JP | A-2006-120985 | 5/2006 |
| JP | A-2006-128192 | 5/2006 |
| JP | A-2006-135165 | 5/2006 |
| JP | A-2006-140366 | 6/2006 |
| JP | A-2006-170811 | 6/2006 |
| JP | A-2006-170899 | 6/2006 |
| JP | A-2006-177865 | 7/2006 |
| JP | A-2006-184414 | 7/2006 |
| JP | A-2006-194665 | 7/2006 |
| JP | A-2006-250587 | 9/2006 |
| JP | A-2006-253572 | 9/2006 |
| JP | A-2006-269762 | 10/2006 |
| JP | A-2006-278820 | 10/2006 |
| JP | A-2006-289684 | 10/2006 |
| JP | A-2006-524349 | 10/2006 |
| JP | A-2006-332355 | 12/2006 |
| JP | A-2006-349946 | 12/2006 |
| JP | A-2006-351586 | 12/2006 |
| JP | A-2007-5830 | 1/2007 |
| JP | A-2007-43980 | 2/2007 |
| JP | A-2007-48819 | 2/2007 |
| JP | A-2007-51300 | 3/2007 |
| JP | A-2007-87306 | 4/2007 |
| JP | A-2007-93546 | 4/2007 |
| JP | A-2007-103153 | 4/2007 |
| JP | A-2007-113939 | 5/2007 |
| JP | A-2007-119851 | 5/2007 |
| JP | A-2007-120333 | 5/2007 |
| JP | A-2007-120334 | 5/2007 |
| JP | A-2007-142313 | 6/2007 |
| JP | A-2007-144864 | 6/2007 |
| JP | A-2007-515768 | 6/2007 |
| JP | A-2007-170938 | 7/2007 |
| JP | A-2007-187649 | 7/2007 |
| JP | A-2007-207821 | 8/2007 |
| JP | A-2007-227637 | 9/2007 |
| JP | A-2007-235041 | 9/2007 |
| JP | A-2007-274881 | 10/2007 |
| JP | A-2007-280623 | 10/2007 |
| JP | A-2007-295702 | 11/2007 |
| JP | A-2008-3740 | 1/2008 |
| JP | A-2008-58580 | 3/2008 |
| JP | A-2008-64924 | 3/2008 |
| JP | A-2008-103737 | 5/2008 |
| JP | A-2008-180492 | 8/2008 |
| JP | A-2009-17540 | 1/2009 |
| JP | A-2009-60339 | 3/2009 |
| JP | A-2010-514716 | 5/2010 |
| JP | A-2010-226117 | 10/2010 |
| JP | A-2011-233911 | 11/2011 |
| JP | B2-4976015 | 7/2012 |
| JP | B2-4976094 | 7/2012 |
| KR | 1995-0009365 A | 4/1995 |
| KR | 10-0474578 B1 | 1/1997 |
| KR | 10-2011-0036050 | 4/1997 |
| KR | A-10-1997-0016641 | 4/1997 |
| KR | 2000-0048227 | 7/2000 |
| KR | 2000-0076783 A | 12/2000 |
| KR | 2001-0051438 A | 6/2001 |
| KR | 2001-53240 A | 6/2001 |
| KR | 2002-0042462 A | 6/2002 |
| KR | 10-2003-0036105 A | 5/2003 |
| KR | 10-2006-0132598 | 12/2006 |
| KR | 10-839686 B1 | 6/2008 |
| KR | 10-0869390 B1 | 11/2008 |
| KR | 10-2010-0061551 | 6/2010 |
| KR | 10-1020378 B1 | 3/2011 |
| KR | 10-1020455 B1 | 3/2011 |
| TW | 480585 B | 3/2002 |
| TW | 516097 | 1/2003 |
| TW | 518662 | 1/2003 |
| TW | 200301848 A | 7/2003 |
| TW | 094100817 A | 8/2005 |
| WO | WO 97/11411 A1 | 3/1997 |
| WO | WO 98/15952 A1 | 4/1998 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | WO 99/49366 A1 | 9/1999 |
| WO | WO 99/49504 A1 | 9/1999 |
| WO | WO 99/50712 A1 | 10/1999 |
| WO | WO 99/66370 A1 | 12/1999 |

(56) References Cited

FOREIGN PATENT DOCUMENTS

| | | |
|---|---|---|
| WO | WO 00/02092 | 1/2000 |
| WO | WO 00/11706 A1 | 3/2000 |
| WO | WO 00/67303 A1 | 11/2000 |
| WO | WO 01/03170 A1 | 1/2001 |
| WO | WO 01/10137 A1 | 2/2001 |
| WO | WO 01/20733 A1 | 3/2001 |
| WO | WO 01/22480 A1 | 3/2001 |
| WO | WO 01/27978 A1 | 4/2001 |
| WO | WO 01/35451 A1 | 5/2001 |
| WO | WO 01/59502 A1 | 8/2001 |
| WO | WO 01/65296 A1 | 9/2001 |
| WO | WO 01/81977 A2 | 11/2001 |
| WO | WO 02/16993 A1 | 2/2002 |
| WO | WO 02/063664 A1 | 8/2002 |
| WO | WO 02/069049 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/093209 A2 | 11/2002 |
| WO | WO 02/101804 A1 | 12/2002 |
| WO | WO 03/023832 A1 | 3/2003 |
| WO | WO 03/063212 A1 | 7/2003 |
| WO | WO 03/077036 A1 | 9/2003 |
| WO | WO 03/085708 A1 | 10/2003 |
| WO | WO 2004/051717 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/071070 A2 | 8/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 A1 | 12/2004 |
| WO | WO 2004/105106 A1 | 12/2004 |
| WO | WO 2004/105107 A1 | 12/2004 |
| WO | WO 2004/107048 A2 | 12/2004 |
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006418 A1 | 1/2005 |
| WO | WO 2005/008754 A1 | 1/2005 |
| WO | WO 2005/022615 A1 | 3/2005 |
| WO | WO 2005/026843 A2 | 3/2005 |
| WO | WO 2005/027207 A1 | 3/2005 |
| WO | WO 2005/029559 A1 | 3/2005 |
| WO | WO 2005/031467 A2 | 4/2005 |
| WO | WO 2005/036619 A1 | 4/2005 |
| WO | WO 2005/036620 A1 | 4/2005 |
| WO | WO 2005/036622 A1 | 4/2005 |
| WO | WO 2005/036623 A1 | 4/2005 |
| WO | WO 2005/041276 A1 | 5/2005 |
| WO | WO 2005/041277 A1 | 5/2005 |
| WO | WO 2005/048325 A1 | 5/2005 |
| WO | WO 2005/048326 A1 | 5/2005 |
| WO | WO 2005/050718 A1 | 6/2005 |
| WO | WO 2005/057636 A1 | 6/2005 |
| WO | WO 2005/067013 A1 | 7/2005 |
| WO | WO 2005/069081 A2 | 7/2005 |
| WO | WO 2005/071671 A2 | 8/2005 |
| WO | WO 2005/071717 A1 | 8/2005 |
| WO | WO2005/076045 A1 | 8/2005 |
| WO | WO 2005/076321 A1 | 8/2005 |
| WO | WO 2005/076323 A1 | 8/2005 |
| WO | WO 2005/081291 A1 | 9/2005 |
| WO | WO 2005/081292 A1 | 9/2005 |
| WO | WO 2005/104195 A1 | 11/2005 |
| WO | WO 2006/006730 A1 | 1/2006 |
| WO | WO 2006/016551 A1 | 2/2006 |
| WO | WO 2006/019124 A1 | 2/2006 |
| WO | WO 2006/025341 A1 | 3/2006 |
| WO | WO 2006/028188 A1 | 3/2006 |
| WO | WO 2006/030727 A1 | 3/2006 |
| WO | WO 2006/030910 A1 | 3/2006 |
| WO | WO 2006-035775 A1 | 4/2006 |
| WO | WO 2006/049134 A1 | 5/2006 |
| WO | WO 2006/051909 A1 | 5/2006 |
| WO | WO 2006/064851 A1 | 6/2006 |
| WO | WO 2006/068233 A1 | 6/2006 |
| WO | WO 2006/077958 A1 | 7/2006 |
| WO | WO 2006/080285 A1 | 8/2006 |
| WO | WO 2006/085524 A1 | 8/2006 |
| WO | WO 2006/100889 A1 | 9/2006 |
| WO | WO 2006/118108 A1 | 11/2006 |
| WO | WO 2007/003563 A1 | 1/2007 |
| WO | WO 2007/018127 A1 | 2/2007 |
| WO | WO 2007/055120 A1 | 5/2007 |
| WO | WO 2007/055237 A1 | 5/2007 |
| WO | WO 2007/055373 A1 | 5/2007 |
| WO | WO 2007/066692 A1 | 6/2007 |
| WO | WO 2007/066758 A1 | 6/2007 |
| WO | WO 2007/097198 A1 | 8/2007 |
| WO | WO 2007/132862 A1 | 11/2007 |
| WO | WO 2007/141997 A1 | 12/2007 |
| WO | WO 2008/041575 A1 | 4/2008 |
| WO | WO 2008/059748 A1 | 5/2008 |
| WO | WO 2008/061681 A2 | 5/2008 |
| WO | WO 2008/065977 A1 | 6/2008 |
| WO | WO 2008/074673 A2 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/139848 A1 | 11/2008 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

May 14, 2013 Office Action issued in Japanese Patent Application No. 2011-130545 (with translation).
Apr. 23, 2013 Office Action issued in Chinese Patent Application No. 201010128876.6 (with translation).
Jul. 1, 2013 Preparatory Document (1), Patent Invalidation Action 2013HEO3937 issued in Korean Patent Application No. 10-2006-7008368 (with translation).
Jul. 1, 2013 Preparatory Document (1), Patent Invalidation Action 2013HEO3920 issued in Korean Patent Application No. 10-2007-7022489 (with translation).
Jul. 1, 2013 Preparatory Document (1), Patent Invalidation Action 2013HEO3944 issued in Korean Patent Application No. 10-2008-7019081 (with translation).
Jul. 1, 2013 Preparatory Document (1), Patent Invalidation Action 2013HEO3951 issued in Korean Patent Application No. 10-2008-7019082 (with translation).
Jul. 1, 2013 Definition of Technical Terms (with translation).
Doosan Encyclopedia, Optic axis (with translation).
Bass et al., "Handbook of Optics", McGraw-Hill, 1995.
Buhrer, "Four waveplate dual tuner for birefringent filters and multiplexers", Applied Optics vol. 26, No. 17, Sep. 1, 1987, pp. 3628-3632.
Niziev et al., "Influence of Beam Polarization on Laser Cutting Efficiency", Journal of Physics D Applied Physics 32, 1999, pp. 1455-1461.
Bagini et al., "The Simon-Mukunda polarization gadget", Eur. J. Phys. 17, 1996, pp. 279-284.
McGuire et al., "Analysis of spatial pseudodepolarizers in imaging systems", Optical Engineering, vol. 29 No. 12, 1990, pp. 1478-1484.
May 16, 2013 Office Action issued in Taiwanese Patent Application No. 098115513 (with translation).

(56) References Cited

OTHER PUBLICATIONS

Jun. 13, 2013 Search Report issued in European Patent Application No. 13 15 6325.6.
May 29, 2013 Office Action issued in European Patent Application No. 04 799 453.8.
Jun. 18, 2013 Search Report issued in European Patent Application No. 13 15 6322.3.
Jun. 21, 2013 Search Report issued in European Patent Application No. 13 15 6324.9.
May 28, 2013 Office Action issued in Japanese Patent Application No. 2011-144669 (with translation).
May 28, 2013 Office Action issued in Japanese Patent Application No. 2010-094216 (with translation).
Jul. 15, 2013 Office Action issued in Chinese Patent Application No. 200910173718.X (with translation).
Jul. 15, 2013 Notice of Allowance issued in U.S. Appl. No. 13/067,958.
Jun. 4, 2013 Office Action issued in Chinese Patent Application No. 2007101 10950.X (with translation).
Jul. 23, 2013 Office Action issued in U.S. Appl. No. 12/458,635.
Jul. 23, 2013 Office Action issued in U.S. Appl. No. 11/410,952.
Jul. 22, 2013 Notice of Allowance issued in U.S. Appl. No. 12/289,515.
Aug. 1, 2013 Office Action issued in U.S. Appl. No. 12/318,216.
Aug. 6, 2013 Office Action issued in U.S. Appl. No. 13/889,798.
Apr. 3, 2013 Office Action issued in Chinese Patent Application No. 200910173716.0 (with translation).
Apr. 18, 2013 Office Action issued in Korean Patent Application No. 10-2012-7003793 (with translation).
May 7, 2013 Office Action issued in European Patent Application No. 04 817 303.3.
Apr. 3, 2013 Office Action issued in Chinese Patent Application No. 200910173717.5 (with translation).
Apr. 13, 2010 Office Action issued in Chinese Patent Application No. 2007101109529 (with translation).
Apr. 14, 2010 Notice of Allowance issued in U.S. Appl. No. 11/644,966.
Apr. 15, 2009 Office Action issued in U.S. Appl. No. 11/902,277.
Apr. 15, 2010 Office Action issued in Japanese Patent Application No. 2007-251263 (with translation).
Apr. 15, 2010 Office Action issued in U.S. Appl. No. 10/587,254.
Apr. 15, 2011 Office Action issued in European Patent Application No. 04817303.3.
Apr. 16, 2009 Office Action issued in U.S. Appl. No. 12/155,301.
Apr. 2, 2007 European Search Report issued in European Patent Application No. 04724369.6.
Apr. 20, 2011 Office Action issued in Chinese Patent Application No. 200710110949.7 (with translation).
Apr. 21, 2010 Office Action issued in U.S. Appl. No. 12/289,518.
Apr. 22, 2008 Office Action issued in U.S. Appl. No. 11/644,966.
Apr. 22, 2010 Office Action issued in Japanese Application No. 2006-553907 (with translation).
Apr. 22, 2010 Office Action issued in U.S. Appl. No. 12/155,301.
Apr. 24, 2008 Supplemental European Search Report issued in European Patent Application No. 08002882.2.
Apr. 24, 2009 Office Action issued in Chinese Application No. 2006800006868 (with translation).
Apr. 24, 2012 Office Action issued in Japanese Patent Application No. 2009-149426 (with translation).
Apr. 25, 2007 Office Action issued in U.S. Appl. No. 11/140,103.
Apr. 25, 2011 Office Action issued in Korean Patent Application No. 10-2010-7008438 (with translation).
Apr. 25, 2011 Office Action issued in Korean Patent Application No. 10-2011-7001502 (with translation).
Apr. 26, 2011 Office Action issued in Chinese Patent Application No. 200710110950.X (with translation).
Apr. 26, 2011 Office Action issued in Chinese Patent Application No. 200710110951.4 (with translation).
Apr. 26, 2012 Office Action issued in Chinese Patent Application No. 200910126047.1 (with translation).
Apr. 28, 2010 Office Action issued in Chinese Patent Application No. 200710195642.1 (with translation).
Apr. 28, 2011 Office Action issued in Korean Patent Application No. 10-2010-7001898 (with translation).
Apr. 28, 2011 Office Action issued in Korean Patent Application No. 10-2006-7012265 (with translation).
Apr. 28, 2011 Office Action issued in Korean Patent Application No. 10-2009-7023904 (with translation).
Apr. 28, 2011 Office Action issued in Korean Patent Application No. 10-2010-7001907 (with translation).
Apr. 3, 2008 Office Action issued in Korean Patent Application No. 10-2006-7008368 (with translation).
Apr. 30, 2012 Office Action issued in Korean Patent Application No. 10-2006-7012265 (with translation).
Apr. 30, 2012 Office Action issued in Korean Patent Application No. 10-2010-7001898 (with translation).
Apr. 30, 2012 Office Action issued in Korean Patent Application No. 10-2010-7001907 (with translation).
Apr. 5, 2011 Office Action issued in Japanese Patent Application No. P2009-149426 (with translation).
Apr. 5, 2012 Notice of Allowance issued in U.S. Appl. No. 11/644,966.
Apr. 6, 2011 Office Action issued in Taiwanese Patent Application No. 093131323 (with translation).
Apr. 8, 2011 Office Action issued in Chinese Patent Application No. 200810211496.1 (with translation).
Aug. 10, 2012 Office Action issued in U.S. Appl. No. 13/137,002.
Aug. 11, 2011 Office Action in Korean Patent Application No. 10-2010-7000897 (with translation).
Aug. 11, 2011 Office Action in Korean Patent Application No. 10-2010-7000893 (with translation).
Aug. 2, 2010 Notice of Allowance issued in U.S. Appl. No. 11/644,966.
Aug. 20, 2012 Notice of Allowance issued in Taiwanese Patent Application No. 097117881 (with translation).
Aug. 20, 2012 Written Opinion against the Written Answer issued in Korean Patent Application No. 10-0869390 (with translation).
Aug. 20, 2012 Written Opinion against the Written Answer issued in Korean Patent Application No. 10-0839686 (with translation).
Aug. 20, 2012 Written Opinion against the Written Answer issued in Korean Patent Application No. 10-1020455 (with translation).
Aug. 20, 2012 Written Opinion against the Written Answer issued in Korean Patent Application No. 10-1020378 (with translation).
Aug. 21, 2009 Office Action issued in Chinese Patent Application No. 200810126659.6 (with translation).
Aug. 23, 2010 Office Action issued in Chinese Patent Application No. 200810211496.1 (with translation).
Aug. 3, 2010 Final Rejection of Japanese Patent Application No. 2005-515570 (with translation).
Aug. 3, 2010 Final Rejection of Japanese Patent Application No. 2006-262580 (with translation).
Aug. 3, 2010 Notice of Allowance issued in Japanese Patent Application No. 2006-553907.
Aug. 3, 2010 Office Action issued in Japanese Application No. 2006-262589 (with translation).
Aug. 3, 2012 Office Action issued in U.S. Appl. No. 13/137,342.
Aug. 31, 2011 Office Action issued in U.S. Appl. No. 12/093,303.
Aug. 4, 2011 Office Action in Taiwanese Patent Application No. 093131767 (with translation).
Aug. 5, 2009 Office Action issued in Japanese Patent Application No. 2004-570728 (with translation).
Aug. 6, 2012 Office Action issued in U.S. Appl. No. 13/137,004.
Aug. 7, 2009 Office Action issued in Chinese Patent Application No. 2007101956440 (with translation).
Aug. 7, 2012 Office Action issued in U.S. Appl. No. 13/137,003.
Brunner, et al. "High NA Lithographic Imagery at Brewster's Angle" SPIE (U.S.A.), vol. 4691, pp. 1-24, 2002.
Carl Zeiss SMT GmbH—Microsoft Internet Explorer, "Semiconductor Technologies", http://www.zeiss.com.
Dec. 1, 2009 Office Action issued in U.S. Appl. No. 11/902,277.
Dec. 12, 2011 Office Action issued in European Patent Application No. 10 174 843.2.

(56) References Cited

OTHER PUBLICATIONS

Dec. 12, 2012 Notice of Allowance issued in U.S. Appl. No. 12/289,515.
Dec. 14, 2010 Office Action issued in Chinese Patent Application No. 200380104450.5 (with translation).
Dec. 14, 2011 Office Action issued in U.S. Appl. No. 11/902,277.
Dec. 15, 2011 Office Action issued in U.S. Appl. No. 12/382,277.
Dec. 16, 2011 Office Action issued in U.S. Appl. No. 13/067,958.
Dec. 18, 2009 Office Action issued in Chinese Patent Application No. 2007101956421 (with translation).
Dec. 18, 2009 Office Action issued in Chinese Patent Application No. 2007101956417 (with translation).
Dec. 18, 2009 Office Action issued in Chinese Patent Application No. 2007101956440 (with translation).
Dec. 18, 2012 Office Action issued in Japanese Patent Application No. 2009-149426 (with translation).
Dec. 26, 2012 Office Action issued in Taiwanese Patent Application No. 097151805 (with translation).
Dec. 26, 2012 Office Action issued in Taiwanese Patent Application No. 097151814 (with translation).
Dec. 27, 2012 Office Action issued in Taiwanese Patent Application No. 095100035 (with translation).
Dec. 27, 2012 Office Action issued in Taiwanese Patent Application No. 097151801 (with translation).
Dec. 3, 2004 Office Action issued in Taiwanese Patent Application No. 092133642 (with translation).
Dec. 3, 2010 Office Action issued in Korean Patent Application No. 10-2008-7029536 (with translation).
Dec. 4, 2007 Office Action issued in U.S. Appl. No. 11/246,642.
Dec. 4, 2009 Office Action issued in Chinese Patent Application No. 2007101109529 (with translation).
Dec. 5, 2012 Office Action issued in Taiwanese Patent Application No. 096138500 (with translation).
Dec. 7, 2010 Search Report issued in European Patent Application No. 10012876.8.
Feb. 1, 2011 Notice of Reasons for Rejection issued in Japanese Application No. P2006-262588 (with translation).
Feb. 1, 2011 Notice of Reasons for Rejection issued in Japanese Application No. P2006-262590 (with translation).
Feb. 1, 2011 Notice of Reasons for Rejection issued in Japanese Application No. P2005-517637 (with translation).
Feb. 1, 2011 Office Action issued in Chinese Patent Application No. 200810126659.6 (with translation).
Feb. 10, 2012 Office Action issued in European Patent Application No. 10 012 876.8.
Feb. 13, 2012 Office Action issued in Taiwanese Patent Application No. 094100817 (with translation).
Feb. 14, 2008 Office Action issued in U.S. Appl. No. 11/140,103.
Feb. 14, 2012 Office Action issued in Japanese Patent Application No. 2010-003941 (with translation).
Feb. 14, 2012 Office Action issued in Japanese Patent Application No. 2010-003938 (with translation).
Feb. 15, 2011 Office Action issued in European Patent Application No. 05703646.9.
Feb. 15, 2011 Office Action issued in U.S. Appl. No. 11/902,277.
Feb. 2, 2007 Office Action issued in Korean Patent Application No. 10-2006-7008368 (with translation).
Feb. 20, 2007 Office Action issued in U.S. Appl. No. 11/246,642.
Feb. 20, 2009 Office Action issued in Japanese Patent Application No. 2005-505207 (with translation).
Feb. 22, 2012 Office Action issued in Chinese Patent Application No. 200910173715.6 (with translation).
Feb. 23, 2009 Office Action issued in European Patent Application No. 08002882.2.
Feb. 23, 2010 Office Action issued in Japanese Patent Application No. P2006-262589 (with translation).
Feb. 23, 2010 Office Action issued in Japanese Patent Application No. P2005-515570 (with translation).
Feb. 24, 2011 Office Action issued in Chinese Patent Application No. 200910173717.5 (with translation).
Feb. 24, 2011 Office Action issued in Chinese Patent Application No. 201010128876.6 (with translation).
Feb. 25, 2010 Extended Search Report issued in European Application No. 06822564.8.
Feb. 25, 2013 Office Action issued in U.S. Appl. No. 12/382,277.
Feb. 26, 2009 Office Action issued in U.S. Appl. No. 11/319,057.
Feb. 26, 2009 Office Action issued in U.S. Appl. No. 11/347,421.
Feb. 28, 2011 Office Action issued in Korean Patent Application No. 10-2010-7008441 (with translation).
Feb. 28, 2011 Patent Register of Korean Patent Application No. 1020455.
Feb. 28, 2011 Patent Register of Korean Patent Application No. 10-1020378.
Feb. 6, 1996 Office Action issued in Taiwanese Patent Application No. 093109836 (with translation).
Feb. 6, 2013 Written Opinion issued in Korean Patent Application No. 10-2006-7008368 (with translation).
Feb. 6, 2013 Written Opinion issued in Korean Patent Application No. 10-2007-7022489 (with translation).
Feb. 6, 2013 Written Opinion issued in Korean Patent Application No. 10-2008-7019081 (with translation).
Feb. 6, 2013 Written Opinion issued in Korean Patent Application No. 10-2008-7019082 (with translation).
Feb. 7, 2011 Patent Register of Korean Patent Application No. 869390.
Feb. 8, 2011 Notice of Allowance issued in U.S. Appl. No. 11/644,966.
Feb. 8, 2011 Office Action issued in U.S. Appl. No. 12/320,465.
Feb. 8, 2011 Third Party Submission Information Statement issued in Korean Patent Application No. 10-869390 (with translation).
Feb. 8, 2011 Third Party Submission Information Statement issued in Korean Patent Application No. 839686 (with translation).
Halliday et al., Fundamentals of Physics: Extended, With Modern Physics, 4th edition, John Wiley & Sons, Inc. Jul. 25, 1995 (with partial translation).
Himel et al., "Design and fabrication of customized illumination patterns for low k1 lithography : a diffractive approach", Proceedings of SPIE, vol. 4346, pp. 11-1 11-7.
Jan. 11, 2011 Office Action issued in U.S. Appl. No. 12/461,801.
Jan. 14, 2011 Office Action issued in U.S. Appl. No. 12/320,480.
Jan. 14, 2011 Office Action issued in U.S. Appl. No. 12/320,468.
Jan. 14, 2011 Office Action issued in U.S. Appl. No. 12/461,852.
Jan. 14, 2013 Office Action issued in Chinese Patent Application No. 201010128876.6 (with translation).
Jan. 14, 2013 Office Action issued in Chinese Patent Application No. 200910126047.1 (with translation).
Jan. 15, 2013 Notice of Allowance issued in U.S. Appl. No. 13/067,958.
Jan. 16, 2013 Office Action issued in Chinese Patent Application No. 200910173714.1 (with translation).
Jan. 18, 2008 Office Action issued in Chinese Patent Application No. 2003801044505 (with translation).
Jan. 18, 2010 Office Action issued in Korean Patent Application No. 10-2008-7019081 (with translation).
Jan. 18, 2010 Office Action issued in Korean Patent Application No. 10-2008-7019082 (with translation).
Jan. 18, 2012 Office Action issued in European Patent Application No. 10 174 843.2.
Jan. 18, 2013 Office Action issued in Chinese Patent Application No. 200810211496.1 (with translation).
Jan. 19, 2012 Office Action issued in U.S. Appl. No. 12/458,635.
Jan. 2, 2013 Office Action issued in Korean Patent Application No. 10-2007-7005320 (with translation).
Jan. 24, 2011 Office Action issued in Korean Patent Application No. 2009-7010158 (with translation).
Jan. 24, 2011 Office Action issued in Korean Patent Application No. 2005-7018973 (with translation).
Jan. 25, 2010 European Search Report for European Patent Application No. 09015058.2-1226.
Jan. 25, 2011 Office Action issued in Korean Patent Application No. 2009-7010159 (with translation).
Jan. 25, 2012 Office Action issued in U.S. Appl. No. 12/801,043.

(56) References Cited

OTHER PUBLICATIONS

Jan. 26, 2011 Office Action issued in Chinese Patent Application No. 200910173715.6 (with translation).
Jan. 28, 2010 Office Action issued in Japanese Patent Application No. 2008-077129 (with translation).
Jan. 28, 2010 Office Action issued in Japanese Patent Application No. 2005-515005 (with translation).
Jan. 28, 2010 Search Report issued in European Application No. 06711853.9.
Jan. 4, 2008 Office Action issued in Korean Patent Application No. 10-2006-7008368 (with translation).
Jan. 4, 2010 Notice of Allowance issued in U.S. Appl. No. 11/644,966.
Jan. 7, 2010 Office Action issued in U.S. Appl. No. 12/289,518.
Jan. 7, 2013 Office Action issued in Chinese Patent Application No. 200910173715.6 (with translation).
Jan. 8, 2009 Office Action issued in U.S. Appl. No. 11/410,952.
Jan. 8, 2010 Office Action issued in Chinese Patent Application No. 2003801044505 (with translation).
Jan. 9, 2013 Technical Presentation Document in Invalidation Trial Against Korean Patent Application No. 10-0839686 Appeal No. 2011Dang301 (with translation).
Jan. 9, 2013 Technical Presentation Document in Invalidation Trial Against Korean Patent Application No. 10-0869390 Appeal No. 2011Dang302 (with translation).
Japanese Office Action issued in Japanese Application No. JP 2005-515570 dated Jan. 17, 2012 (with translation).
Japanese Office Action issued in Japanese Application No. JP 2006-262589 dated Jan. 17, 2012 (with translation).
Jul. 12, 2007 Office Action issued in U.S. Appl. No. 11/140,103.
Jul. 12, 2010 Office Action issued in European Patent Application No. 06 711 853.9.
1273 Jul. 12, 2010 Office Action issued in U.S. Appl. No. 12/461,801.
Jul. 13, 2006 Office Action issued in Taiwanese Patent Application No. 092133642 (with translation).
Jul. 13, 2011 Notice of Allowance issued in U.S. Appl. No. 11/410,952.
Jul. 14, 2008 Notice of Allowance issued in U.S. Appl. No. 11/246,642.
Jul. 17, 2012 Office Action issued in U.S. Appl. No. 11/902,277.
Jul. 17, 2012 Office Action issued in U.S. Appl. No. 12/382,277.
Jul. 20, 2010 Notice of Allowance issued in U.S. Appl. No. 12/289,515.
Jul. 20, 2010 Office Action issued in Korean Patent Application No. 10-2010-7008438 (with translation).
Jul. 20, 2010 Office Action issued in Korean Patent Application No. 10-2010-7008441 (with translation).
Jul. 20, 2010 Office Action issued in Korean Patent Application No. 10-2010-7008444 (with translation).
Jul. 20, 2011 Office Action issued in Taiwanese Patent Application No. 094100817 (with English translation).
Jul. 25, 2008 Office Action issued in Chinese Patent Application No. 200710110949.7 (with translation).
Jul. 25, 2008 Office Action issued in Chinese Patent Application No. 2007101109482 (with translation).
Jul. 25, 2008 Office Action issued in Chinese Patent Application No. 2007101109514 (with translation).
Jul. 25, 2008 Office Action issued in Chinese Patent Application No. 200710110950X (with translation).
Jul. 26, 2011 Office Action in Korean Patent Application No. 10-2006-7018069 (with translation).
Jul. 27, 2009 Office Action issued in Taiwanese Patent Application No. 092133642 (with translation).
Jul. 3, 2008 Office Action issued in U.S. Appl. No. 11/319,057.
Jul. 30, 2012 Office Action issued in Korean Patent Application No. 10-2006-7018069 (with translation).
Jul. 5, 2011 Office Action in Chinese Patent Application No. 201010128136.2 (with translation).
Jul. 8, 2011 Office Action issued in U.S. Appl. No. 12/318,216.
Jun. 1, 2012 Office Action issued in European Patent Application No. 09 015 058.2.
Jun. 10, 2010 Office Action issued in Chinese Patent Application No. 200810211497.6 (with translation).
Jun. 10, 2011 Office Action issued in U.S. Appl. No. 12/289,515.
Jun. 11, 2012 Office Action issued in Korean Patent Application No. 10-2012-7003793 (with translation).
Jun. 12, 2008 Patent Register of Korean Patent Application No. 839686.
Jun. 13, 2008 Office Action issued in Chinese Patent Application No. 2003801044505 (with translation).
Jun. 14, 2010 Office Action issued in Japanese Patent Application No. 2010-006125 (with translation).
Jun. 14, 2011 Office Action issued in Korean Patent Application No. 2011-7006842 (with translation).
Jun. 15, 2011 Notice of Allowance issued in U.S. Appl. No. 12/289,518.
Jun. 16, 2010 Office Action issued in U.S. Appl. No. 11/410,952.
Jun. 20, 2008 Corrected Notice of Allowance issued in U.S. Appl. No. 11/140,103.
Jun. 23, 2011 Office Action issued Chinese Patent Application No. 200910173714.01 (with translation).
Jun. 25, 2008 Office Action issued in U.S. Appl. No. 11/902,277.
Jun. 25, 2009 Office Action issued in U.S. Appl. No. 11/644,966.
Jun. 25, 2010 European Search Report issued in European Patent Application No. 09167707.0.
Jun. 27, 2012 Office Action issued in Korean Patent Application No. 10-2009-7010158 (with translation).
Jun. 28, 2012 Office Action issued in Korean Patent Application No. 10-2012-7008342 (with translation).
Jun. 29, 2007 Office Action issued in Chinese Patent Application No. 2003801044505 (with translation).
Jun. 29, 2012 Office Action issued in Chinese Patent Application No. 200910173714.1 (with translation).
Jun. 4, 2012 Office Action issued in Chinese Patent Application No. 200710110950.X (with translation).
Jun. 5, 2009 Office Action issued in Chinese Patent Application No. 2007101109497 (with translation).
Jun. 5, 2009 Office Action issued in Chinese Patent Application No. 2007101109482 (with translation).
Jun. 5, 2009 Office Action issued in Chinese Patent Application No. 2007101109529 (with translation).
Jun. 5, 2009 Office Action issued in Chinese Patent Application No. 2007101109514 (with translation).
Jun. 5, 2009 Office Action issued in Chinese Patent Application No. 200710110950X (with translation).
Jun. 5, 2009 Office Action issued in Chinese Patent Application No. 2007101956421 (with translation).
Jun. 5, 2009 Office Action issued in Chinese Patent Application No. 2007101956417 (with translation).
Jun. 8, 2012 Office Action issued in Korean Patent Application No. 10-2007-7005320 (with translation).
Jun. 9, 2011 Office Action issued in U.S. Appl. No. 11/902,277.
Korean Language Dictionary, 5th Edition, Jan. 10, 2002, MinJungseorim, Seoul, Korea (with translation).
Levinson, "Principles of Lithography," Bellingham, WA: SPIE Press, 2001, pp. 205-206.
Mar. 17, 2008 Office Action issued in Taiwanese Patent Application No. 092133642 (with translation).
Mar. 21, 2008 Office Action issued in Chinese Application No. 2004800341246 (with translation).
Mar. 23, 2011 Notice of Allowance issued in U.S. Appl. No. 12/289,515.
Mar. 23, 2011 Office Action issued in Chinese Patent Application No. 200910173718.X (with translation).
Mar. 24, 2011 Office Action issued in Japanese Patent Application No. 2007-251263 (with translation).
Mar. 26, 2010 Office Action issued in related U.S. Appl. No. 11/902,277.
Mar. 27, 2009 Office Action issued in Chinese Patent Application No. 2007101956440 (with translation).
Mar. 29, 2011 Notice of Allowance issued in Japanese Patent Application No. P2005-505207 (with translation).

(56) References Cited

OTHER PUBLICATIONS

Mar. 29, 2011 Office Action issued in Japanese Patent Application No. P2007-251263 (with translation).
Mar. 30, 2012 Office Action issued in U.S. Appl. No. 12/318,216.
Mar. 31, 2009 Office Action issued in European Patent Application No. 04 799 453.8.
Mar. 31, 2011 Notice of Allowance issued in U.S. Appl. No. 11/410,952.
Mar. 6, 2012 Notice of Allowance issued in U.S. Appl. No. 12/289,515.
Mar. 6, 2012 Office Action issued in Japanese Patent Application No. 2007-544099 (with translation).
Mar. 8, 2010 Office Action issued in Japanese Patent Application No. 2005-505207 (with translation).
Mar. 8, 2011 Office Action issued in Chinese Patent Application No. 200910173716.0 (with translation).
Mar. 8, 2012 Office Action issued in Taiwanese Patent Application No. 093131767 (with translation).
Mar. 9, 2011 Third Party Submission Information Statement in Korean Patent Application No. 10-1020378 (with translation).
Mar. 9, 2011 Third Party Submission Information Statement issued in Korean Patent Application No. 1020455 (with translation).
May 11, 2011 Office Action issued in European Patent Application No. 04724369.6.
May 12, 2009 Office Action issued in European Patent Application No. 04 724 369.6.
May 14, 2008 International Preliminary Report on Patentability issued in International Application No. PCT/JP2006/321607.
May 14, 2008 Written Opinion issued in International Application No. PCT/JP2006/321607 (with English Translation).
May 17, 2007 Office Action issued in U.S. Appl. No. 11/246,642.
May 18, 2011 International Search Report issued in PCT/JP2011/053588.
May 21, 2012 Office Action issued in Chinese Patent Application No. 201010128876.6 (with translation).
May 24, 2011 Office Action issued in U.S. Appl. No. 12/382,277.
May 26, 2010 Office Action issued in European Patent Application No. 07 017 146.7.
May 3, 2011 International Search Report issued in PCT/JP2011/053595.
May 31, 2010 English Translation of Korean Office Action issued in Korean Patent Application No. 10-2008-7019081.
May 31, 2010 English Translation of Korean Office Action issued in Korean Patent Application No. 10-2008-7019082.
May 31, 2011 Office Action issued in Japanese Patent Application No. 2009-225810 (with translation).
May 4, 2005 Office Action issued in Taiwanese Patent Application No. 092133642 (with translation).
May 4, 2012 Office Action issued in Taiwanese Patent Application No. 096138500 (with translation).
May 5, 2010 Office Action issued in Chinese Patent Application No. 200810126659.6 (with translation).
May 9, 2012 Office Action issued in Chinese Patent Application No. 200810211496.1 (with translation).
Nov. 10, 2009 Office Action issued in Japanese Patent Application No. 2003-390672 (with translation).
Nov. 10, 2011 Office Action issued in European Patent Application No. 07 017 146.7.
Nov. 12, 2008 Office Action issued in U.S. Appl. No. 11/410,952.
Nov. 12, 2010 Office Action issued in Chinese Patent Application No. 200710110948.2 with translation.
Nov. 12, 2010 Office Action issued in Chinese Patent Application No. 200910126047.1 (with translation).
Nov. 13, 2009 Office Action issued in Chinese Patent Application No. 200810211496.1 (with translation).
Nov. 15, 2007 Office Action issued in Korean Patent Application No. 10-2007-7022489 (with translation).
Nov. 15, 2011 Office Action issued in European Patent Application No. 09 167 707.0.
Nov. 15, 2011 Office Action issued in Korean Patent Application No. 10-2009-7010158 (with translation).
Nov. 15, 2011 Office Action issued in Korean Patent Application No. 10-2009-7010159 (with translation).
Nov. 17, 2011 Office Action issued in Taiwanese Patent Application No. 096119463 (with translation).
Nov. 18, 2010 Notice of Allowance issued in U.S. Appl. No. 12/289,515.
Nov. 19, 2010 Office Action issued in Korean Patent Application No. 10-2008-7029535 (with translation).
Nov. 21, 2012 Office Action issued in European Patent Application No. 05 703 646.9.
Nov. 22, 2011 Office Action issued in Chinese Patent Application No. 200910173718.X (with translation).
Nov. 25, 2009 Office Action issued in U.S. Appl. No. 11/410,952.
Nov. 25, 2011 Office Action issued in European Patent Application No. 06 711 853.9.
Nov. 26, 2012 Written Opinion against the Written Answer issued in Korean Patent Application No. 10-1020455, Appeal No. 2011Dang510 (with translation).
Nov. 26, 2012 Written Opinion against the Written Answer issued in Korean Patent Application No. 10-1020378, Appeal No. 2011Dang511 (with translation).
Nov. 28, 2011 Office Action issued in U.S. Appl. No. 12/801,043.
Nov. 29, 2011 Written Rebuttal against the Written Answer filed by the Respondent in Korean Patent Application No. 10-2006-7008368 (with translation).
Nov. 29, 2011 Written Rebuttal against the Written Answer filed by the Respondent in Korean Patent Application No. 10-2007-7022489 (with translation).
Nov. 29, 2011 Written Rebuttal against the Written Answer filed by the Respondent in Korean Patent Application No. 10-2008-7019081 (with translation).
Nov. 29, 2011 Written Rebuttal against the Written Answer filed by the Respondent in Korean Patent Application No. 10-2008-7019082 (with translation).
Nov. 3, 2010 European Search Report issued in EP 09 01 5058.2.
Nov. 30, 2010 Korean Notice of Allowance issued in Korean Application No. 10-2008-7019081.
Nov. 30, 2010 Notice of Allowance issued in Korean Application No. 10-2008-7019082.
Nov. 30, 2010 Notice of Allowance issued in U.S. Appl. No. 12/289,518.
Nov. 6, 2008 Office Action issued in U.S. Appl. No. 12/155,301.
Nov. 6, 2009 Office Action issued in Chinese Application No. 2008102114957 (with translation).
Nov. 6, 2012 Written Opinion against the Written Answer issued in Korean Patent Application No. 10-839686, Appeal No. 2011Dang301 (with translation).
Nov. 6, 2012 Written Opinion against the Written Answer issued in Korean Patent Application No. 10-869390, Appeal No. 2011Dang302 (with translation).
Nov. 9, 2009 Office Action issued in Japanese Patent Application No. 2003-402584 (with translation).
Nov. 9, 2012 Office Action issued in U.S. Appl. No. 11/644,966.
Oct. 1, 2008 Supplemental European Search Report issued in European Patent Application No. 04817303.3.
Oct. 10, 2011 Office Action issued in Chinese Patent Application No. 200710110952.9 (with translation).
Oct. 10, 2012 Office Action issued in Chinese Patent Application No. 200910173717.5 (with translation).
Oct. 12, 2012 Office Action issued in U.S. Appl. No. 12/458,635.
Oct. 13, 2009 European Search Report issued in European Patent Application No. 09167707.0.
Oct. 17, 2012 Notice of Allowance issued in Korean Patent Application No. 10-2010-7001907 (with translation).
Oct. 18, 2007 European Search Report issued in European Patent Application No. 07017146.7.
Oct. 18, 2010 Office Action issued in U.S. Appl. No. 12/382,277.
Oct. 18, 2011 Office Action issued in Japanese Patent Application No. 2006-262589 (with English translation).
Oct. 18, 2011 Office Action issued in Japanese Patent Application No. 2005-515570 (with English translation).

(56) References Cited

OTHER PUBLICATIONS

Oct. 24, 2008 Office Action issued in Chinese Patent Application No. 2007101109529 (with translation).
Oct. 26, 2004 Office Action issued in Chinese Patent Application No. 200480031414.5 (with translation).
Oct. 26, 2010 Office Action issued in Japanese Patent Application No. 2005-517637 (with translation).
Oct. 26, 2010 Office Action issued in Japanese Patent Application No. 2006-262588 (with translation).
Oct. 26, 2010 Office Action issued in Japanese Patent Application No. 2006-262590 (with translation).
Oct. 26, 2012 Office Action issued in Taiwanese Patent Application No. 097117893 (with translation).
Oct. 27, 2010 Office Action issued in Korean Patent Application No. 10-2005-7009937 (with translation).
Oct. 29, 2009 Office Action issued in U.S. Appl. No. 12/289,515.
Oct. 30, 2012 Office Action issued in Korean Patent Application No. 10-2012-7023534 (with translation).
Oct. 4, 2010 International Search Report issued in International Application No. PCT/JP2010/061300.
Oct. 4, 2010 Supplementary European Search Report issued in European Patent Application No. 05703646.9.
Oct. 4, 2010 Written Opinion of the International Searching Authority issued in International Application No. PCT/JP2010/061300.
Oct. 7, 2009 Office Action issued in European Patent Application No. 04 799 453.8.
Oct. 8, 2010 Office Action issued in Chinese Patent Application No. 200810126659.6 (with translation).
Oct. 8, 2010 Office Action issued in European Patent Application No. 06822564.8.
Oct. 8, 2012 Office Action issued in Chinese Patent Application No. 200910173716.0 (with translation).
Polarizer, Wikipedia, http://en.wikipedia.org/wiki/Polarizer, Oct. 18, 2011 (11 pp.).
Sep. 1, 2011 Office Action in U.S. Appl. No. 11/902,277.
Sep. 11, 2009 Office Action issued in Chinese Application No. 2008102114976 (with translation).
Sep. 11, 2012 Office Action issued in Taiwanese Patent Application No. 097117896 (with translation).
Sep. 13, 2011 Office Action in European Patent Application No. 04 799 453.8.
Sep. 14, 2009 Office Action issued in U.S. Appl. No. 12/155,301.
Sep. 15, 2008 Office Action issued in U.S. Appl. No. 11/644,966.
Sep. 18, 2012 Office Action issued in Chinese Patent Application No. 200910173718.X (with translation).
Sep. 18, 2012 Office Action issued in Japanese Patent Application No. 2010-094216 (with translation).
Sep. 18, 2012 Office Action issued in Japanese Patent Application No. 2011-144669 (with translation).
Sep. 20, 2010 Notice of Allowance issued in U.S. Appl. No. 11/410,952.
Sep. 20, 2011 Office Action issued in Japanese Patent Application No. 2009-225810 (with translation).
Sep. 20, 2012 Office Action issued in European Patent Application No. 04 817 303.3.
Sep. 25, 2007 Office Action issued in European Patent Application No. 04 799 453.8.
Sep. 27, 2010 Office Action issued in U.S. Appl. No. 10/587,254.
Sep. 27, 2011 Office Action issued in Japanese Patent Application No. 2010-003941 (with translation).
Sep. 27, 2011 Office Action issued in Japanese Patent Application No. 2010-003938 (with translation).
Sep. 29, 2010 European Search Report issued in European Patent Application No. 10174843.2.
Sep. 30, 2011 Office Action in Korean Application No. 10-2005-7018973 (with English translation).
Sep. 4, 2012 Office Action issued in Japanese Patent Application No. 2010-087010 (with translation).
Sep. 6, 2011 Notice of Allowance in U.S. Appl. No. 11/644,966.
Tsuruta, T. "Applied Optics II," Baifukan Co., Ltd. pp. 166-167, Jul. 1990 (with English Translation).
U.S. Appl. No. 12/835,860, filed Jul. 14, 2010 by Kanayamaya et al.
Wave Plate, Wikipedia, the free encyclopedia, http://en.wikipedia.org/wiki/Wave_plate, Feb. 7, 2011, pp. 16-1-16-16.
Oct. 15, 2013 Office Action issued in U.S. Appl. No. 13/889,965.
Oct. 15, 2013 Office Action issued in U.S. Appl. No. 13/137,342.
Oct. 16, 2013 Office Action issued in U.S. Appl. No. 13/137,003.
Oct. 17, 2013 Notice of Allowance issued in Korean Patent Application No. 10-2012-7008342 (with English translation).
Oct. 17, 2013 Notice of Allowance issued in U.S. Appl. No. 11/902,277.
Oct. 18, 2013 Office Action issued in U.S. Appl. No. 11/902,282.
Oct. 21, 2013 Office Action issued in U.S. Appl. No. 13/137,002.
Oct. 29, 2013 Office Action issued in U.S. Appl. No. 13/890,142.
Nov. 5, 2013 Office Action issued in Japanese Patent Application No. P2012-080675 (with translation).
Nov. 5, 2013 Office Action issued in Japanese Patent Application No. P2012-080678 (with translation).
Nov. 7, 2013 Office Action issued in U.S. Appl. No. 12/289,518.
Nov. 8, 2013 Office Action issued in U.S. Appl. No. 13/912,832.
Nov. 12, 2013 Office Action issued in U.S. Appl. No. 13/889,860.
Nov. 13, 2013 Office Action issued in U.S. Appl. No. 13/889,965.
Aug. 23, 2013 Reply Brief, Patent Invalidation Action 2013HEO3975 issued in Korean Patent Application No. 10-2007-7022489 (with translation).
Aug. 23, 2013 Reply Brief, Patent Invalidation Action 2013HEO3982 issued in Korean Patent Application No. 10-2008-7019081 (with translation).
Sep. 11, 2013 Office Action issued in U.S. Appl. No. 13/890,603.
Dec. 13, 2013 Office Action issued in European Patent Application No. 09 015 058.2.
Nov. 20, 2013 Office Action issued in U.S. Appl. No. 12/289,515.
Oh, "Notarial Certificate of affiant Professor H. G. Oh", Oct. 22, 2013 (with English translation).
"Declaration of Dr. Michael Totzeck", Oct. 8, 2013 (with English translation).
"Korean Patent Office Guidelines for Examination," 2010 (with partial translation).
Oct. 25, 2013 Preparatory Document (2-1), Korean Patent Invalidation Action 2013HEO03937 (with English translation).
Oct. 25, 2013 Preparatory Document (2-2), Korean Patent Invalidation Action 2013HEO03937 (with English translation).
Dec. 4, 2013 Office Action issued in Chinese Patent Application No. 200710110950.X (with translation).
Dec. 17, 2013 Office Action issued in Korean Patent Application No. 10-2013-7026632 (with translation).
Dec. 18, 2013 Office Action issued in Korean Patent Application No. 10-2012-7034127 (with translation).
Mar. 14, 2014 Office Action issued in U.S. Appl. No. 13/889,798.
Apr. 4, 2014 Office Action issued in Chinese Patent Application No. 200910173718.X (with translation).
Apr. 16, 2014 Office Action issued in U.S. Appl. No. 12/458,635.
Apr. 23, 2014 Submission Document, Patent Invalidation Action No. 2013HEO3920, issued in Korean Patent Application No. 10-2007-7022489 (with translation).
Apr. 23, 2014 Submission Document, Patent Invalidation Action No. 2013HEO3937, issued in Korean Patent Application No. 10-2006-7008368 (with translation).
Apr. 23, 2014 Submission Document, Patent Invalidation Action No. 2013HEO3944, issued in Korean Patent Application No. 10-2008-7019081 (with translation).
Apr. 23, 2014 Submission Document, Patent Invalidation Action No. 2013HEO3951, issued in Korean Patent Application No. 10-2008-7019082 (with translation).
Apr. 23, 2014 Submission Document, Patent Invalidation Action No. 2013HEO3975, issued in Korean Patent Application No. 10-2007-7022489 (with translation).
Apr. 23, 2014 Submission Document, Patent Invalidation Action No. 2013HEO3982, issued in Korean Patent Application No. 10-2008-7019081 (with translation).
Apr. 29, 2014 Office Action issued in European Patent Application No. 13156325.6.

(56) References Cited

OTHER PUBLICATIONS

Apr. 29, 2014 Office Action issued in European Patent Application No. 13156324.9.
Apr. 29, 2014 Office Action issued in European Patent Application No. 13156322.3.
Feb. 13, 2014 Office Action issued in Chinese Patent Application No. 200910126047.1 (with translation).
Jan. 23, 2014 Reference Document, Patent Invalidation Action No. 2013HEO3920, issued in Korean Patent Application No. 10-2007-7022489 (with translation).
Jan. 23, 2014 Reference Document, Patent Invalidation Action No. 2013HEO3937, issued in Korean Patent Application No. 10-2006-7008368 (with translation).
Jan. 23, 2014 Reference Document, Patent Invalidation Action No. 2013HEO3944, issued in Korean Patent Application No. 10-2008-7019081 (with translation).
Jan. 23, 2014 Reference Document, Patent Invalidation Action No. 2013HEO3951, issued in Korean Patent Application No. 10-2008-7019082 (with translation).
Jan. 23, 2014 Reference Document, Patent Invalidation Action No. 2013HEO3975, issued in Korean Patent Application No. 10-2007-7022489 (with translation).
Jan. 23, 2014 Reference Document, Patent Invalidation Action No. 2013HEO3982, issued in Korean Patent Application No. 10-2008-7019081 (with translation).
May 15, 2014 Decision Rendered by Division II of Korean Patent Court for Korean Patent Invalidation Action No. 2013HEO3920 (with English translation).
May 15, 2014 Decision Rendered by Division II of Korean Patent Court for Korean Patent Invalidation Action No. 2013HEO3937 (with English translation).
May 15, 2014 Decision Rendered by Division II of Korean Patent Court for Korean Patent Invalidation Action No. 2013IIEO3944 (with English translation).
May 15, 2014 Decision Rendered by Division II of Korean Patent Court for Korean Patent Invalidation Action No. 2013HEO3951 (with English translation).
May 15, 2014 Decision Rendered by Division II of Korean Patent Court for Korean Patent Invalidation Action No. 2013HEO3975 (with English translation).
May 15, 2014 Decision Rendered by Division II of Korean Patent Court for Korean Patent Invalidation Action No. 2013HEO3982 (with English translation).
Jan. 6, 2014 Office Action issued in Chinese Patent Application No. 200910173717.5.
Feb. 5, 2014 Office Action issued in U.S. Appl. No. 12/382,277.
Feb. 6, 2014 Office Action issued in U.S. Appl. No. 13/890,142.
Feb. 6, 2014 Office Action issued in U.S. Appl. No. 13/890,547.
Jan. 29, 2015 Office Action issued in U.S. Appl. No. 13/889,860.
The Second Division of Korean Patent Court, "Preparatory Document (3), Re: Patent Invalidation Action 2013HEO3920, Plaintiff: Carl Zeiss SMT GmbH, Defendant Nikon Corporation" Dec. 13, 2013.
The Second Division of Korean Patent Court, "Preparatory Document (2), Re: Patent Invalidation Action 2013HEO3920, Plaintiff: Carl Zeiss SMT GmbH, Defendant Nikon Corporation" Oct. 30, 2013.
The Second Division of Korean Patent Court, "Preparatory Document (3), Re: Patent Invalidation Action 2013HEO3937, Plaintiff: Carl Zeiss SMT GmbH, Defendant Nikon Corporation" Dec. 13, 2013.
The Second Division of Korean Patent Court, "Preparatory Document (3), Re: Patent Invalidation Action 2013HEO3944, Plaintiff: Carl Zeiss SMT GmbH, Defendant Nikon Corporation" Dec. 13, 2013.
The Second Division of Korean Patent Court, "Preparatory Document (2), Re: Patent Invalidation Action 2013HEO3944, Plaintiff: Carl Zeiss SMT GmbH, Defendant Nikon Corporation" Oct. 30, 2013.
The Second Division of Korean Patent Court, "Preparatory Document (3), Re: Patent Invalidation Action 2013HEO3951, Plaintiff: Carl Zeiss SMT GmbH, Defendant Nikon Corporation" Dec. 13, 2013.
The Second Division of Korean Patent Court, "Preparatory Document (2), Re: Patent Invalidation Action 2013HEO3951, Plaintiff: Carl Zeiss SMT GmbH, Defendant: Nikon Corporation" Oct. 30, 2013.
The Second Division of Korean Patent Court, "Reference Document, Re: Patent Invalidation Action 2013HEO3975, Plaintiff: Nikon Corporation, Defendant: Carl Zeiss SMT GmbH" Jan. 14, 2014.
Jun. 6, 2014 Office Action issued in Taiwanese Patent Application No. 101103772 (with translation).
Jun. 24, 2014 Office Action issued in European Patent Application No. 04 817 303.3.
Jun. 26, 2014 Search Report issued in European Patent Application No. 13 165 334.7.
Jun. 26, 2014 Search Report issued in European Patent Application No. 13 165 335.4.
Jun. 26, 2014 Search Report issued in European Patent Application No. 13 165 338.8.
Jun. 26, 2014 Search Report issued in European Patent Application No. 13 165 340.4.
Aug. 28, 2014 Office Action issued in Korean Patent Application No. 2012-7034128 (with translation).
Aug. 6, 2014 Office Action issued in U.S. Appl. No. 13/137,342.
Aug. 6, 2014 Office Action issued in U.S. Appl. No. 13/137,003.
Aug. 6, 2014 Office Action issued in U.S. Appl. No. 13/137,002.
Feb. 2, 2015 Office Action issued in U.S. Appl. No. 13/912,832.
Feb. 5, 2015 Office Action issued in U.S. Appl. No. 12/289,515.
Feb. 10, 2015 Office Action issued in Korean Patent Application No. 10-2014-7003559.
Feb. 11, 2015 Office Action issued in Korean Patent Application No. 10-2010-7008441.
Oct. 21, 2014 Office Action issued in Japanese Application No. P2013-272100 with translation.
Nov. 5, 2014 Office Action issued in Chinese Application No. 200910126047.1 with translation.
Dec. 2, 2014 Office Action issued in Japanese Application No. 2013-272068 with translation.
Jun. 3, 2014 Office Action issued in Japanese Patent Application No. P2013-157042 (with translation).
Jun. 3, 2014 Office Action issued in Japanese Patent Application No. P2013-157044 (with translation).
Jun. 13, 2014 Office Action issued in Taiwanese Patent Application No. 101133189 (with translation).
Jun. 13, 2014 Office Action issued in Taiwanese Patent Application No. 101141665 (with translation).
Aug. 11, 2014 Office Action issued in Taiwanese Patent Application No. 101102214 (with translation).
Aug. 6, 2014 Office Action issued in U.S. Appl. No. 13/889,965.
Jun. 25, 2014 Office Action issued in U.S. Appl. No. 13/889,860.
Jun. 27, 2014 Office Action issued in U.S. Appl. No. 13/912,832.
Jul. 16, 2014 Office Action issued in U.S. Appl. No. 12/289,515.
Dec. 10, 2014 Office Action issued in U.S. Appl. No. 12/289,518.
Sep. 11, 2014 Office Action issued in U.S. Appl. No. 12/382,277.
Sep. 12, 2014 Office Action issued in U.S. Appl. No. 13/890,142.
Jan. 21, 2016 Advisory Action issued in U.S. Appl. No. 13/889,860.
Jan. 21, 2016 Advisory Action issued in U.S. Appl. No. 12/289,515.
Dec. 30, 2015 Office Action issued in Taiwanese Application No. 102142028.
Jan. 12, 2016 Office Action issued in Taiwanese Application No. 103116064.
Nov. 16, 2015 Office Action issued in Korean Application No. 10-2014-7003559.
Mar. 24, 2015 Office Action issued in Japanese Patent Application No. P2014-087750.
Apr. 6, 2015 Office Action issued in U.S. Appl. No. 14/048,563.
Apr. 24, 2015 Office Action issued in U.S. Appl. No. 13/890,142.
Apr. 27, 2015 Office Action issued in Korean Application No. 10-2014-7009172.

(56) References Cited

OTHER PUBLICATIONS

Jun. 23, 2015 Office Action issued in Japanese Application No. 2014-158994.
Jul. 16, 2015 Office Action issued in U.S. Appl. No. 13/912,832.
Jul. 20, 2015 Notice of Allowance issued in U.S. Appl. No. 13/067,958.
Jul. 15, 2015 Office Action issued in U.S. Appl. No. 12/289,515.
Jul. 16, 2015 Office Action issued in U.S. Appl. No. 13/889,860.
Aug. 4, 2015 Office Action issued in Japanese Application No. 2014-197119.
Aug. 4, 2015 Office Action issued in Japanese Application No. 2014-216961.
Aug. 4, 2015 Office Action issued in Japanese Application No. 2014-216964.
Oct. 8, 2015 Office Action issued in Korean Application No. 10-2010-7008441.
Oct. 6, 2015 Office Action issued in Japanese Application No. 2014-256977.
Oct. 22, 2015 Office Action issued in U.S. Appl. No. 14/713,428.
Oct. 22, 2015 Office Action issued in U.S. Appl. No. 14/048,563.
Dec. 1, 2015 Office Action issued in Korean Application No. 10-2014-7036570.
Jan. 5, 2016 Office Action issued in Japanese Application No. 2015-018675.
Feb. 1, 2016 Office Action issued in Korean Application No. 10-2015-7005285.
Jan. 27, 2016 Office Action issued in Taiwanese Application No. 103116066.
Mar. 23, 2016 Office Action issued in U.S. Appl. No. 13/890,142.
May 17, 2016 Office Action issued in U.S. Appl. No. 14/713,385.
May 24, 2016 Office Action issued in Japanese Application No. JP2015-165058.
Jun. 14, 2016 Office Action issued in Japanese Patent Application No. 2014-256977.
Sep. 6, 2016 Office Action issued in Japanese Application No. P2015-238871.
Nov. 29, 2016 Office Action issued in Japanese Patent Application No. 2016-043787.
Oct. 11, 2016 Office Action issued in Korean Application No. 10-2015-7005285.
Oct. 3, 2016 Office Action issued in Korean Application No. 10-2014-7036570.
Sep. 28, 2016 Office Action issued in Korean Application No. 10-2015-7022796.
Jan. 17, 2017 Office Action issued in European Application No. 16167687.9.
Dec. 21, 2016 Office Action issued in U.S. Appl. No. 14/818,788.
Feb. 7, 2017 Office Action issued in Japanese Application No. 2015-198071.
Feb. 7, 2017 Office Action issued Taiwanese Application No. 104133625.
Mar. 16, 2017 Office Action issued in Taiwanese Application No. 105123963.
Apr. 25, 2017 Office Action issued in Japanese Application No. 2016-145649.
May 16, 2017 Office Action issued in Korean Application No. 10-2016-7013759.
Jun. 15, 2017 Office Action issued in U.S. Appl. No. 15/497,883.
Jul. 10, 2017 Office Action issued in U.S. Appl. No. 12/289,515.
Jul. 10, 2017 Office Action issued in U.S. Appl. No. 13/912,832.
Jul. 11, 2017 Office Action issued in U.S. Appl. No. 13/889,860.
Jul. 24, 2017 Office Action issued in Korean Application No. 10-2015-7022796.
Oct. 3, 2017 Office Action issued in Japanese Application No. 2017-000747.
Sep. 25, 2017 Office Action issued in European Application No. 17170796.1.
Oct. 17, 2017 Office Action issued in Japanese Application No. 2016-145649.
Nov. 28, 2017 Office Action issued in Korean Patent Application No. 10-2010-7008441.
Dec. 19, 2017 Office Action issued in U.S. Appl. No. 14/818,788.

\* cited by examiner

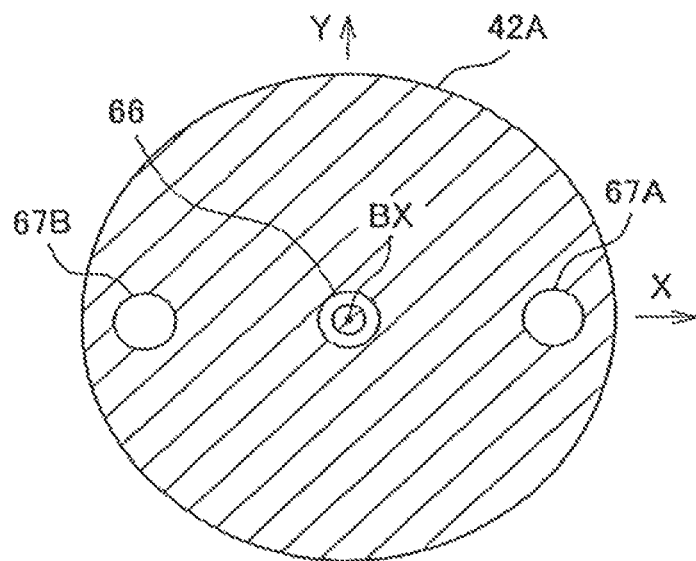
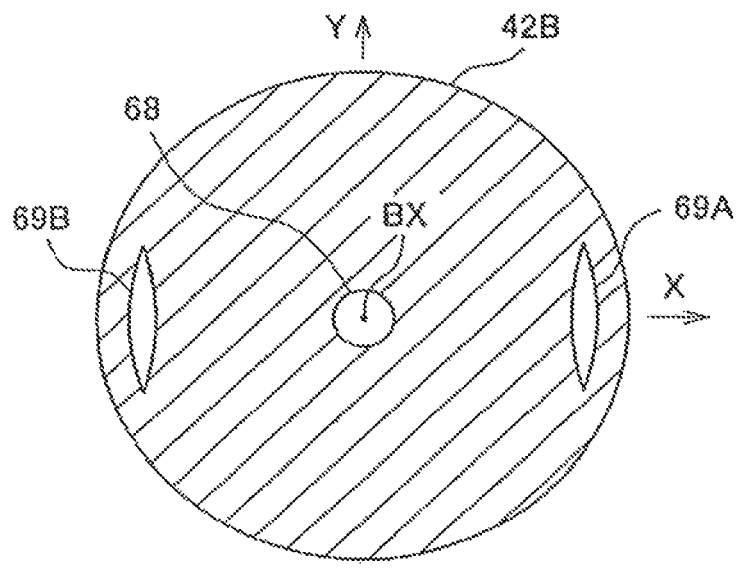

ILLUMINATION OPTICAL APPARATUS HAVING DEFLECTING MEMBER, LENS, POLARIZATION MEMBER TO SET POLARIZATION IN CIRCUMFERENCE DIRECTION, AND OPTICAL INTEGRATOR

This is a continuation of U.S. application Ser. No. 11/902,282 filed Sep. 20, 2007, which is a continuation of U.S. application Ser. No. 11/246,642 filed Oct. 11, 2005, which is a Continuation of International Application No. PCT/JP2004/004522 filed Mar. 30, 2004, which claims priority to Japanese Application No. 2003-329194 filed on Sep. 19, 2003, Japanese Application No. 2003-329309 filed on Sep. 22, 2003, Japanese Application No. 2003-307806 filed on Aug. 29, 2003, Japanese Application No. 2003-299628 filed on Aug. 25, 2003 and Japanese Application No. 2003-105920 filed on Apr. 9, 2003. The entire disclosures of the prior applications are hereby incorporated herein by reference in their entirety.

TECHNICAL FIELD

The present invention relates to an exposure technology used to transfer mask-pattern on substrates such as wafers in a lithography process for fabricating various kinds of devices such as semiconductor elements, liquid crystal displays, thin-film magnetic heads and, more particularly to an exposure technology using an illuminating technology related to the so-called deformed illumination. Further, the present invention relates to a technology for fabricating the device using the exposure technology.

BACKGROUND ART

The apparatus for the projection exposure of the batch exposure system such as the step-and-repeat system or the scan exposure system such as the step-and-scan system have been used to transfer the pattern of the reticle (or photo-mask etc.) as the mask on the wafers (or vitreous plate etc.) as the substrates intended for exposure in the lithography process for fabricating semiconductor elements (or liquid crystal displays etc.). In the kind of apparatus for the projection exposure, it is desirable to transfer various kinds of pattern on the wafers with each high resolution.

The transferred pattern that requires very fine high resolution is the so-called contact hole. The contact hole includes the densely massed contact hole having a plurality of predetermined shaped aperture arranged with predetermined fine pitch and the isolated contact hole being substantially comprised of a single aperture. In order to transfer the pattern of the former densely massed contact hole on the wafer with high resolution, the so-called deformed illumination system (deformed light source system), which allows the amount of light of the illumination light to be enlarged in one or more areas (particularly four areas) being eccentric for optical axis at the pupil plane of the illumination system, is effective (refer to Japanese Patent Applications Laid-open No. Hei 5-67558 (corresponding with U.S. Pat. No. 6,094,305) and NO. 2001-176766 (corresponding to U.S. Pat. No. 6,563,567)).

On the other hand, in order to transfer the pattern of the later isolated contact hole on the wafer with high resolution, the illumination system, which allows the amount of light of the illumination light to be enlarged in a relatively small round area centering optical axis at the pupil plane of the illumination system, that is, the illumination system that allows the σ value, being a coherence factor of the illumination system to be relatively lessened (hereinafter, it will be called "small a illumination system" for convenience of description), is known to be effective.

DISCLOSURE OF THE INVENTION

As described above, the pattern of the densely massed contact hole with fine pitch and the isolated contact hole can be transferred on the wafer with high resolution through the deformed illumination system and the small illumination system respectively. Recently with regard to this, for example, in fabricating semiconductor elements, it is becoming a requirement that transferring one reticle pattern being formed, the pattern being of the contact hole, with various kinds of pitch, which include the patterns ranging from the contact hole arranged with great pitch, which can be substantially regarded as the isolated contact hole, to the densely massed contact hole with fine pitch, on the wafer at one time exposure.

For that reason, however, it is a disadvantage that when using the deformed illumination system, the resolution is not sufficient for the contact hole with large pitch; while when using the small σ illumination system, the resolution is not sufficient for the densely massed contact hole with fine pitch.

Further, recently, for example, when fabricating semiconductors, it has come to be demanded to transfer the pattern of the so-called contact hole densely massed in one direction, which is arranged in the one direction with fine pitch and can be substantially regarded as the isolated pattern in terms of the direction orthogonal to it, to wafer with high resolution.

However, it is a disadvantage that the resolution is not sufficient in the direction in which the pattern can be regarded as the isolated pattern, with using the traditional deformed illumination system for this purpose. Whereas, it is not sufficient in the direction in which the pattern is arranged with the fine pitch, with using the small σ illumination system.

Considering this problem, the first object of the present invention is to provide an exposure technology for simultaneously transferring the pattern having various kinds of pitches with high resolution respectively.

And the second object of the present invention is to provide an exposure technology for transferring the pattern, which is arranged in one direction periodically and is substantially isolated (pattern densely massed in one direction) in terms of the orthogonal direction, with high resolution.

And the third object of the present invention is to provide a manufacturing technology for fabricating the device including various kinds of patterns or including the pattern densely massed in one direction with high accuracy and yet high throughput.

The first exposure method according to the present invention, which is an exposure method for illuminating a mask with an optical beam from an illumination system to expose a substrate with the optical beam through the mask and a projection system, characterized in that a light amount distribution of the optical beam on a predetermined plane with respect to the illumination system is set such that an amount of light is set larger in nine areas than in an area other than the nine areas, the nine areas including a first area and eight areas, an outer contour of the first area including an optical axis of the illumination system, and the eight areas being arranged so as to encompass the first area and each of the eight areas being smaller than the first area.

According to the present invention, such a pattern that is great in pitch and can be substantially regarded as the isolated contact hole by means of the optical beam passing through the first area is transferred with high resolution, and the pattern which includes the patterns ranging from the pattern with around middle pitch to the pattern with fine pitch like the densely massed contact hole by means of the optical beam passing through the eight areas enclosing the first area, is transferred with high resolution. Accordingly, it is able to simultaneously transfer the patterns having various kinds of pitches with high resolution respectively.

In this case, it is preferable that the first area to be located at the center is an annular zone area. With the annular illumination at the first area, the resolution and the depth of focus might be improved in some cases. Furthermore, the amount of light (intensity per unit area e.g.) at the first area to be located in the center may be made different from the amount of light at the surround areas enclosing it.

Furthermore, as an example, the predetermined plane is a pupil plane of the illumination system, and the nine areas in which the amount of light on the predetermined plane is greater than the amount of light at the area other than the nine areas, comprises the first area, four second areas which are arranged along a first circumference that encloses the first area and which are respectively smaller than the first area, and four third areas which are arranged along a second circumference that encloses the first circumference and which are respectively smaller than the first area.

With this composition, the pattern having the around middle pitch is transferred with high resolution by means of the optical beam passing through the second areas, and the pattern having the fine pitch is transferred with high resolution by means of the optical beam passing through the third areas.

Furthermore, it is preferable that the first area, two of the second areas, and two of the third areas are arranged along a first straight line passing through the optical axis of the illumination system, and the first area, the other two of the second areas, and the other two of the third areas are arranged along a second straight line which is orthogonal to the first straight line and which passes through the optical axis of the illumination system.

The conventional pattern intended to transfer is two-dimensionally arranged along two directions orthogonal to each other (one of them will be called "arranging direction of pattern"). Then, by making the direction of the first straight line (or the second straight line) intersect the arranging direction of the pattern (preferably making it intersect at 45 degree), the pattern having various kinds of the pitches two-dimensionally arranged can be transferred with high resolution respectively.

Further, the radius (r1) when the first area is made circular, and the radii (r2, r3) when the second and third areas are made circular are preferably set to the following bounds with the maximum σ value (this will be assumed a) of the illumination system assumed to be a reference. In addition, also if the first area, second areas, and third areas are set to other shape different from the circles such as the square, the regular hexagon or the shape having one quarter circle, the sizes of them preferable equal those of the circulars. In addition, if the first area is annular, the outer radius (r1) is preferably set to the bounds of an equation (1), as follows:

$$0.2\sigma \leq r1 \leq 0.4\sigma \quad (1)$$

$$0.075\sigma \leq r2 \leq 0.2\sigma \quad (2)$$

$$0.075\sigma \leq r3 \leq 0.2\sigma \quad (3)$$

If each area becomes smaller than the lower limit of the equation (1), equation (2), and equation (3), there is a possibility that the resolution deteriorates for some patterns from among the patterns having various kinds of the pitches. On the other hand, if each area becomes greater than the upper limit of the equation (1), equation (2), and equation (3), there is a possibility that the resolution deteriorates for the pattern having fine pitch because this system will be close to the conventional illumination system.

Next, the second exposure method according to the present invention, which is an exposure method for illuminating a mask with an optical beam from an illumination system to expose a substrate with the optical beam through the mask and a projection system, has a step of setting a light amount distribution of the optical beam on a predetermined plane with respect to the illumination system is set such that an amount of light is set larger in five areas than in an area other than the five areas, the five areas including a first area of an annular zone shape in which an outer contour of the first area including an optical axis of the illumination system, and the four areas being arranged so as to encompass the first area and each of the four areas being smaller than the first area.

According to the present invention, such a pattern that is large in the pitch and can be substantially regarded as the isolated contact hole is transferred by means of the optical beam passing through the annular first area is transferred with high resolution, and the pattern having fine pitch like the densely massed contact hole by means of the optical beam passing through the four areas enclosing the first area is transferred with high resolution. Accordingly, it is able to simultaneously transfer the patterns having various kinds of the pitches with high resolution respectively.

Further, as an example, the predetermined plane is a pupil plane of the illumination system, and the five areas in which the amount of light on the predetermined plane is greater than the amount of light at the area other than the five areas, comprises the first area and four second areas which are arranged, at intervals of substantially 90 degree therebetween, along a circumference that encloses the first area and which are respectively smaller than the first area.

With this composition, the pattern having the fine pitch is transferred with high resolution by means of the optical beam passing through the second areas. The conventional pattern intended to transfer is two-dimensionally arranged along two directions orthogonal to each other (one of them will be called "arranging direction of pattern"). Then, by making the direction, in which the second areas are arranged intersect the arranging direction of the pattern (preferably making it intersect at 45 degree), the pattern having various kinds of the pitches two-dimensionally arranged can be transferred with high resolution respectively.

Further, it is preferable that the radius (r1) when the first area is made annular with its contour assumed to be circular and the radius (r2) when the second area is made circular is preferably set within the bounds of the equations (1) and (2) described above with the maximum σ value (this will be assumed σ) of the illumination system assumed to be a reference. This enables the pattern having various kinds of the pitches to be transferred with high resolution.

In the present invention, an optical beam generated from each of the areas which have large amount of light which are arranged out of the optical axis of the illumination system on the predetermined plane is linear polarization. In this case, a direction of polarization of the optical beam on the predetermined plane is substantially coincident with a circumference direction (that is, the optical beam may be S polarization).

Next, the third method for exposure according to the present invention, which is an exposure method having a step for illuminating a mask with an optical beam from an illumination system to expose a substrate with the optical beam through the mask and a projection system, has a step of setting a light amount distribution of the optical beam on a predetermined plane with respect to the illumination system is set such that an amount of light is set larger in three areas than in the area other than these.

According to the present invention, if one direction dense patterns are formed at the mask, the patterns are transferred with high resolution the direction of which the patterns are isolate by means of optical beam passing through the center of the three areas, and the patterns are transferred with high resolution the direction of which the patterns are periodically arranged by means of optical beam passing through the two areas which sandwich the center area.

In this case, the three areas having large amount of light include a first area near an optical axis of the illumination system, and a second area and a third area which are arranged along a straight line passing through the optical axis so as to sandwich the first area. Alternatively, the three areas having large amount of light include a first area near an optical axis of the illumination system, and a second area and a third area which are arranged with the approximately same distance from the optical axis.

With these compositions, by providing (paralleling) the direction of which the three areas are arranged to the direction of which the one direction dense pattern is periodically arranged, it is able to transfer the one directional high density pattern to the two directions of the isolated and periodical ones with high resolution.

In other words, if a pattern formed on the mask includes a one directionally high density pattern which is periodically arranged along a predetermined first axis and which is substantially isolated in a direction of a second axis orthogonal to the first axis, the three areas having large amount of light are preferably arranged with a distance therebetween in a parallel direction to the first axis. Whereby, it is able to transfer the one directional high density pattern with high resolution along the first axis and the second axis respectively. Further, the three areas having large amount of light are preferably arranged along a straight line which is parallel to the first axis and which passes through the optical axis of the illumination system.

Furthermore, a center area of the three areas having large amount of light is preferably set such that an amount of light of a center part thereof is smaller than an amount of light of a part other than the center part. Whereby, it is able to increase the resolution in the direction of which the pattern is isolated and to widen the depth of focus.

In this case, the center area is around an annular zone area as an example. Furthermore, the center area comprises a plurality of areas separated from each other. The plurality of areas separated from each other, which are the center area, are arranged along a predetermined straight line passing through the optical axis of the illumination system on the predetermined plane as an example. Furthermore, an arranging direction of the plurality of areas separated from each other, which are the center area, is determined according to a size of the center area as another example.

Further, the three areas have outlines which are the substantially same with each other as an example. Further, the sizes of the three areas having large amount of light respectively correspond to 0.1 times 0.2 times of a maximum σ value of the illumination system. Whereby, the deep depth of focus is obtained according to the simulation of the present invention.

Furthermore, the two areas of the three areas having large amount of light, which are arranged at both ends with respect to the direction parallel to the first axis, may respectively have longitudinal directions which are substantially coincident with a direction parallel to the second axis. Whereby, it is able to enhance the resolution corresponding to the one directional high density pattern and to avoid the reduction of the amount of light.

Further, the center area of the three areas having large amount of light may have a longitudinal direction which is substantially coincident with the direction parallel to the first axis.

Furthermore, an optical beam generated from a center area of the three areas having large amount of light may linear polarization, a directions of polarization is substantially coincident with a direction parallel to the first axis.

Furthermore, an optical beam generated from a center area of the three areas having large amount of light and optical beams generated from the other two areas may have different polarization states from each other. In this case, a polarization direction of the optical beam generated from the center area and a polarization direction of the optical beams generated from the other two areas are orthogonal to each other.

Further, a size of the center area of the three areas having great amount of light and sizes of the other two areas may be different from each other.

Further, the optical beams generated from the other two areas except for the center area of the three areas having large amount of light may be respectively linear polarization. In this case, for an example, the directions of polarization of optical beams distributed in the other two areas on the predetermined plane may be respectively substantially coincident with a circumference direction (that is, the optical beam may be S polarization).

Further, for an example, the predetermined plane is a pupil plane of the illumination system. Furthermore, as another example, a predetermined plane is the conjugate plane for the pupil plane of the illumination system or the pupil of the projection system (or its conjugate plane). In this case, it is obtained the highest resolution.

Next, the first exposure apparatus according to the present invention, in an exposure apparatus which an illumination system illuminates a mask with an optical beam; and a projection system which exposes a substrate with the optical beam from the mask, characterized by comprising an optical member which sets a light amount distribution of the optical beam on a predetermined plane with respect to the illumination system such that an amount of light is set larger in nine areas than in an area other than the nine areas, the nine areas including a first area and eight areas, an outer contour of the first area including an optical axis of the illumination system, and the eight areas being arranged so as to encompass the first area and each of the eight areas being smaller than the first area.

According to the present invention, with the optical members, it is able to simultaneously transfer patterns having various kinds of pitch with high resolution respectively.

In this case, in order to more improve the resolution and the depth of focus, it is preferable that the central first area is an annular zone area.

Furthermore, as an example, the predetermined plane is a pupil plane of the illumination system, and the nine areas in which the amount of light at the predetermined plane is greater than the amount of light at the area other than the nine areas, comprises the first area, four second areas which are arranged along a first circumference that encloses the first area and which are respectively smaller than the first area, and four third areas which are arranged along a second circumference that encloses the first circumference and which are respectively smaller than the first area.

Furthermore, it is preferable that the first area, the two second areas, and two of the third areas are arranged along a first straight line passing through the optical axis of the illumination system, and the first area, the other two of the second areas, and the other two of the third areas are arranged along a second straight line which is orthogonal to the first straight line and which passes through the optical axis of the illumination system.

Also in this case, the size of each area preferably satisfies the conditions of the equations (1) to (3).

Next, the second exposure apparatus according to the present invention, in an exposure apparatus which an illumination system which illuminates a mask with an optical beam; and a projection system which exposes a substrate with the optical beam from the mask, characterized by comprising an optical member which sets a light amount distribution of the optical beam on a predetermined plane with respect to the illumination system such that an amount of light is set larger in five areas than in an area other than the five areas, the five areas including a first area of an annular zone shape and four areas, an outer contour of the first area including an optical axis of the illumination system, and the four areas being arranged so as to encompass the first area and each of the four areas being smaller than the first area.

According to the present invention, with the optical members, it is able to simultaneously transfer patterns having various kinds of pitch with high resolution respectively.

Further, as an example, the predetermined plane is a pupil plane of the illumination system, and the five areas in which the amount of light on the predetermined plane is greater than the amount of light at the area other than the five areas, comprises the first area and four second areas which are arranged, at intervals of substantially 90 degree therebetween, along a circumference that encloses the first area and which are respectively smaller than the first area.

Also in this case, the size of each area preferably satisfies the conditions of the equations (1) to (3).

Furthermore, as an example, the illumination system includes an optical integrator which substantially uniformize illuminance within an illuminant area on the mask on which the optical beam is irradiated, and the optical member is arranged at an incident side of the optical integrator in the illumination system, and the optical member includes a diffractive optical element which diffracts the optical beam to a plurality of directions. In particular, with using a phase type diffractive optical element, it is able to obtain high use-efficiency.

Furthermore, as another example, the illumination system includes an optical integrator which substantially uniformize illuminance within an illuminant area on the mask on which the optical beam is irradiated, and the optical member is arranged on the predetermined plane or a conjugate plane thereof, and the optical member includes an aperture stop defining an area in which an amount of light is enhanced on the predetermined plane. The aperture stop has a simple structure and can easily set the preferable distribution of the amount of light.

Further, the optical member can preferably set different plural light amount distributions including a distribution which enhances the amount of light at the plurality of areas. Whereby, it is able to expose various kinds of pattern with optimum irradiating condition.

In the exposure apparatus according to the present invention also, an optical beam generated from each of the areas which have large amount of light and which are arranged out of the optical axis of the illumination system on the predetermined plane may be linear polarization. In this case, a direction of polarization of the optical beam on the predetermined plane may substantially coincident with a circumference direction (that is, the optical beam may be S polarization).

Further, as an example, the optical member may further include a deflection member which generates optical beams respectively distributed at different areas on the predetermined plane, and a polarization setting member which sets polarization states of the optical beams generated from the deflection member in the illumination system.

An example of the deflection member is a diffractive optical element which generates diffracted light to a plurality of directions on an optical path of the illumination system.

Furthermore, the optical member includes movable members which are arranged at an exit side of the deflection member, and which can change a positional relation between each area outside the optical axis on the predetermined plane and the optical axis of the illumination system, and the polarization setting member may be arranged between the deflection member and the movable member.

Further, the movable members may include at least one movable prism which has an inclined plane through which an optical beam distributed in a predetermined area including a plurality of areas outside the optical axis except the first area on the predetermined plane passes, the at least one movable prism moves along the optical axis of the illumination system.

Further, the optical member includes at least one movable prism which can change positions of a plurality of areas which enclose the first area and which have greater amount of light than an area other than the plurality of areas. The movable prism, as an example, has an inclined plane through which an optical beam distributed in a predetermined area including a plurality of areas outside the optical axis except the first area on the predetermined plane passes, and the movable prism moves along the optical axis of the illumination system. Furthermore, the movable prism, as another example, has a flat plane through which an optical beam distributed in the first area passes and which is approximately orthogonal to the optical axis of the illumination system.

Next, the third exposure apparatus according to the present invention, in an exposure apparatus which an illumination system illuminates a mask with an optical beam; and a projection system which exposes a substrate with the optical beam from the mask, characterized by comprising an optical member which sets a light amount distribution of the optical beam on a predetermined plane with respect to the illumination system such that an amount of light is set larger in a first area and a plurality of areas than in an area other than the first area and the plurality of areas, the first area substantially including an optical axis of the illumination system, and the plurality of areas being arranged outside the first areas, wherein the optical member includes a deflection member which generates optical beams respectively distributed at different areas on the predetermined plane, and at least one movable prism having a flat plane through which an optical beam generated from the deflection member and distributed in the first area passes and which is approximately orthogonal to the optical axis of the illumination system and an inclined plane through which an optical beam distributed in a predetermined area including a plurality of areas outside the optical axis except the first area passes, to change a positional relation between each area outside the optical axis on the predetermined plane and the optical axis of the illumination system.

According to the present invention, with the deflection member, it is able to simultaneously transfer pattern having various kinds of pitch with high resolution respectively. Further, with the movable prism, it is able to adjust the characteristic of the image-forming according to the kind of the pattern to be transferred.

In the present invention, as an example, the illumination system includes an optical integrator which substantially uniformize illuminance within an illuminant area on the mask on which the optical beam is irradiated, and the movable prism is arranged at an incident side of the optical integrator in the illumination system, and the movable prism moves along the optical axis.

Further, optical beams generated from the plurality of areas arranged outside the first area are respectively linear polarization (S polarization) in which the polarization direction thereof being substantially coincident with a circumference direction on the predetermined plane.

Further, the optical member can preferably set different plural light amount distributions including a distribution which enhances the amount of light at the plurality of areas including the first area.

Next, the forth exposure apparatus according to the present invention, in an exposure apparatus an illumination system illuminates a mask with an optical beam; and a projection system which exposes a substrate with the optical beam from the mask, characterized by comprising optical members which set a light amount distribution of the optical beam on a predetermined plane with respect to the illumination system such that an amount of light is set larger in three areas separated from each other than in an area other than the three areas.

According to the present invention, with using the optical member, it is able to transfer the one direction dense pattern to the two directions of the isolated and periodical ones with high resolution.

In this case, the three areas having large amount of light preferably include a first area near an optical axis of the illumination optical system, and a second area and a third area which are arranged along a straight line passing through the optical axis so as to sandwich the first area. Alternatively, the three areas having large amount of light may include a first area near an optical axis of the illumination optical system, and a second area and a third area which are arranged with the approximately same distance from the optical axis.

In these compositions, if a first axis direction in which a high density pattern formed on the mask is periodically arranged and a second axis direction in which the high density pattern is arranged substantially isolatedly, the second axis direction being orthogonal to the first axis direction, the three areas having large amount of light are arranged with a distance therebetween in a parallel direction to the first axis direction. Whereby, it is able to transfer the one direction dense pattern with high resolution along the first axis and the second axis respectively. Further, the three areas having large amount of light are arranged along a straight line which passes through the optical axis of the illumination system and which is parallel to the first axis.

Further, a center area of the three areas having large amount of light is set such that an amount of light of a center part thereof is smaller than an amount of light of a part other than the center part. Whereby, it is able to increase the resolution in the direction of which the pattern is isolated and to widen the depth of focus.

In this case, the center area is substantially an annular zone area as an example. Furthermore, the center area comprises a plurality of areas separated from each other as another example. The plurality of areas separated from each other, which are the center area, are arranged along a predetermined straight line passing through the optical axis of the illumination optical system on the predetermined plane as an example. Furthermore, an arranging direction of the plurality of areas separated from each other, which are the center area, is determined according to a size of the center area as another example.

Further, the sizes of the three areas having large amount of light respectively correspond to 0.1 times to 0.2 times of a maximum σ value of the illumination system. Whereby, the deep depth of focus is obtained according to the present invention.

Further, in the present invention, two areas of the three areas having large amount of light, which are arranged at both ends with respect to the direction parallel to the first axis, respectively have longitudinal directions which are substantially coincident with a direction parallel to the second axis.

Further, a center area of the three areas having large amount of light has a longitudinal direction which is substantially coincident with the direction parallel to the first axis.

Further, an optical beam generated from a center area of the three areas having large amount of light is linear polarization, a directions of polarization is substantially coincident with a direction parallel to the first axis.

Further, an optical beam generated from a center area of the three areas having large amount of light and optical beams generated from the other two areas may have different polarization states from each other. In this case, as an example, a polarization direction of the optical beam generated from the center area and a polarization direction of the optical beams generated from the other two areas are orthogonal to each other.

Further, a size of the center area of the three areas having great amount of light and sizes of the other two areas may be different from each other.

Further, optical beams generated from the other two areas except for the center area of the three areas having large amount of light are respectively linear polarization. In this case, as an example, directions of polarization of optical beams distributed in the other two areas on the predetermined plane are respectively substantially coincident with a circumference direction (S polarization).

Further, as an example, the optical member includes a deflection member which generates optical beams respectively distributed at different areas on the predetermined plane, and the exposure apparatus further comprises a polarization setting member which sets polarization states of the optical beams generated from the deflection member in the illumination system. In this case, further, the optical member includes a movable member which is arranged at an exit side of the deflection member, and which can change a positional relation between the other two areas except for the center area of the three areas having large amount of light and the optical axis of the illumination system, and the polarization setting member is arranged between the deflection member and the movable member.

Further, the movable member includes at least one movable prism which has an inclined plane through which an optical beam distributed in a predetermined area including the other two areas except for the center area on the predetermined plane passes, and the at least one movable prism moves along the optical axis of the illumination system.

Further, the optical member may include at least one movable prism which can change positions of the other two areas except for the center area of the three areas having large amount of light. In this case, the movable prism, as an example, has an inclined plane through which an optical beam distributed in a predetermined area including the other two areas except for the center area on the predetermined plane passes, and the movable prism moves along the optical axis of the illumination system.

Further, the movable prism, as another example, may have a flat plane through which an optical beam distributed in the center area on the predetermined plane passes and which is approximately orthogonal to the optical axis of the illumination system. Further, as an example, the illumination system includes an optical integrator which substantially uniformize illuminance within an illuminant area on the mask on which the optical beam is irradiated, and the movable prism is arranged at an incident side of the optical integrator in the illumination system.

Further, a predetermined plane is, as an example, a pupil plane of the illumination system. In this case, the illumination system, as an example, includes an optical integrator which substantially uniformize illuminance within an illuminant area on the mask on which the optical beam is irradiated, and the optical members include a diffractive optical element which is arranged at an incident plane side of the optical integrator in the illumination system. With this constitution, it is able to obtain a high efficiency.

Further, as another constitution of a predetermined plane being the pupil plane, the illumination system includes an optical integrator which substantially uniformize illuminance within an illuminant area on the mask on which the optical beam is irradiated, and the optical member is arranged on the predetermined plane or a conjugate plane thereof, and the optical member includes an aperture stop defining the three areas. With this constitution, it is easily able to make the distribution of the amount of light at a predetermined plane desirable distribution.

Further, the optical members can preferably set different plural light amount distributions including a light amount distribution which enhances the amount of light in the three areas. Whereby, it is able to transfer various kinds of patterns with high resolution.

Next, method for fabricating device according to the present invention is method for fabricating device including lithography process in which patterns are transferred to the photosensitive material by using the exposure method or apparatus according to the present invention. With the exposure method or apparatus according to the present invention, the mass production of devices including various kinds of patterns or one direction pattern with high accuracy.

Effects of the Present Invention

In the present invention, when setting the distribution of a predetermined plane relating to the illumination system so as to increase the amount of light at a predetermined nine or five areas, it is able to simultaneously transfer patterns having various kinds of pitches with high resolution respectively.

Further, by making the center first area annular, it is able to more improve the resolution and depth of focus. Furthermore, by controlling the state of polarization of the optical beam, it might be able to more improve the resolution and the like.

Furthermore, in the present invention, when setting the distribution of a predetermined plane relating to the illumination system so as to increase the amount of light at a predetermined three areas, it is able to transfer one direction patterns with high resolution.

Furthermore, if the pattern formed at the mask is periodically arranged along a predetermined first axis and includes the one direction dense pattern which is substantially isolated in the direction of the second axis orthogonal to the first axis, by arranging the three areas in which the amount of light is great with distance in the parallel direction to the first axis, it is able to transfer the one direction dense pattern with high resolution both directions of arranging the one direction dense pattern to periodical and isolatable ones. Further, in the present invention, with setting the state of polarization of the optical beam oriented from the three areas in which the amount of light is great, it might be to improve the resolution and the like for a predetermined pattern.

BRIEF DESCRIPTION OF THE FIGURES IN THE DRAWINGS

Figure 1A:
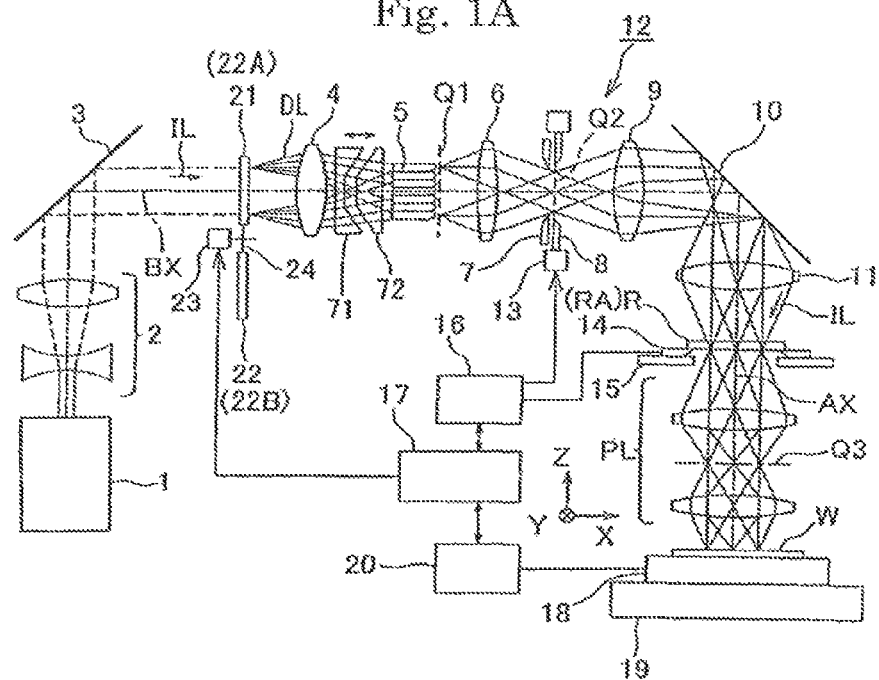
FIGS. 1A, 1D and 1E show different compositions of a projection exposure apparatus of the first embodiment according to the present invention.
Figure 7A:
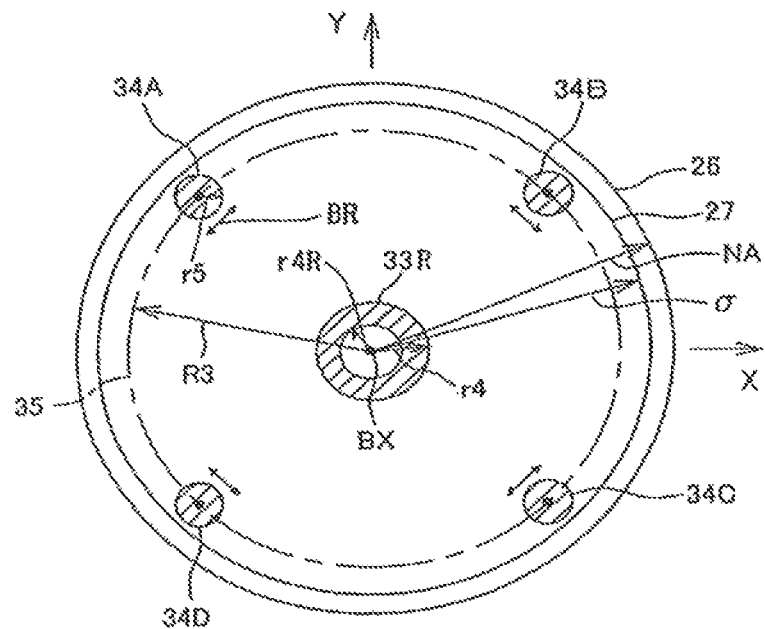
FIG. 7A shows a distribution of amount of light in which the amount of light becomes large in five areas including the center of the annulus to be set by the diffractive optical element 22 on the exit plane (pupil plane) of the fly' eye lens 5.
Figure 12:
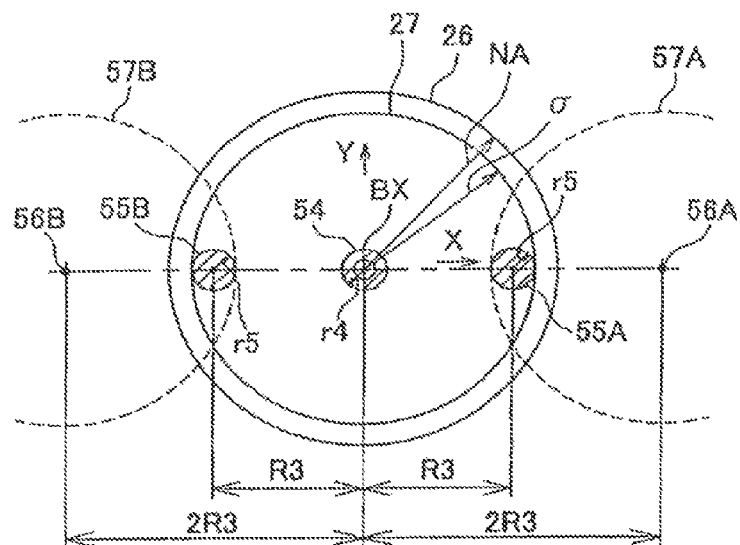
FIG. 12 shows a distribution of amount of light, which is set by the diffractive optical element 22A of FIG. 1A on the exit plane (pupil plane) of the fly' eye lens 5 in the second embodiment of the present invention.
Figure 16A:
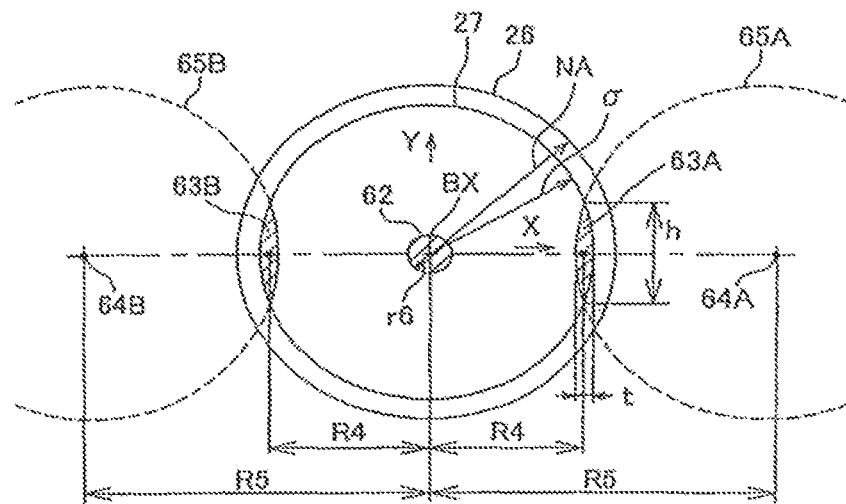
Figure 16B:
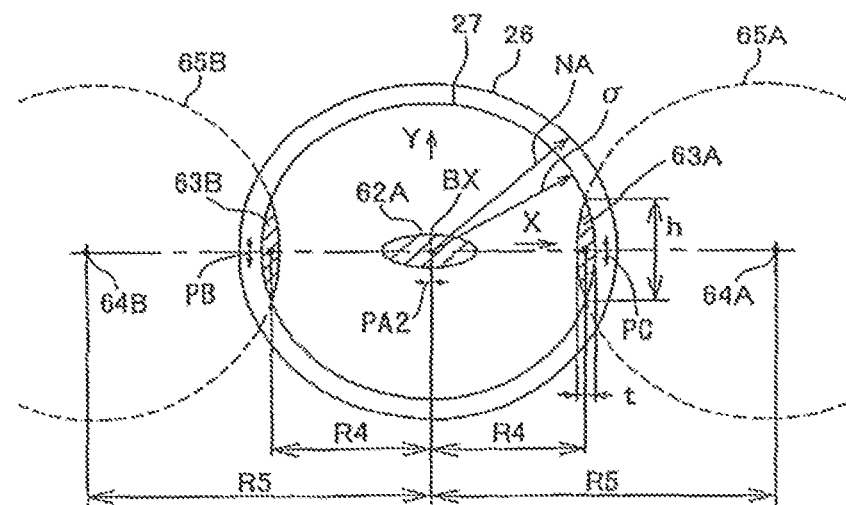
Figure 16C:
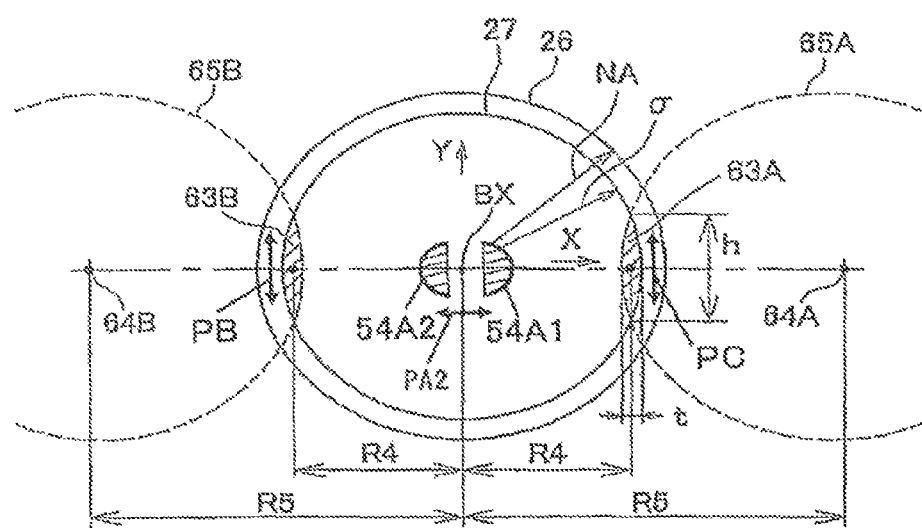
Figure 17:
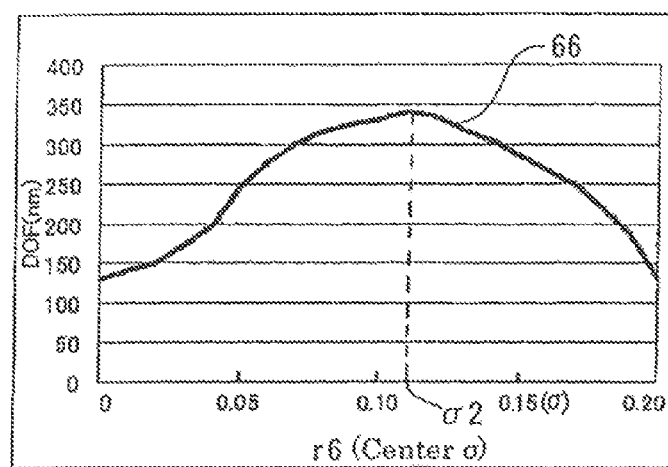
Figure 18:
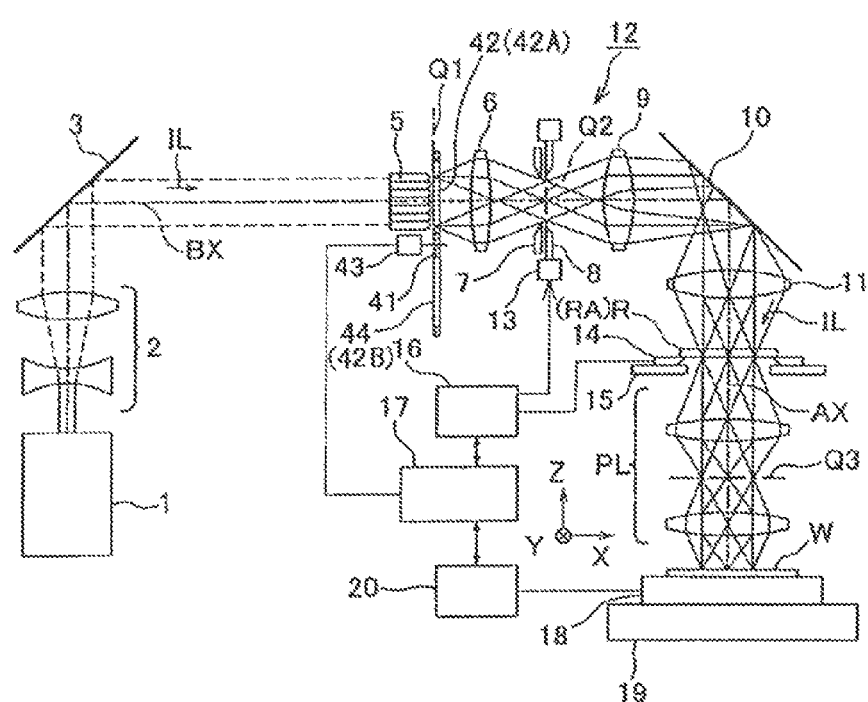
Figure 19:
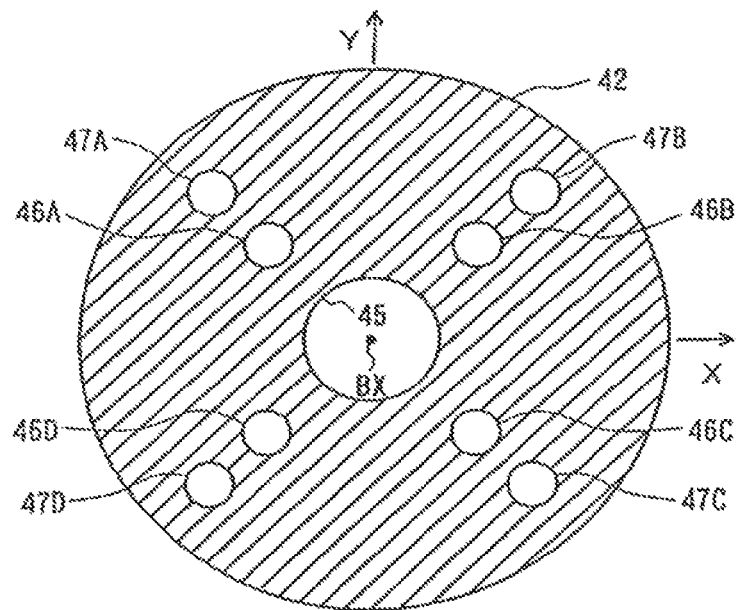
Figure 20:
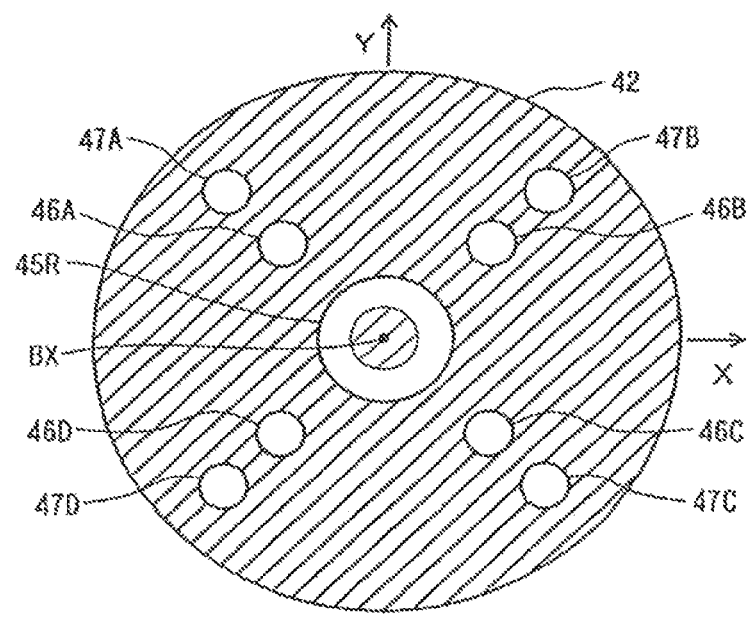
Figure 21:
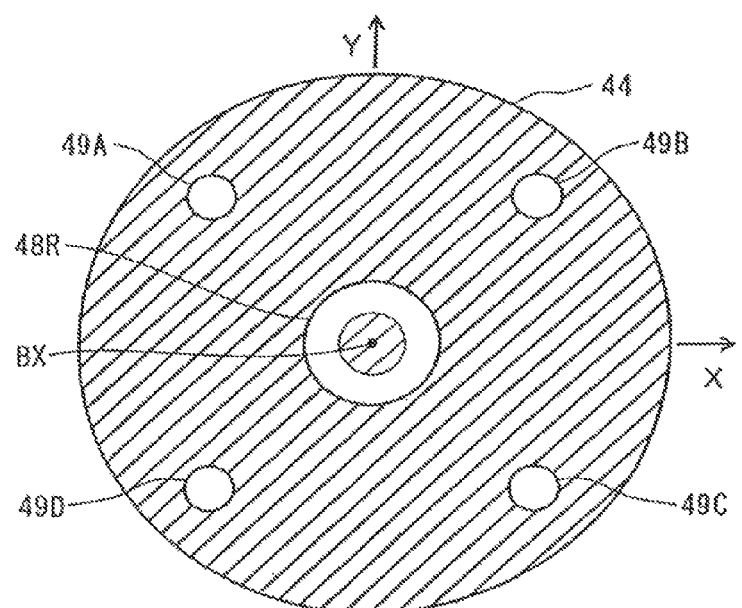
Figure 23:
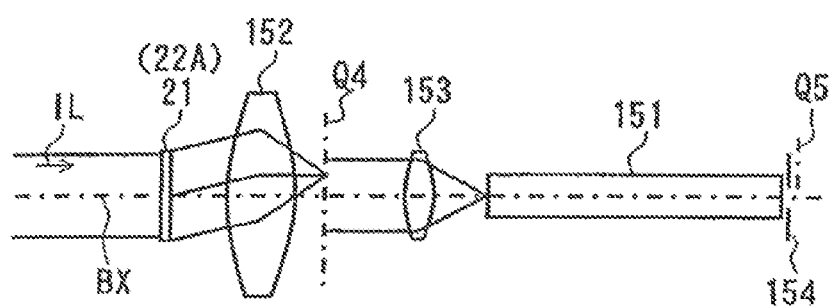
Figure 24:
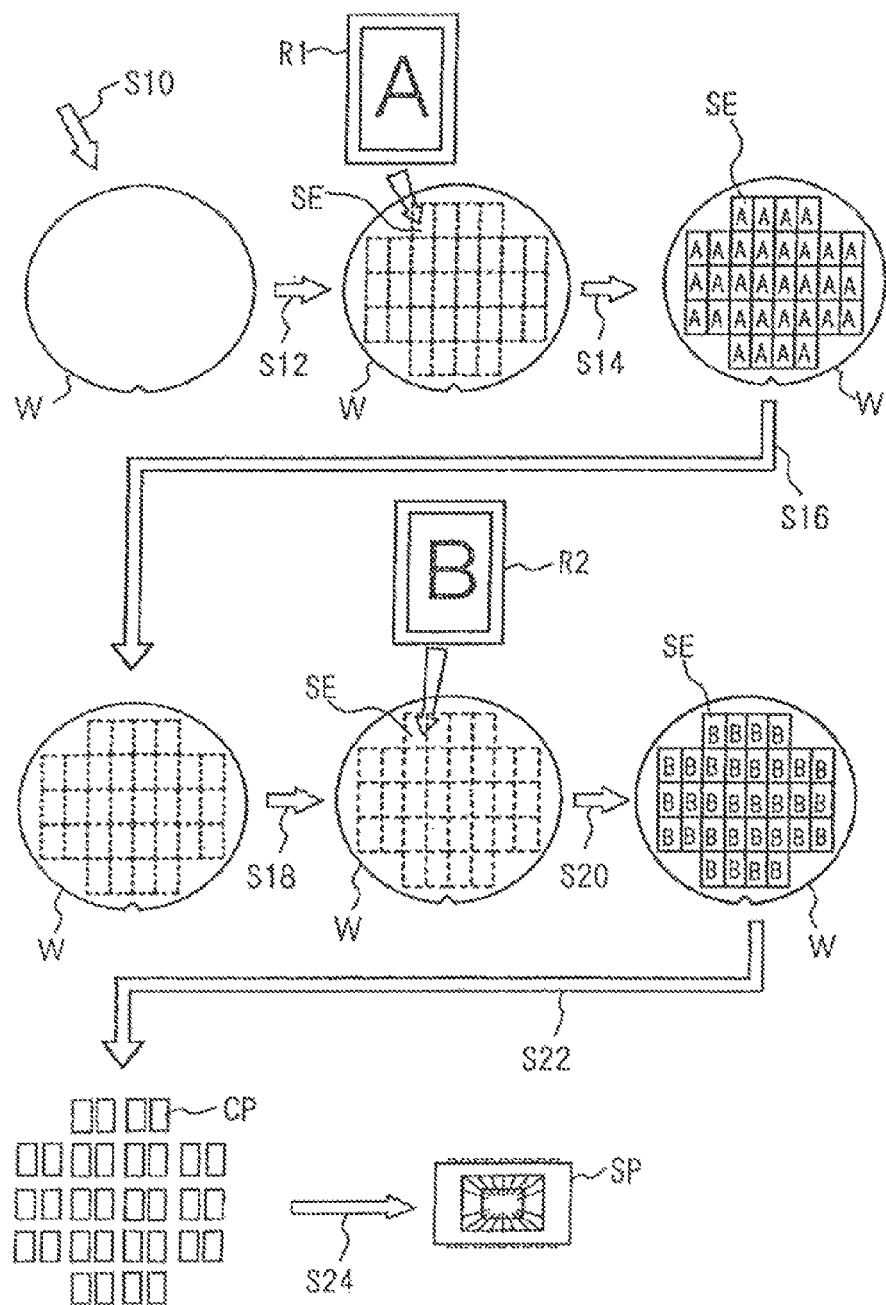

FIG. 15A, FIG. 15B, FIG. 15C and FIG. 15D, respectively show a modified example for the distribution of amount of light FIG. 12;

FIG. 16A shows the distribution of amount of light to be set by the diffractive optical element 22B of FIG. 1A on the exit plane (pupil plane) of the fly' eye lens 5, and FIGS. 16B and 16C show a modified example of the distribution of amount of light of FIG. 16A;

FIG. 17 shows an evaluating result of depth of focus (DOF) through simulation of the transferred image when exposure is made with the distribution of amount of light of FIG. 16A;

FIG. 18 shows a composition of a projection exposure apparatus of the third embodiment according to the present invention;

FIG. 19 shows a pattern of the aperture stop 42 of FIG. 18;

FIG. 20 shows a pattern of the aperture stop corresponding to the distribution of amount of light of FIG. 6;

FIG. 21 shows a pattern of the aperture stop corresponding to the distribution of amount of light of FIG. 7A;

FIG. 22A and FIG. 22B respectively show a pattern of the aperture stop 42A and 42B of FIG. 18;

FIG. 23 shows a main part of the illumination system of the fifth embodiment according to the present invention; and FIG. 24 shows an example of the process for fabricating the semiconductor device using the projection exposure apparatus of the embodiment according to the present invention.

BEST MODE FOR CARRYING OUT OF THE INVENTION

The First Embodiment

A preferably first embodiment will be described accompanying FIGS. 1 to 9, as follows:

This embodiment applies the present invention when doing exposure with the projection exposure apparatus using an illumination system which has a fly' eye lens as an optical integrator (uniformizer or homogenizer).

FIG. 1A shows a composition of the projection exposure apparatus of this embodiment, in FIG. 1A, a KrF excimer laser light source (wave-length 248 nm) is used as an exposure light source 1. In addition, the laser light sources such as an ArF excimer laser light source (wave-length 193 nm), a $F_2$ laser light source (wave-length 157 nm), a $Fr_2$ laser light source (wave-length 146 nm), or an $Ar_2$ laser light source (wave-length 126 nm); or high frequency generating apparatus such as a high frequency generating light source of a YAGI laser or a solid laser (for example semiconductor laser etc.) can be used as an exposure light source 1.

An illumination light IL comprised of ultraviolet pulse light as an optical beam for exposure (exposure beam) emitted from exposure light source 1 goes into the first diffractive optical element 21 through an optical path folding mirror 3, after changing the cross-sectional shape of the optical beam into the desirable shape with beam expander 2, and is changed into the optical beam DL which diffracts in plural directions in order to obtain a predetermined distribution amount of light at a predetermined plane (for example pupil plane of the illumination system) as described after. The diffractive optical element 21 as a part of the optical member for setting distribution amount of light is mounted to a revolver 24, the second diffractive optical element 22 having other diffractive characteristic, and a further diffractive optical element (not shown) having another diffractive characteristic are also mounted. In this embodiment, a main control system 17 which controls all operations of the apparatus controls the revolving angle of the revolver 24 through a driver 23, by setting one of the diffractive optical element 21 and 22 etc. on the optical path of the illumination light IL, to change the condition of illumination.

In FIG. 1A, the optical beam DL diffracted by the diffractive optical element 21 is gathered by a relay lens 4 onto an incident plane of the fly' eye lens 5 as an optical integrator, through a first prism 71 and a second prism 72 (movable prism). In this case, the diffractive optical element 21 is arranged slightly deviated from a front focus position of the relay lens 4 toward the exposure light source 1, and the incident plane of fly' eye lens 5 is approximately arranged at the back focus position of the relay lens 4. Furthermore, a plurality of optical beams diffracted to the different directions are respectively gathered at the different areas on the incident plane of the fly' eye lens 5, to form a plane light source (2 dimensional light source comprised of many light source images in this embodiment) of distribution approximately corresponding to the amount of light of the incident plane. With a combined lens system comprised of the relay lens 4 and fly' eye lens 5, the exit plane of the diffractive optical element 21 and the exit plane Q1 of the fly' eye lens 5 are caused to be approximately conjugate (imaging relation).

Figure 1B:
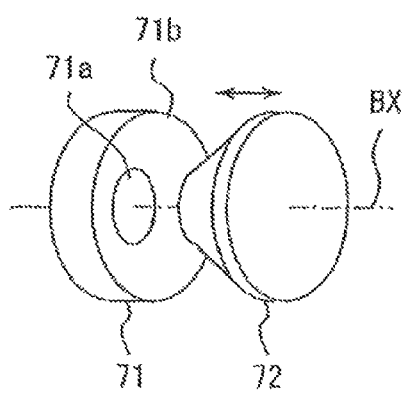
FIG. 1B shows an enlarged perspective view of prism 71, 72 of FIG. 1A.

In this embodiment, the diffractive optical element 21, the first prism 71, and the second prism 72 are corresponding to an optical member for setting a predetermined distribution of amount of light. As shown in FIG. 1B, the first prism 71 is a member which forms a parallel flat plate 71 at circular area of which the center is an optical axis BX (discuss later) of a illumination system, and forms a concave cone 71b around the circular area; the second prism 72 is a member which forms inverted concave and convex for the first prism 71, and forms a parallel flat plate as a whole by combining with the first prism 71. In addition, a optical beam passing the circular area of the center of the first prism 71 and the second prism 72 (that is the optical beam traveling in a straight line along the optical axis BX within the first prism 71 and the second prism 72) distributes to areas which are a center of a distribution of amount of light on the exit plane Q1 on the fly' eye lens 5 in which amount of light is enhanced; a optical beam passing the cone part (slope plane) around the first prism 71 and the second prism 72 distributes to a plurality of areas (or a predetermined area including the plurality of areas) in which amount of light is enhanced around the distribution of amount of light.

Further, at least one of the first prism 71 and the second prism 72, for example in this embodiment, the second prism 72 is only supported movably by a driving mechanism (not shown), thus by changing the distance between the first prism 71 and the second prism 72 by moving the second prism 72 along the optical axis BX, the position of a plurality of peripheral areas in which the amount of light is great can adjust to the radial direction, without changing the central distribution (position of areas 28, 33 etc. described below) of the distribution of amount of light at the exit plane Q1 on the fly' eye lens 5.

Figure 10:
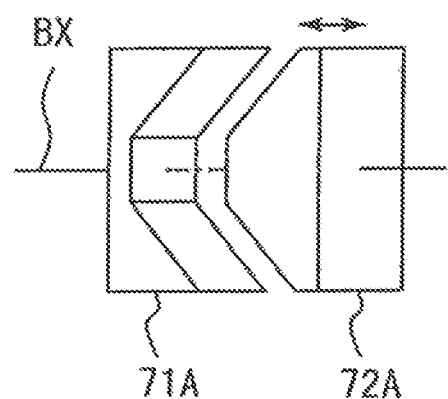
FIG. 10 shows a modified example of perspective view of the prisms 71 and 72 of FIG. 1A.

In addition, a prism having not a cone but a pyramid may be used instead of the first prism 71 and the second prism 72. Furthermore, it is allow moving this position along the optical axis BX by only using the first prism 71 instead of the first prism 71 and the second prism 72. Further, as shown in FIG. 10, it is allow using a pair of prisms 71A, 71B shaped like a letter V which has diffractive power to one direction and has not diffractive power to orthogonal direction, as the movable prism. In addition, the prisms 71A, 71B are arranged so that each rectangle area (in this embodiment, the parallel flat plate) of its center is approximately orthogonal to the optical axis BX and two slope planes of the around area are approximately symmetric with respect to a plane being orthogonal to the paper of FIG. 1C including the optical axis BX.

Figure 1C:
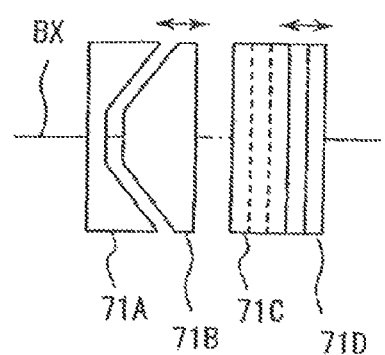
FIG. 1C shows other example composition of prism 71, 72.
Figure 3:
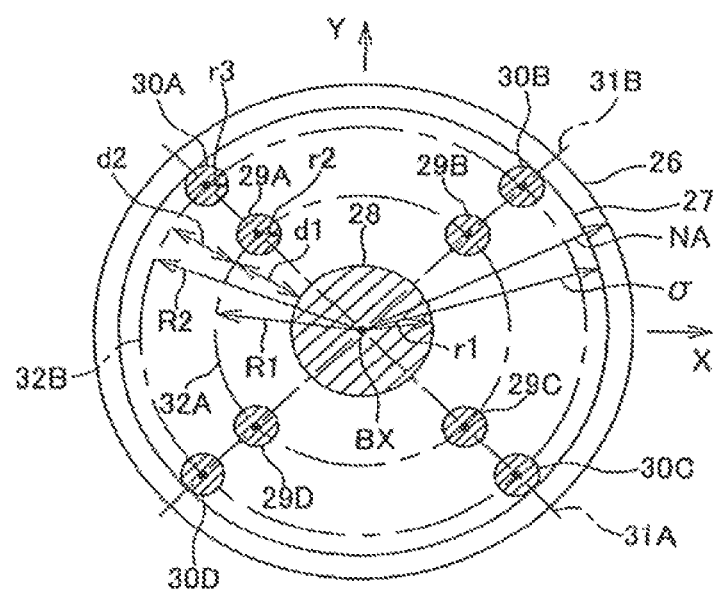
FIG. 3 shows the distribution of amount of light to be set by diffractive optical element 21 on the exit plane (pupil plane) of the fly' eye lens 5, which includes the amount of light in nine areas.

With this composition, by changing the distance between the prisms 71A, 71B, positions (distance from the optical axis BX) of a peripheral area, in which amount of light is great, concerning the above and below direction of the paper in FIG. 1C (e.g., corresponding to a Y direction in FIG. 3 showing a distribution of amount of light of an illumination light at a pupil plane of an illumination system 12) changes. Therefore, in order to adjust positions (distance from the optical axis BX) of a peripheral area, in which amount of light is great, concerning the orthogonal direction to that position (the orthogonal direction to the paper in FIG. 1C, corresponding to an X direction in FIG. 3), another pair of prisms 71C, 71D constructed by revolving the pair of prisms 71A, 71B by 90 degrees about the optical axis BX may be arranged. This structure is able to independently adjust each position (distance from the optical axis BX) orthogonal to each other in which amount of light is great.

In addition, however the prism described above whose slope plane is the cone, pyramid, or shaped like a letter V the center flat plate is the parallel flat plate, it may be aperture part (hollow part) by cutting at least one part of the center part, or may be an integral solid by making a plurality of members independently. In particular, the latter may be an integral solid by only dividing the peripheral slope plate except the center flat plate part into a plurality of parts.

In FIG. 1A, however if it is not necessary to change the position of peripheral area in which the amount of light is great to the radial direction, the first prism 71 and the second prism 72 can be omitted.

In addition, the fly' eye lens 5 is, as an example, a bundle of many lens elements each of which has a rectangular cross-section whose vertical and horizontal width is about a few of millimeter, the shape cross-section of each lens element is approximately similar to a slim piece of illumination area on a reticle. However, a micro fly' eye lens constructed by binding many micro lenses whose shape cross-section is rectangular with about a few tens of micrometer or circular with diameter of about a few tens of micrometer can be used.

The illumination light IL comprises optical beam emitted from the fly' eye lens 5 is onetime gathered on the plane Q2 by a condenser lens system 6. A fixed field stop (fixed blind) 7 for limiting an illumination area on a reticle R as an illuminated target to a slim shape orthogonal to scan direction, i.e., not-scan direction is arranged at slight front side of the plane Q2, a movable field stop (movable blind) 8 on the plane Q2. The movable field stop is used to prevent from useless exposure by controlling the width of the scan direction of the illumination area at the front and back of the scan exposure, and to limit the width of the not-scan direction of the illumination area during the scan exposure. As an example, a reticle stage driving system 16 described below controls open/close operation of the movable field stop 8 through a driving section 13 in sync with operation of the reticle stage.

The illumination light IL passing through the field stop 7 and 8, via an imaging-lens system 9, optical path folding mirror 10, and main condenser lens system 11, illuminates a slim illumination area on a circuit pattern area of a pattern plane (it will be called "reticle plane" hereinafter) of the reticle R as a mask with even intensity distribution. An illumination system 12 is composed of the exposure light source 1, a beam expander 2, the mirror 3, the diffractive optical element 21 (or other diffractive optical element), the relay lens 4, fly' eye lens 5, the condenser lens system 6, field stop 7, 8, the imaging-lens system 9, the mirror 10, and the main condenser lens system 11. An optical axis of the illumination system 12 is regarded as the optical axis BX. In this case, the exit plane Q1 of the fly' eye lens 5 is substantially coincident to an optical Fourier transform plane for the pupil plane of the illumination system 12, i.e., reticle: the plane Q2 in which the movable field stop 8 is arranged is a conjugate plane with the reticle plane. In addition, the fixed field stop 7, for example, may be arranged near the reticle plane.

Under the illumination light IL, the imaging-circuit patterns within illumination area of the reticle R, via a projection optical system PL of both side telecentric as a projection system, transfers a resist layer of one shot area among a plurality of shot areas on a wafer W as a substrate arranged on an image-forming plane of the projection optical system PL with a predetermined downsizing magnification β (for example, β is ¼, ⅕ etc.). In addition, the reticle R and wafer W are respectively regarded as a first object and second object. Furthermore, the wafer W as substrate for exposure is a circular substrate such as semiconductor (silicon etc.) or SOI (silicon on insulator) whose diameter is 200 or 300 mm, for example.

An optical axis AX of the projection optical system PL is coincident to an optical axis BX of the illumination system on the reticle R. Furthermore, a pupil plane Q3 (optical Fourier transform plane for the reticle plane) on the projection optical system PL is conjugate with the exit plane Q1 (the pupil plane of the illumination system 12) of the fly' eye lens 5. As the projection optical system PL of this embodiment, other one except the diffractive system can be used, for example, a catadioptric projection optical system having a plurality of optical systems having optical cross-axes each other as disclosed in Japanese Patent Application: TOKU-KAI 2000-47114 (corresponding to U.S. Pat. No. 6,496,306) or, for example, a catadioptric projection optical system and the like which has an optical system including an optical axis intends from a reticle to a wafer and a catadioptric optical system including an optical axis being approximately orthogonal to that optical axis, and which forms an intermediate image twice in its interior as disclosed in international publication (WO): 01/065296 brochure (corresponding to US publication 2003/0011755A1). It will be described the projection optical system PL, with considering that a Z axis is paralleled to the optical axis AX, a X axis is not-scan direction (the direction parallel to the paper in FIG. 1A, in this case) orthogonal to the scan direction, and a Y axis is the scan direction (the direction orthogonal to the paper in FIG. 1A, in this case), as follows:

First, the reticle R is adsorbed and held on the reticle stage 14; the reticle stage 14 is mounted so as to move with a constant velocity along the Y direction on a reticle base 15, and to slightly move along rotating directions about the X, Y, and Z axis. The position of the reticle stage 14 is measured by a laser interferometer in a reticle driving system 16. The reticle driving system 16 controls the position and velocity of the reticle stage through driving mechanism not shown, based on the measured information and control information from a main control system 17.

On the other hand, the wafer W is adsorbed and held on a wafer stage 18 through wafer holder not shown; the wafer stage 18 is movably mounted in the X and Y directions on a wafer base 19. The position of the wafer stage 18 is measured by a laser interferometer in a wafer driving system 20. The wafer driving system 20 controls the position and velocity of the wafer stage 18 through driving mechanism not shown, based on the measured information and control information from the main control system 17. Furthermore, a focusing mechanism for fitting the surface of the wafer into the image-forming plane of the projection optical system PL is assembled in the wafer stage 18 during the scan exposure, based on measured information of an auto-focus sensor not shown.

During scan exposure, under controlling of the main control system 17, the reticle driving system 16, and the wafer driving system 20, operation of scanning one shot area on the wafer W to a corresponding direction (+Y or −Y direction) for the slim exposure area (the illumination area of the illumination light IL being conjugated with the illumination area concerning projection optical system PL) with velocity β*VR (β is projection magnification) through the wafer stage 18, and operation of step-moving the wafer W to the X, Y directions through the wafer stage 18 are repeated, in sync with scanning the reticle R to the Y direction for the illumination area illuminated illumination light with velocity VR through reticle stage 14.

Next, an illumination system and an illumination method will be described in detail.

Figure 2:
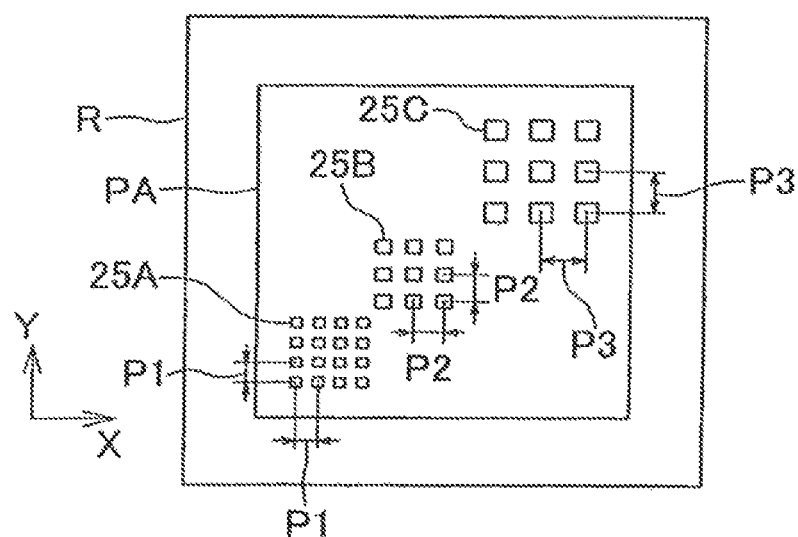
FIG. 2 is a plan view showing an example pattern of reticle R.

FIG. 2 shows an example of a pattern (original pattern) for transferring formed on a reticle R; in FIG. 2, a 2-dimensional pattern with three kinds of contact holes arranging pattern 25A, 25B, and 25C of approximate squares with pitch P1, P2, and P3 at the X, Y directions in a pattern region PA of the reticle R. Each pattern 25A, 25B, and 25C may be a transmission pattern formed in a light shielded film, or may conversely be a light shielded pattern formed in a transmission part. Furthermore, the width of each pattern 25A, 25B, and 25C is around equal to ½ or smaller than corresponding pitch P1, P2, and P3 respectively, however, the width of pattern 25B, 25C with larger pitch can be around equal to pattern 25A with most fine pitch. In this case, the pitch P1, P2, and P3 are set to gradually become several-fold, as follows:

$$P1<P2<P3 \quad (4)$$

If the projection magnification β of the projection optical system PL in FIG. 1A is ¼-fold, pitch P1, P2, and P3 on the reticle plane are respectively set, as an example, around 300 nm, 600 nm, and 900 nm. That is, the original patterns on the reticle plane include a first pattern for dense contact holes with fine pitch, a second pattern for dense contact holes with around middle pitch, and a third pattern for contact holes arranged with large pitch substantially regarding as the isolated contact holes. In order to transfer an image of these original patterns on wafer onetime with high accuracy, as shown FIG. 1A in this embodiment, with arranging the diffractive optical element 21 on the optical path of an illumination light IL, the distribution of amount of light (strength distribution) of the illumination light IL at the exit plane Q1 (pupil plane) of the fly' eye lens 5 as a predetermined plane.

FIG. 3 shows the distribution of amount of light of the illumination light IL at the exit plane Q1 (pupil plane of the illumination system) of the fly' eye lens 5. In this FIG. 3, the direction on the exit plane Q1 corresponding to the X direction and Y direction (i.e., the arranging direction of the pattern to transfer) on the reticle R is respectively defined the X direction and Y direction. Here, if the numerical aperture of the object side (reticle side) of the projection optical system PL in FIG. 1A is NA, the numerical aperture of the image side (wafer side) is $NA_{PL}$, a relation is obtained with using the projection magnification β, as follows:

$$NA=\beta \cdot NA_{PL} \quad (5)$$

Further, it is defined that the maximum value among the numerical apertures of the illumination light IL incident to the reticle R from the illumination system 12 is $NA_{IL}$, the value of ratio (coherence factor) of the maximum numerical aperture $NA_{IL}$ to the numerical aperture NA of the projection optical system PL is called maximum σ value in this embodiment, and maximum σ value is σ. That is, the illumination light of maximum σ value is the light incident on the reticle R with the maximum angle among the illumination light IL. The maximum σ value (σ) can be expressed, as follows:

$$\sigma=NA_{IL}/NA=NA_{IL}/(\beta \cdot NA_{PL}) \quad (6)$$

In a pupil plane of an illumination system shown in FIG. 3, a maximum outer circle 26 indicates an outer area passed through virtual optical beam having the same numerical aperture as the numerical aperture NA at the incident side of the projection optical system PL, an inner circle 27 indicates a circle is tangent to areas passed through illumination light having numerical aperture of the maximum σ value (σ); all illumination light pass though within the circle 27. The illumination light IL of this embodiment, in FIG. 3, approximately has a constant amount of light at nine areas with distance each other which include a circular area 28 with radius r1 centered an optical axis BX of the illumination system 12, four circular areas 29A, 29B, 29C, and 29D with radius r2 whose centers are arranged along a first circle 32A with radius R1 enclosing the area 28, and four circular areas 30A, 30B, 30C, and 30D with radius r3 whose centers are arranged along a second circle 32B with radius R2 enclosing the areas 29A to 29D, and has distribution of amount of light of lower amount of light (approximate 0 in this embodiment) at other areas than the constant amount of light. In addition, the amount of light, near the outline of the area 28, areas 29A to 29D, and areas 30A to 30D, may have distributions which gradually decrease toward the outside. The center area 28 corresponds to a first area; the four areas 29A to 29D enclosing the area 28 correspond to second areas; further the four areas 30A to 30D enclosing the areas 29A to 29D correspond to third areas. Hereinafter, the radii r1 to r3 and R1, R2 respectively indicates the length (distance between point passed through the optical beam of the maximum σ value and the optical axis BX) corresponding the maximum σ value (σ) as unit.

First, the center area 28 is set larger than other eight areas 29A to 29D and 30A to 30D (r1>r2>r3). Further, since the arranging directions of the 2-dimensional patterns as the targets to transfer are the X direction and Y direction, it is defined that a straight line crossed to the X direction by 45 degrees in clock winding is a straight line 31A; a straight line (the straight line crossed to the X direction by 45 degrees in counter clock winding) is a straight line 31B. Furthermore, the center of the center area 28, the middle two areas 29A and 29C, and other most outer two areas 30A and 30C is arranged on the first straight line 31A; the center of the center area 28, the middle other two areas 29B and 29D, and other most outer two areas 30B and 30D is arranged on the second straight line 31B. That is, the eight areas 29A to 29D and 30A to 30D enclosing the center area 28 are arranged along the two directions being orthogonal with revolving the two arranging directions by 45 degrees, which are orthogonal, in which patterns as the targets for transfer.

Further, as an example, the radius r1 of the area 28, the radii r2 of the areas 29A to 29D, and the radii r3 of the areas 30A to 30D are set 0.3-fold, 0.1-fold, and 0.1-fold of the maximum σ value (σ) (the radius of circle 27, after being similar to this), as follows:

$$r1 = 0.3\sigma \quad (7)$$

$$r2 = r3 = 0.1\sigma \quad (8)$$

Further, the radius R1 of the first circle 32A and the radius R2 of the second circle 32B are set 0.55-fold and 0.9-fold of the maximum σ value (σ), as follows:

$$R1 = 0.55\sigma \quad (9)$$

$$R2 = 0.9\sigma \quad (10)$$

In this case, the radial distance d1 between the outer of the area 28 and the first circle 32A, and the radial distance d2 between the first circle 32A and the second circle 32B are as follows:

$$d1 = 0.25\sigma, \; d2 = 0.35\sigma \quad (11)$$

In this case, the diffractive characteristic of the diffractive optical element 21 in FIG. 1A is set, so as to obtain the distribution of amount of light in which the amount of light approximately becomes constant at the area 28, the areas 29A to 29D, and the areas 30A to 30D in FIG. 3 satisfying the condition of the equations (7) to (10): approximately becomes 0 at other areas. For the reason, the diffractive optical element 21, as an example, can fabricate by forming a concave and convex grating having approximately systematically along in the direction of the straight line 31A, and a concave and convex grating having approximately systematically along in the direction of the straight line 31B of FIG. 3. Alternatively, the diffractive optical element 21 may be a combination of a plurality of phase type diffractive gratings. In these cases, since the diffractive optical element 21 is phase type, it is advantage of high efficiency for using light. In addition, it is able to use an optical element changing refractive index distribution corresponding to a diffractive grating distribution as an optical element 21. In addition, a construction and a method for fabricating having a specific diffractive characteristic is closely disclosed, for example, in Japanese Patent Application: TOKUKAI 2001-176766 (corresponding to U.S. Pat. No. 6,563,576) by this applicant.

In addition, with setting the distribution of amount of light obtained by the diffractive optical element 21 to around constant amount of light at the areas including the area 28, the areas 29A to 29D, and the areas 30A to 30D in FIG. 3, the aperture stop, whose aperture is formed at the part corresponding to the area 28, the areas 29A to 29D, and the areas 30A to 30D in FIG. 3, may be arranged at the exit plane Q1 (pupil plane) of the fly' eye lens 5 or its conjugate plane. Also in this case, it is advantage of high efficiency for using the illumination light IL.

For this embodiment, this inventor have evaluated the CD (critical dimension), through the simulation of the computer, which is obtained by transferring a downsizing image of pattern of contact holes with various kinds of pith arranged on the reticle plane to the wafer through the projection optical system PL, under the distribution of amount of light in which the amount of light becomes constant at the nine areas comprising the area 28, the areas 29A to 29D, and the areas 30A to 30D in FIG. 3 satisfying the condition of the equations (7) to (10): becomes 0 at the other areas. The CD used is the line width of patterns transferred. In addition, as this simulation, the numerical aperture $NA_{PL}$ of the image side (wafer side) of the projection optical system PL in FIG. 1A is 0.82, projection magnification β is ¼-fold, and the maximum σ value (σ) is 0.9, as follows:

$$NA = 0.82, \; \beta = \text{¼}, \; \sigma = 0.9 \quad (12)$$

Figure 5:
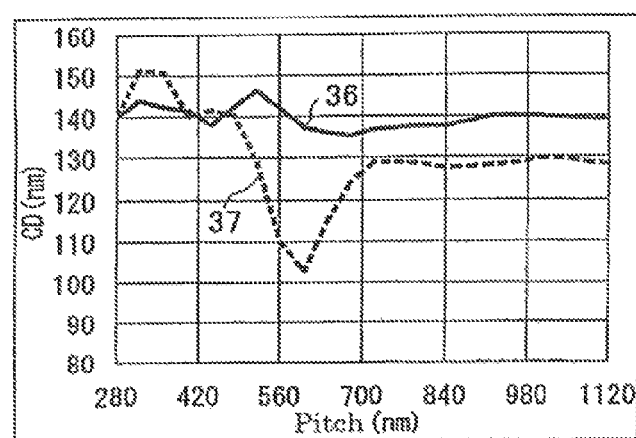
FIG. 5 shows an evaluating result through simulation of the transferred image when exposure is made with the distribution of amount of light of FIGS. 3 and 4.

The curve 36 in FIG. 5 shows the simulation result of the CD value in case that the amount of light becomes constant at the nine areas on the pupil plane, the horizontal axis is the pitch (nm) of the pattern transferred on the reticle plane, vertical axis is the CD value (nm) in FIG. 5. The pitch 280 to 1120 nm is equivalent of 70 to 280 nm at the wafer side. As shown in the curve 36, with using the distribution of amount of light in this embodiment, the preferable CD value having approximately constant across the wide range of pitch 280 to 1120 nm.

Accordingly, with using the distribution of amount of light on the pupil plane in FIG. 3 in this embodiment, the patterns of the reticle R including three kinds of pitch in FIG. 2 can onetime transfer on the wafer with high accuracy.

In addition, the distribution of amount of light on the pupil plane in FIG. 3 is not satisfied the condition of the equations (7) to (10), the radius r1 of the area 28, the radii r2 of the areas 29A to 29D, and the radii r3 of the areas 30A to 30D may be the ranges, as follows:

$$0.2\sigma \leq r1 \leq 0.4\sigma \quad (13)$$

$$0.075\sigma \leq r2 \leq 0.2\sigma \quad (14)$$

$$0.075\sigma \leq r3 \leq 0.2\sigma \quad (15)$$

Further, the radius R1 of the first circle 32A and the radius R2 of the second circle 32B may be changed up to around ±10% of the equations (9) and (10). Furthermore, the numerical aperture $NA_{PL}$ of the image side, the projection magnification β, and the maximum σ value (σ) in the projection optical system PL can be taken any values though the values described above. For example, in order to control the maximum σ value (σ), by changing the distance between prism 71 and 72 in FIG. 1A, the radial position of the areas 29A to 29D, and the areas 30A to 30D with peripheral area in which the amount of light is great among the distribution of amount of light in FIG. 3 (the distance from the optical axis BX relating to the X direction and Y direction) may only be changed. Alternatively, as shown in FIG. 1C, by using two pairs of prism 71A, 71B and 71C, 71D, the position of the areas 29A to 29D, and the areas 30A to 30D with peripheral area in which the amount of light is great among the distribution of amount of light in FIG. 3 (the distance from the optical axis BX) in the X direction and Y direction may independently controlled.

In addition, about the distribution of amount of light in FIG. 3, the amount of light of the center area 28 (e.g., intensity per unit size) and that of the areas 29A to 29D, and the areas 30A to 30D may be different. Furthermore, the amount of light of the four areas 29A to 29D along the peripheral first circle 32A and that of the four areas 30A to 30D along the peripheral second circle 32B may be different. The relative amount of these lights may be adjusted so that the optimum resolution is obtained for each pattern, for example.

Figure 6A:
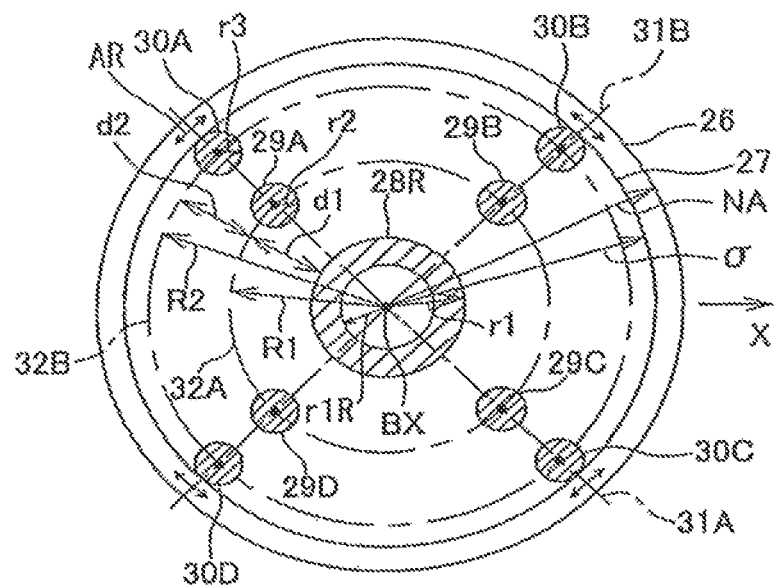
FIG. 6A shows a modified example of assuming the center of the area to be annular, in the distribution of amount of light of FIG. 3.
Figure 6B:
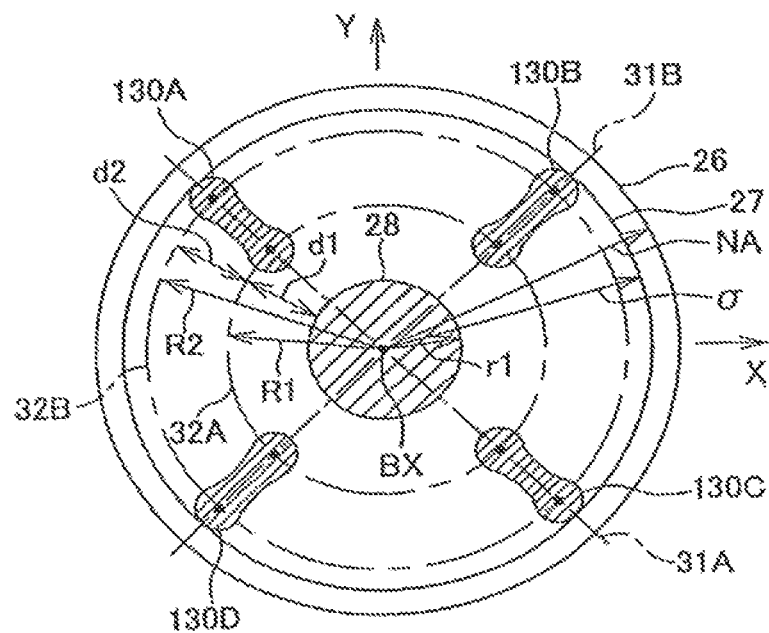
FIG. 6B shows another modified example of the amount of light of FIG. 3.

Further, instead of the distribution of amount of light in FIG. 3, as shown FIG. 6B, a distribution of amount of light becoming great amount of light of the five areas including four slim areas 130A, 130B, 130C, and 130D which are substantially connected to the radial each two areas 29A, 29B, 29C, 29D, 30A, 30B, 30C, and 30D of the radial in FIG. 3 respectively and the center area 28 may be used. Also in this case, it is almost able to transfer patterns having various kinds of pitch with high resolution. In addition, in FIG. 6B, the amount of light of the connecting parts of two areas in the radial may around equal to that of the two areas, or may be different from that of the two areas, for example smaller.

In addition, in order to more improve the resolution and depth of focus than using the amount of light of FIG. 3, an area of annular may be used instead of the center area 28 as the first area.

FIG. 6A shows a distribution of amount of light of the illumination light IL on the exit plane Q1 (pupil plane of the illumination system 12) of fly' eye lens 5 in FIG. 1A, when the first area is the area of annular. In FIG. 6A with marking the same notes to the parts corresponding to in FIG. 3, the amount of light of the area 28R of annular consist of the outer radius r1, the inner radius r1R, and the center of the optical axis BX and that of the nine areas including the area 28, the areas 29A to 29D, and the areas 30A to 30D are approximately constant; and amount of light of the illumination light at the other areas is approximately 0. Furthermore, the value of ratio of the outer radius r1 and inner radius r1R (=r1R/r1) of the annular zone area 28R is any value between 0 and 1, as an example, ⅓ annular (r1R/r1=⅓), ½ annular (r1R/r1=½), ⅔ annular (r1R/r1=⅔) etc. can be used. The condition other than it is the same as that of the case where the amount of light in FIG. 3 is used.

When the amount of light in FIG. 6A is used, the more stable distribution of CD value can be obtained than the simulation result of the CD value represented in the curve 36 of FIG. 5. Further, the more stable CD value can be obtained with wider depth of focus.

Further, in this embodiment, the light distributed at the peripheral areas 29A to 29D, and the areas 30A to 30D in FIG. 6A may be linear polarization. In this case, as an example, as shown with an arrow mark AR, the light distributed at the peripheral areas may be S polarization (vertical direction for the incident plane) whose polarization direction is the tangent direction. Whereby, the resolution etc. for the specific pattern might be enhanced. It is the similar to the case of using the distribution of amount of light in FIG. 3 or 6B.

In addition, if the light distributed at the peripheral eight or four areas with area in which the amount of light is great described above is non-polarization or whose polarization direction is not coincidental to the circumference direction, for example, by arranging a polarization setting member PSM such as ½ wave plate or ¼ wave plate on the optical path passed through the lights distributed at each area between diffractive optical element 21 (deflection member) and the fly' eye lens 5 (see, for example, FIG. 1E), the optical beam is preferably changed into that of the linear polarization whose polarization direction is approximately coincident to the circumference direction. In this case, the polarization setting member PSM is preferably arranged between one of the plurality of prisms (movable member) described above which is arranged at the most upstream side (light source side) and incident side, for example the lens 4 (see, for example, FIG. 1D), or the diffractive optical element 21 and the lens 4. In this case, it is not necessary to move the polarization setting member PSM in accordance with change of the diffractive optical element or the traveling direction of the optical beam (optical path) depending on modification of the distance among the plurality of prisms; or not necessary to enlarge the polarization setting member PSM in expectation of such change.

In addition, in the distribution of amount of light in FIG. 6B, the center circular area 28 may be the area of the annular similar to FIG. 6A.

Further, the diffractive optical element 21 in this embodiment, however, sets the distribution of amount of light on the pupil plane of the illumination system 12 as a predetermined plane to a predetermined state; the predetermined plane may be the pupil plane Q3 of the projection optical system PL. In this case, if the reticle R is not in existence due to the diffractive optical element 21, the distribution of amount of light is set which is approximately constant at the first area including the axis AX and the eight areas enclosing it, and which is lower at the other areas.

In addition, in the examples of FIG. 3 and FIG. 6A of this embodiment, the area 28 (or 28R), each of the areas 29A to 29D, and the areas 30A to 30D, in which amount of light is approximately constant on the pupil plane, is the circular (or annular) however, each circular (or annular) can be an area of ellipse (ellipse annular). Furthermore, as described bellow, the area of circular (or annular) can be an area of polygon (or frame shape of polygon), or can be combination of the area of circular (or annular) and the area of polygon.

Figure 9:
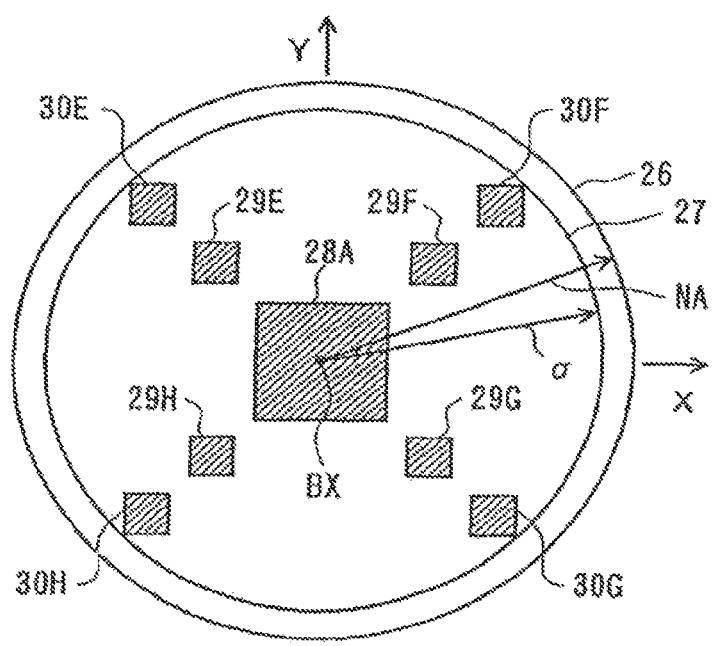
FIG. 9 shows a modified example for the distribution of amount of light of FIG. 3.

FIG. 9 shows possible another distribution of amount of light on the pupil plane, as shown FIG. 9, the distribution of amount of light is approximately constant at the center square (right square or right hexagon etc. is possible) area 28A, four square areas 30E to 30H enclosing it, and lower than it at the other areas. In this case, the positions and sizes of the areas may be respectively similar to those of the area 28, areas 29A to 29D, and the areas 30A to 30D. In addition, if corresponding to FIG. 6A, an area of frame type may be used instead of the center area 28A in FIG. 9.

Next, a second diffractive optical element 22 having different diffractive characteristic is provided to the revolver 24 in FIG. 1A. With setting the second diffractive optical element 22 on the optical path of the illumination light IL, distribution of amount of light which is approximate constant amount of light at the five areas of the exit plane Q1 (pupil plane) of the fly-eye lens 5, and the lower (approximate 0 in this embodiment) than it at the other area is obtained.

FIG. 7A shows a distribution of amount of light of the illumination light IL on the exit plane Q1 (pupil plane) of fly-eye lens 5 in FIG. 1A, when the second diffractive optical element 22 is used. In FIG. 7A with marking the same notes to the parts corresponding to in FIG. 3, the distribution of amount of light at five areas with distance each other including an area 33R (first area) of circular annular consist of the outer radius r1, the inner radius r1R, and the center of the optical axis BX of the illumination system 12, and four circular areas 34A, 34B, 34C, and 34D (second area) arranging along the a circle 35 having radius R3 with radius r5 and 90 degrees distance enclosing the area 33R is approximately constant; and is smaller (approximate 0 in this embodiment) than the constant amount of light. In this case also, the outer outline of the center area 33R is set larger than that of other four areas 34A to 34D (r4>r5).

Further, the value of ratio of the outer radius r4 and inner radius r4R (=r4R/r4) of the annular zone area 33R is any value between 0 and 1, as an example, ⅓ annular (r4R/r4=⅓), ½ annular (r4R/r4=½), ⅔ annular (r4R/r4=⅔) etc. can be used. Further, the preferable range of the radius r4 is similar to that of the radius r1 of the equation (13), and the preferable range of the radius R3 and radius r5 are similar to that of the radius R2 of the equation (10) and radius r2 of the equation (14) respectively.

Further, in this example, since the arranging direction of the 2-dimensional pattern is the X direction and Y direction, the outer four areas 34A to 34D are respectively arranged along the straight lines pass through the optical axis BX and cross by 45 degrees in the X direction (or Y direction).

Further, as an example, the radius r4 of the area 33R, the radius r5 of the areas 34A to 34D, and the radius R3 of the circle 35 are respectively set 0.2-fold, 0.1-fold, and 0.9-fold of the maximum σ value (σ), as follows:

$$r4=0.3\sigma, r5=0.1\sigma \quad (16)$$

$$R3=0.9\sigma \quad (17)$$

Figure 4:
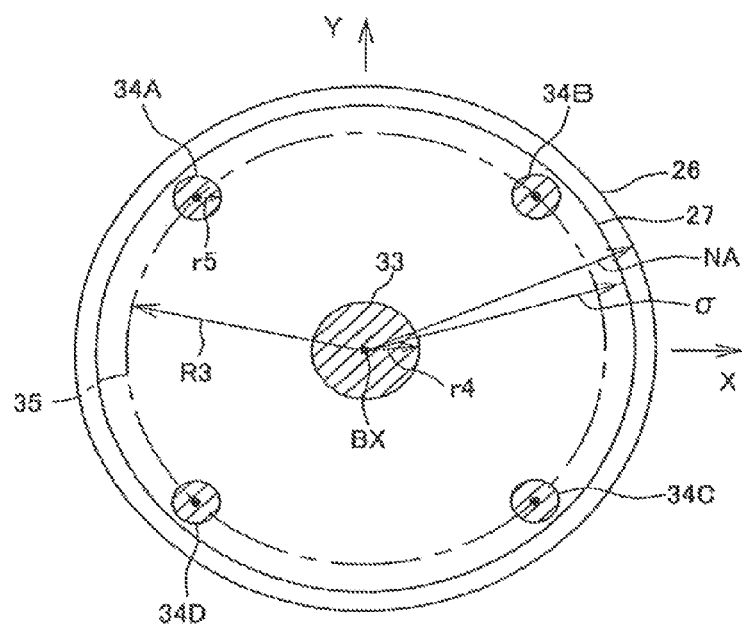
FIG. 4 shows the distribution of amount of light becoming large in five areas on the exit plane (pupil plane) of the fly' eye lens 5.

This inventor has evaluated the CD (critical dimension), through the simulation of the computer, which is obtained by transferring a downsizing image of pattern of contact holes with various kinds of pitch arranged on the reticle plane to the wafer through the projection optical system PL, under the distribution of amount of light in which the amount of light becomes constant at the five areas comprising the area 33, and the areas 34A to 34D in FIG. 4 satisfying the condition of the equations (16) and (17); becomes 0 at the areas in addition thereto. In addition, as this simulation, the exposure wave length is ArF laser light, the numerical aperture $NA_{PL}$ of the image side (wafer side) of the projection optical system PL in FIG. 1A is 0.78, projection magnification β is ¼-fold, and the maximum σ value (σ) is 0.9.

Figure 8:
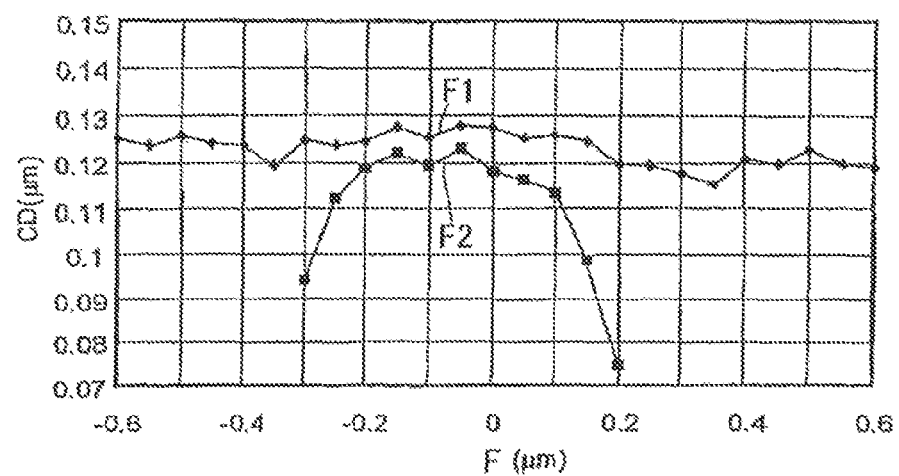
FIG. 8 shows an evaluating result through simulation of the transferred image when exposure is made with the distribution of amount of light of FIG. 7A.

The curves of line graph F1, F2 in FIG. 8 show the simulation result of the CD value in case that the amount of light becomes constant at the five areas on the pupil plane, the horizontal axis is the defocus amount of wafer (μm), vertical axis is the line width (μm) (line width on wafer) of the pattern well transferred as the CD value. Furthermore, approximate flat curve F1 indicates simulation result for the pattern of contact holes with line width 140 nm, pitch 220; mountain-shaped curve F2 indicates simulation result for the isolated pattern with line width 140 nm. As shown F1, F2, approximately constant CD value with range in which the defocus amount is around −0.2 μm to 0.2 μm is obtained. Accordingly, various kinds of pattern from the isolated pattern to the pattern with fine contact holes with high accuracy and wide depth of focus.

In addition, when the distribution of amount of light in FIG. 7A is used, for example, in order to control the maximum σ value (σ), by changing the distance between prisms 71 and 72 in FIG. 1A, the radial position (distance from the optical axis BX relating to the X direction and Y direction) of the areas 34A to 34D in which the amount of light is great in FIG. 7A may be changed. Alternatively, as shown in FIG. 1C, by using two pairs of prism 71A, 71B and 71C, 71D, the position (distance from the optical axis BX) of the areas 34A to 34D with peripheral area in which the amount of light is great among the distribution of amount of light in FIG. 7A in the X direction and Y direction may independently controlled.

Further, about the distribution of amount of light in FIG. 7A, it can be set the amount of light of the center area 33R (e.g., intensity per unit size) and that of the peripheral four areas 34A to 34D differ. The relative amount of these lights may be adjusted so as to be obtained the optimum resolution at each pattern for example.

Figure 7B:
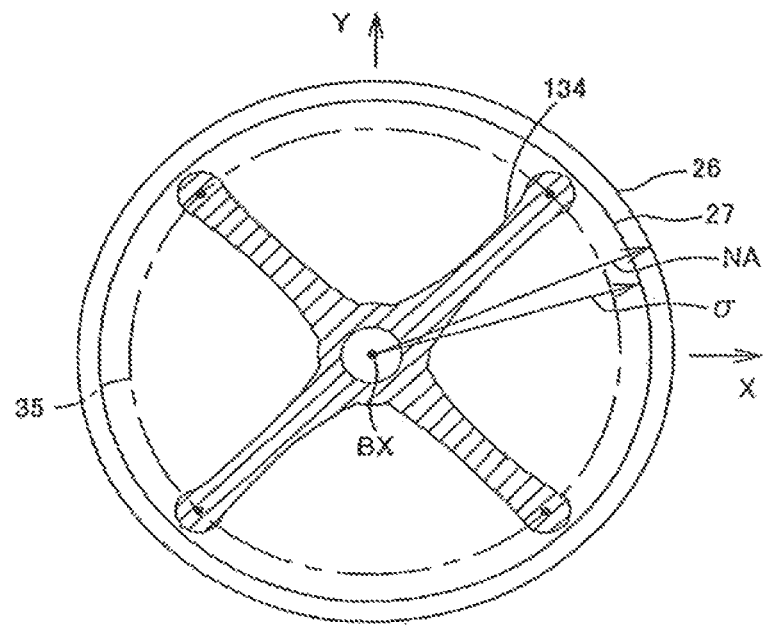
FIG. 7B shows a modified example of the distribution of amount of light of FIG. 7A.

Further, instead of the distribution of amount of light in FIG. 7A, as shown FIG. 7B, a distribution of amount of light becoming great amount of light of the area 134 which is a starfish shape having an aperture at the center or a star shape substantially connected the four areas 34A to 34D and the center annular zone area 33R in the radial direction may be used. The amount of light of the central part of the area 134 may be not 0 only smaller. Also in this case, it is almost able to transfer patterns having various kinds of pitch with high resolution.

In addition, when, in FIG. 7A, the peripheral areas 34A to 34D and the center area 33R are connected in FIG. 7B, the amount of light of the connected part getting longer to radial direction may be around equal to those of the peripheral and center areas, or may be different from those, for example smaller than those.

Figure 1D:
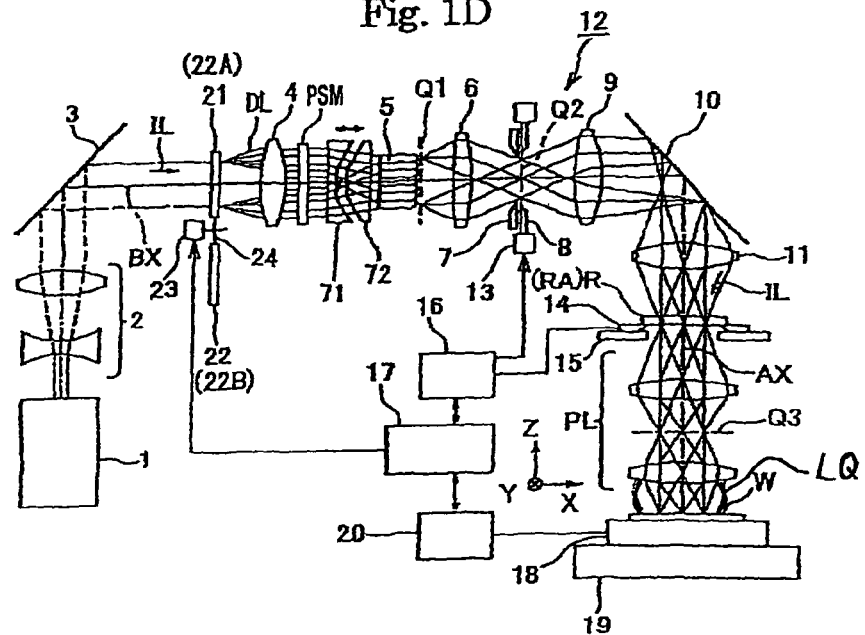
Figure 1E:
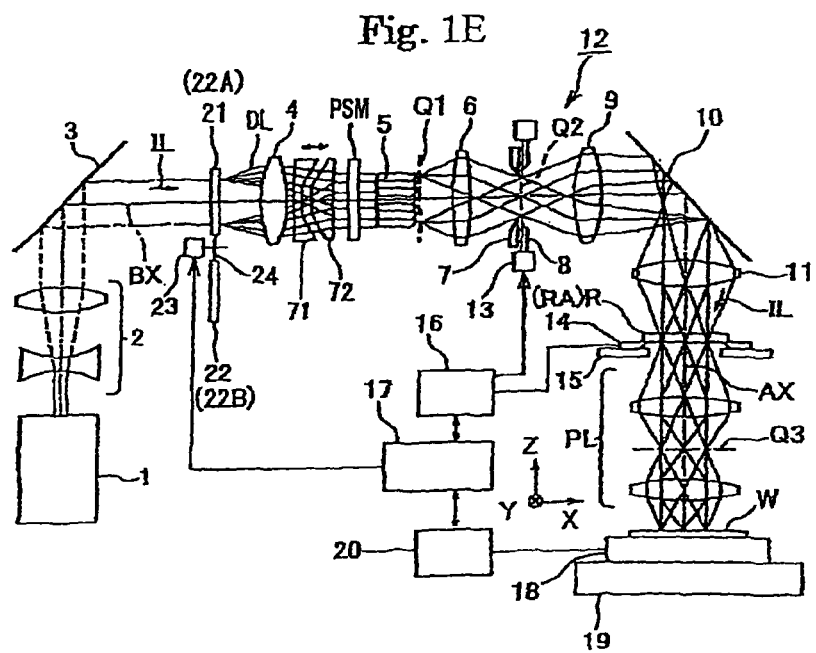

Further, in this example, the light distributed at the peripheral areas 34A to 34D in FIG. 7A may be linear polarization. In this case, as an example, as shown with an arrow mark BR, the light distributed at the peripheral areas may be S polarization (vertical direction for the incident plane) whose polarization direction is the tangent direction. Whereby, the resolution etc. for the specific pattern might be enhanced. It is the similar to the case of using the distribution of amount of light in FIG. 7B. The light distributing the peripheral area getting longer to the radial direction, particularly its part corresponding to the peripheral areas 34A to 34D in FIG. 7A may be the linear polarization whose polarization becomes the tangent direction. In addition, if the light distributed at the peripheral areas is non-polarization or whose polarization direction is not coincidental to the circumference direction, as described above, for example, it is preferable to provide polarization setting member PSM between the diffractive optical element 21 and the fly-eye lens 5, as illustrated in FIGS. 1D and 1E.

In order to compare, the simulation result in which the amount of light is set constant at a circular area instead of the center annular zone area 33R in FIG. 7A is represented.

FIG. 4 shows the distribution of amount of light in which the amount of light is set constant at a circular area 33 instead of the center annular zone area 33R in FIG. 7A, and the amount of light is set constant at four areas 34A to 34D enclosing it as with FIG. 7A.

In FIG. 4, as an example, the radius r4 of the area 33, the radii r5 of the areas 34A to 34D, and the radius R3 of the circle 35 are respectively set 0.2-fold, 0.1-fold, and 0.9-fold of the maximum σ value (σ), as follows:

$$r4=0.2\sigma, r5=0.1 \quad (18)$$

$$R3=0.9\sigma \quad (19)$$

This inventor have evaluated the CD (critical dimension), through the simulation of the computer, which is obtained by transferring a downsizing image of pattern of contact holes with various kinds of pitch arranged on the reticle plane to the wafer through the projection optical system PL, under the distribution of amount of light in which the amount of light becomes constant at the five areas comprising the area 33, and the areas 34A to 34D in FIG. 4 satisfying the condition of the equations (18) and (19): becomes 0 at the other areas. In addition, as this simulation, the values of the numerical aperture $NA_{PL}$ of the image side (wafer side) of the projection optical system PL in FIG. 1A, projection magnification β, and the maximum σ value (σ) are similar to the equation (12) in the FIG. 3.

The dotted line curve 37 in FIG. 5 shows the simulation result of CD value in which the amount of light becomes constant at the five areas of this pupil plane, as shown in the curve 37; the CD value is low around pitch 500 to 700 nm.

Accordingly, it is understood that the case using the distribution of amount of light in which the amount of light becomes approximately constant at the nine areas on the pupil plane in FIG. 3 can transfer the pattern across wider pitch range with high resolution than the case of using the distribution of amount of light in which the amount of light becomes approximately constant at the five areas in FIG. 4.

The Second Embodiment

Next, the second embodiment according to the present invention will be described accompanying FIG. 10 to FIG. 17. Also in this embodiment, the exposure is fundamentally performed by using the scan exposure type projection optical apparatus in FIG. 1A. In this embodiment, however, instead of the diffractive optical element 21 in FIG. 1A, a diffractive optical element 22A (described bellow in detail) having different characteristic is used. Accordingly, the diffractive optical element 22A, the first prism 71, and the second prism 72 are corresponding to an optical member for setting a predetermined distribution of amount of light. In this embodiment, as with the first embodiment, the prism 71, 72 (or the first prism 71 only) are used as movable prism.

Further, as shown FIG. 10, it is allow using a pair of prisms 71A, 71B shaped like a letter V which has diffractive power to one direction and has not diffractive power to orthogonal direction, as the movable prism. In addition, the prisms 71A, 71B are arranged so that each rectangle area (in this embodiment, the parallel flat plate) of its center is approximately orthogonal to the optical axis BX and two slope planes of the around area are approximately symmetric with respect to a plane being orthogonal to the paper of FIG. 1A including the optical axis BX.

With this constitution, by changing the distance between the prisms 71A, 71B, positions (distance from the optical axis BX) of a peripheral area in which the amount of light is great concerning above and bellow of within the paper in FIG. 10 (for example, corresponding to X direction in FIG. 12 described bellow in which a distribution of amount of light of an illumination light at a pupil plane of an illumination system 12) changes.

Next, an illumination system and an illumination method will be described in detail. In this embodiment, a reticle RA is loaded on the reticle stage 14 instead of the reticle R in FIG. 1A.

Figure 11A:
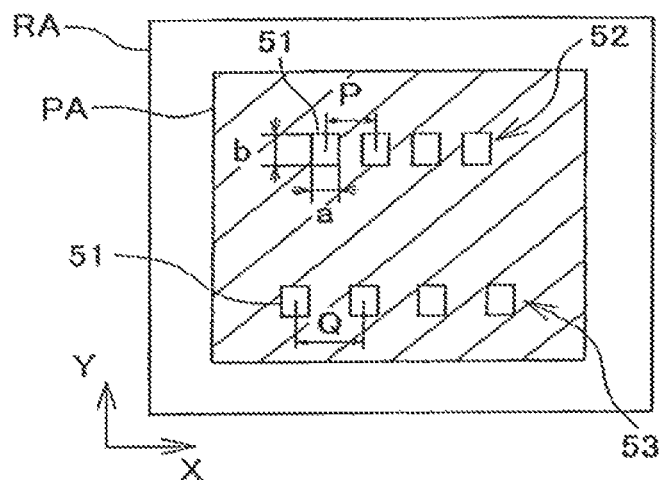
FIG. 11A is a plan view of one example of the pattern of reticle R1 that becomes an object of exposure in the second embodiment of the present invention.

FIG. 11A shows an example of a pattern (original pattern) for transferring formed on the reticle RA loaded on the reticle stage 14 in FIG. 1A. In FIG. 11A, a pattern 52 for the one directional high density pattern is formed, in which square aperture patterns 51 having width a in the X direction and width b in the Y direction, are periodically arranged in the X direction (non-scan direction in this embodiment) with pitch P at the pattern region PA. The pitch P is fine pitch (for example, around 150 nm length converted to projection image on wafer W) which is close to approximate limited resolution of the projection exposure apparatus in this embodiment, the width a of the X direction is around ½ of the pitch P, and the width b of the Y direction is around equal to the width a to 10-fold (around a to 10a). The pattern 52 is one directional high density pattern which can regard an isolated pattern about the Y direction (scan direction in this embodiment). In addition, though the pattern 52 is the periodical pattern arranging four aperture pattern 51 in X direction, the number of the aperture pattern 51 may be 2 or any than 2. Further, though the aperture pattern 51 is the transmission pattern formed in a light shielded film, a light shielded pattern provided in transmission part may be used instead of it.

Figure 11B:
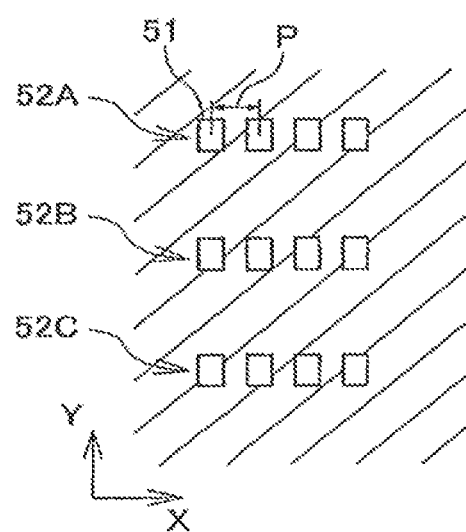
FIG. 11B shows a modified example of the pattern of reticle R1.

Further, another pattern 53 for one directional high density pattern is also formed at a position distant from the pattern 52 in the Y direction, in which square aperture patterns 51 with pitch Q larger than the pitch P. The pattern 52 and 53 are actually small pattern whose length of X direction is a few μm or less, various kinds of other pattern (not shown) may be formed on the pattern region PA of the reticle RA. further, as shown in FIG. 11B, when pattern 52A, 52B, and 52C, in which aperture pattern 51 is arranged in the X direction with pitch P respectively, are formed with considerably larger pitch than pitch P in the Y direction, each of pattern 52A, 52B, and 52C is regarded as one directional high density pattern, can be the target for transfer in this embodiment. In addition, the plurality of periodic pattern may only be arranged with the distance, so as to be isolated for orthogonal direction (Y direction) to the periodic direction, and their number may be arbitrary.

In order to transfer image of these original patterns on wafer with high accuracy, as shown FIG. 1A in this embodiment, with arranging the diffractive optical element 22A on the optical path of an illumination light IL, the distribution of amount of light (strength distribution) of the illumination light IL at the exit plane Q1 (pupil plane) of the fly-eye lens 5 as a predetermined plane.

FIG. 12 shows the distribution of amount of light of the illumination light IL at the exit plane Q1 (pupil plane of the illumination system 12) of the fly-eye lens 5 in FIG. 1A in this embodiment. In this FIG. 12, the direction on the exit plane Q1 corresponding to the X direction (periodically arranging direction) and Y direction (regarding as isolated direction) on the reticle R is respectively defined the X direction and Y direction. Here, if the numerical aperture of the object side (reticle side) of the projection optical system PL in FIG. 1A is NA, the numerical aperture of the image side (wafer side) is $NA_{PL}$, a relation is obtained with using the projection magnification β, as follows:

$$NA=\beta \cdot NA_{PL} \qquad (5) \text{ (as with the first embodiment)}$$

Further, it is defined that the maximum value among the numerical apertures of the illumination light IL incident to the reticle R from the illumination system 12 is $NA_{IL}$, the value of ratio (coherence factor) of the maximum numerical aperture $NA_{IL}$ to the numerical aperture NA of the projection optical system PL is called maximum σ value in this embodiment, and maximum σ value is $\sigma_{IL}$. That is, the illumination light of maximum σ value is the light incident on the reticle R with the maximum angle among the illumination light IL. The maximum σ value ($\sigma_{IL}$) can be expressed, as follows:

$$\sigma_{IL}=NA_{IL}/NA=NA_{IL}/(\beta \cdot NA_{PL}) \qquad (6A)$$

In a pupil plane of an illumination system shown in FIG. 12, a maximum outer circle 26 indicates an outer area passed through virtual optical beam having the same numerical aperture as the numerical aperture NA at the incident side of the projection optical system PL, an inner circle 27 indicates a circle is tangent to areas passed through illumination light having numerical aperture of the maximum σ value ($\sigma_{IL}$); all illumination light pass though within the circle 27. The radius a of the circle 27 is equal to $\sigma_{IL}$·NA, as follows:

$$\sigma = NA_{IL} = \sigma_{IL} \cdot NA = \sigma_{IL} \cdot \beta \cdot NA_{PL} \tag{6B}$$

Further, in FIG. 12, the origin point of the X axis and Y axis is on the optical axis BX. The illumination light IL, in FIG. 12, has the distribution of amount of light with the approximate constant amount of light at the three areas (hatched areas) including the annular zone area 54 with the radius r4 which centers on the optical axis BX of the illumination system 12 and the two circular areas 55A, 55B with the radius r5 sandwiching the area 54 in the X direction; and with the smaller amount of light (approximate 0 in this embodiment) than the constant amount of light. That is, the centers of the three areas 54, 55A, and 55B are arranged along the straight line which passes through the optical axis of the illumination system and parallels the X axis (periodically arranging direction of one directional high density pattern as target for transfer), the distance between the each center of the area 55A and 55B both ends and the optical axis BX is respectively R3.

Figure 15A:
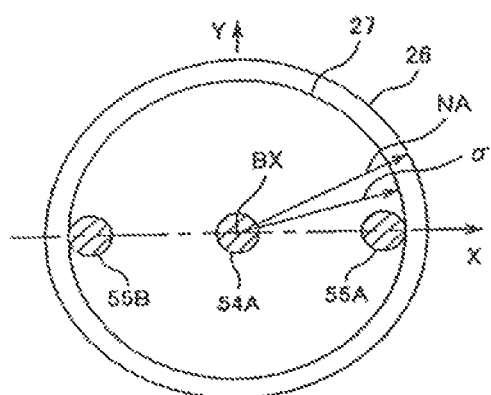
Figure 15C:
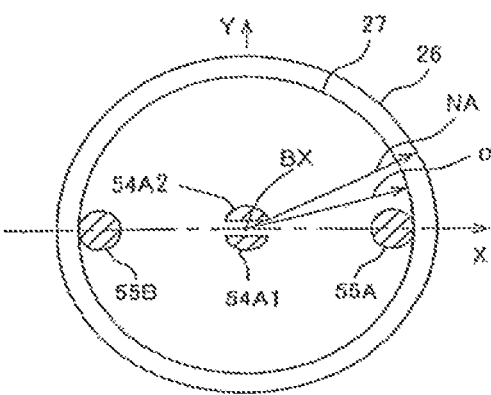

Further, the annular zone area 54 has ½ annular in which the inner radius is ½ of the outer radius r4, ⅓ annular in which the inner radius is ⅓ of the outer radius r4, or ⅔ annular in which the inner radius is ⅔ of the outer radius r4 and the like. In addition, as shown FIG. 15A, the circular area 54A with the radius r4 can be used instead of the annular zone area 54. Further, a plurality of areas substantially split can be used instead of the annular zone area 54. Concretely, as shown in FIG. 15C, the distribution of amount of light at the two half-circular (or circular etc.) areas 54A1, 54A2 split in the Y direction (or X direction), in which the amount of light become great, may be used instead of the annular zone area 54. In this case, the amount of light may become great at a four-way split area in the X direction and Y direction (or direction crossed these axes) instead of the annular zone area 54. Furthermore, distribution in which the amount of light gradually decreases toward outer may be near the outline of the area 54, 55A, 55B. The center area 54 is corresponding to the first area, and the two areas 54A and 54B sandwiching it is respectively corresponding to the second area and third area. Hereinafter, the radii r4, r5 and R3 respectively indicate the radius a in the equation (6B) (distance between point passed through the optical beam of the maximum σ value and the optical axis BX) corresponding to the maximum σ value ($\sigma_{IL}$) as unit.

In this embodiment, the radii r4, r5 are preferably set within around 0.1σ to 0.2σ respectively, as follows:

$$0.1\sigma \leq r4 \leq 0.2\sigma \tag{21}$$

$$0.1\sigma \leq r5 \leq 0.2\sigma \tag{22}$$

If the values of the radii r4, r5 are smaller than the lower limit of the equation (21), equation (22), the depth of focus of the projection optical system PL becomes shallow for the optical beam in the isolated direction of one directional high density pattern; if the values of the radii r4, r5 are greater than the upper limit of the equation (21), equation (22), the depth of focus of the projection optical system PL becomes shallow for the optical beam in the periodic direction of one directional high density pattern (described bellow in detail). Furthermore, radius r4 and radius r5 are preferably equal, as follows:

$$r4 \approx r5 \tag{23}$$

Further, the areas 55A and 55B of each end in FIG. 12 are inscribed to the circle 27 of the maximum σ value. Accordingly, the equation holds, as follows:

$$R3 = \sigma - r5 \tag{24}$$

In this case, the diffractive characteristic of the diffractive optical element 21 in FIG. 1A is set, so as to obtain the distribution of amount of light in which the amount of light approximately becomes constant at the area 54, the areas 55A, 55B in FIG. 12 satisfying the condition of the equations (21) to (24); approximately becomes 0 at other areas. For the reason, the diffractive optical element 22A, as an example, can fabricate by forming a concave and convex grating having approximately systematically along in the direction of the straight line 31A, and a concave and convex grating having approximately systematically along the X axis of FIG. 12. Alternatively, the diffractive optical element 22A may be a combination of a plurality of phase type diffractive gratings. In these cases, since the diffractive optical element 22A is phase type, it is advantage of high efficiency for using light. In addition, it is able to use an optical element changing refractive index distribution corresponding to a diffractive grating distribution as an optical element 22A. In addition, a construction and a method for fabricating having a specific diffractive characteristic is closely disclosed, for example, in Japanese Patent Application Laid-open No. 2001-176766 (corresponding to U.S. Pat. No. 6,563,567) by this applicant.

In addition, it is allowed that the amount of light distribution obtained by diffraction optical device 22A is set to be approximately the predetermined of light at a region including regions 54, 55A and 55B in FIG. 12. Furthermore then, an aperture stop where an aperture is formed at a portion corresponding to the regions 54, 55A and 55B in FIG. 12 may be disposed on the emission plane Q1 (pupil plane) of the fly eye lens 5 in FIG. 1A. Also in this case, advantage in which utilization efficiency of the illumination light IL is high is obtained.

There will be explained, while referring to FIG. 13, the focus light flux, when illuminating the pattern 52 of the one directional high density contact hole (one directional high density pattern) of reticle RA in FIG. 11A with the amount of light distribution of the illumination light in FIG. 12.

Figure 13A:
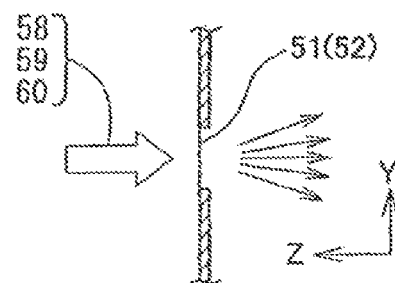
FIG. 13A shows optical beams diffracted in the Y direction by the pattern 52 of FIG. 11A.
Figure 13B:
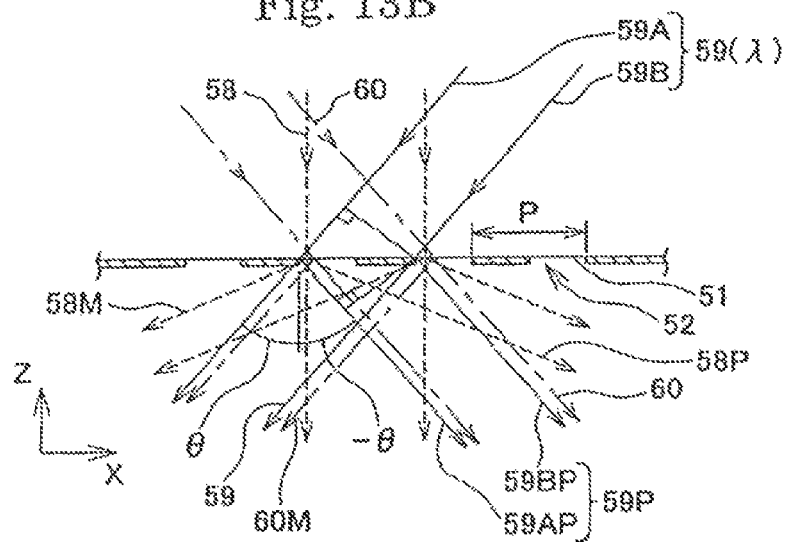
FIG. 13B shows optical beams diffracted in the X direction by the pattern 52 of FIG. 11A.

FIG. 13A shows diffraction light (focus light flux) diffracted in the isolated Y direction from the pattern 52. FIG. 13B shows diffraction light (focus light flux) diffracted in the periodic X direction from the pattern 52. In FIGS. 13A and 13B, light beams 58, 59 and 60 show the illumination light IL passed through the regions 54, 55A and 55B on the pupil plane of the illumination system in FIG. 12 respectively. The diffraction light generated from the pattern 52 (aperture pattern 51) due to the light beams 58, 59 and 60 generates, in the Y direction, with distribution in which the diffraction light is generated most strongly at the center, and the larger the tilt angle, the lower the intensity decreases, as shown in FIG. 13A.

On the other hand, as shown in FIG. 13B, there are positive primary light 58P and negative primary light 58M in addition to zero-order light, in the diffraction light generated in the X direction from the pattern 52 by illumination of the light beam 58 from the region 54 with optical axis BX in FIG. 12 as center. At this point, the pattern 52 is resolution limit, therefore, the positive primary light 58P and the negative primary light 58M can not be passed through the projection optical system PL in FIG. 1. Further, the zero-order light generated in the X direction from the pattern 52 by the illumination of the light beams 59 and 60 from the regions 55A and 55B of both ends in FIG. 12 is taken to as the zero-order lights 59 and 60 respectively, as shown in FIGS. 13A and 13B. The pattern 52 of this embodiment is approximately the resolution limit, therefore, the positive primary light 59P from the pattern due to one light beam 59 is made incident into the projection optical system PL in FIG. 1A in parallel to the other zero-order light 60, while, the negative primary light 60M from the pattern 52 due to the other light beam 60 is made incident into the projection optical system PL in FIG. 1A in parallel to one zero-order light 59.

Further, wavelengths of incident light beams 58, 59 and 60 are taken to as $\lambda$, exit angle in the X direction to the normal line of the pattern 52 of the zero-order light 59 is taken to as $\theta$, and exit angle in the X direction to the normal line of the pattern 52 of the zero-order light 60 is taken to as $-\theta$, and in FIG. 13B, among the other light beams 59, the light beam passed through the adjacent aperture pattern 51 with interval P of the X direction is taken to as the light beams 59A and 59B. In this case, differential value $\Delta A$ of the optical path length between the positive primary light 59AP of the light beam 59A and the positive primary light 59BP of the light beam 59B equals to the wavelength $\lambda$ as follows:

$$\Delta A = 2 \cdot P \cdot \sin \theta = \lambda \tag{25}$$

Furthermore, the interval R3 in the X direction between the regions 55A and 55B, and the optical axis BX in FIG. 12 corresponds to sin $\theta$ of the exit angle $\theta$ of the zero-order light of the light beams 59 and 60 in FIG. 13B as follows:

$$R3 = \sigma - r5 = \sin \theta \tag{26}$$

In addition, equation (26) corresponds to the case in which focal distance fQ1 at the side of the emission plane Q1 of the partial optical system between the emission plane Q1 (pupil plane) in the illumination system 12 in FIG. 1A and the reticle plane is set to 1. Next relationship is approved from the equations (25) and (26). Since, there is no unit of the interval R3 of the equation (26), unit of both sides of next equation becomes length.

$$P = \lambda/(2 \cdot R3) = \lambda/\{2(\sigma - r5)\} \tag{27A}$$

In other words, equation (27A) indicates resolution limit of X direction (cycle direction) in the object plane (reticle plane) of the projection exposure apparatus of this embodiment, in which the larger is the interval R3 while making $\sigma$ larger or while making radius r5 smaller, the less it is possible to make the pitch P to be the resolution limit smaller. The pitch P is converted into pitch $\beta \cdot p$ as the following equation, which the pitch $\beta \cdot P$ is length on the wafer. The pitch $\beta \cdot P$ becomes the resolution limit in the X direction on the image plane (wafer plane) of the projection optical system PL.

$$\beta \cdot P = \beta \cdot \lambda/\{2(\sigma - r5)\} \tag{27B}$$

In this embodiment, the wavelength $\lambda$ is set to 193.306 nm. As one example, numerical aperture $NA_{PL}$ at the wafer side of the projection optical system PL is taken to be 0.85, projection scale factor $\beta$ of the projection optical system PL is taken to be ¼, $\sigma IL$ to be $\sigma$ value of illumination system 12 is taken to be 0.90, and radius r5 of the regions 55A and 55B in FIG. 12 is taken to be 0.14$\sigma$, that is called as "the first illumination condition". The resolution limit $\beta \cdot P$ at the image plane side under this condition becomes about 147 nm as shown in next equation from relationship of the equations (6B) and (27B).

$$\beta \cdot P = 146.7 \text{ (nm)} \tag{28}$$

FIG. 12 can be regarded as the drawing showing amount of light distribution in the X direction in the pupil plane Q3 of the projection optical system PL in FIG. 1A. In this case, the regions 54, 55A and 55B in FIG. 12 correspond to position through which the zero-order light of the illumination light IL is passed, and the positive primary light in the X direction of the illumination light IL according to the pattern 52 in FIG. 11A becomes distribution in which the amount of light distribution in the circumference 27 is moved in parallel toward the region in the circumference 57A with the spaced point 56A as the center, which the spaced point 56A is spaced from the optical axis BX (optical axis AX of the projection optical system PL) by only interval 2·R3 in the +X direction. Similarly, the negative primary light in the X direction of the illumination light IL according to the pattern 52 becomes distribution in which the amount of light distribution in the circumference 27 is moved in parallel toward the region in the circumference 57B with the spaced point 56A as the center, which the spaced point 56B is spaced from the optical axis BX (optical axis AX) by only interval 2·R3 in the -X direction. In this case, the positive primary light (or the negative primary light) of the light beam passing through the region 55B (or 55A) passes through the region 55A (or 55B), therefore, the image of the pattern 52 is projected on the wafer with high resolution.

In addition, if a part of the positive primary light (negative primary light) of the light beam passing through the region 55B (55A) is passed through within the circumference 26, the image of the pattern 52 is imaged, therefore, actual resolution limit $\beta \cdot P$ at the image plane side becomes smaller value than that of the equation (28).

Concerning this embodiment, the present inventor, in order to obtain the optimum balance between radius r4 of central region 54 and radius r5 of the regions 55A and 55B at both ends in FIG. 12, has calculated depth of focus (DOF) of the image according to the projection optical system PL with simulation of the computer while varying the radius r4 gradually. The condition in addition to the r4, at this time, is the same as the above described first illumination condition, and the radius r5 is 0.14$\sigma$. Furthermore, the pitch P of the pattern 52, in FIG. 11A, is taken to be 145 nm to be approximate resolution limit, and the width a in the X direction of the aperture pattern 51 is taken to be 70 nm, and width b in the Y direction is taken to as 500 nm. It should be noted that the pitch P, and the widths a and b are lengths which are converted on the image plane of the projection optical system PL respectively.

Figure 14:
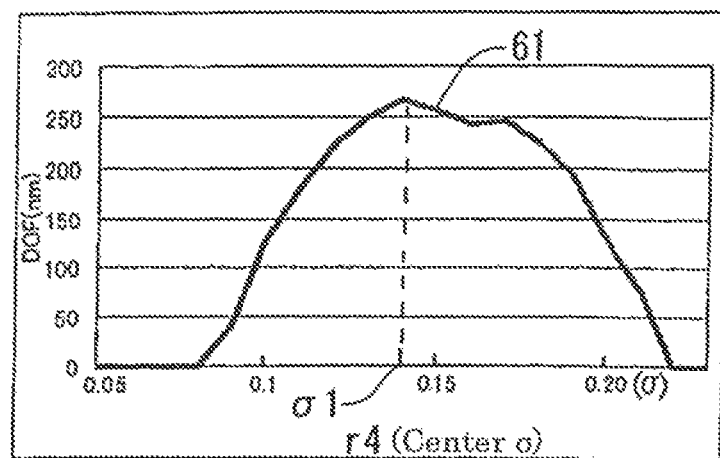
FIG. 14 shows an evaluating result of depth of focus (DOF) through simulation of the transferred image when exposure is made with the distribution of amount of light of FIG. 12.

The curved line 61 in FIG. 14 shows the simulation results, and the horizontal axis in FIG. 14 is the radius r4 (unit is $\sigma$) of the region 54 (center $\sigma$) of the center of FIG. 12, and the vertical axis is calculation results of the depth of focus (DOF) (nm) corresponding to the value of the radius r4. As known from the curved line 61, there is obtained the depth of focus more than approximate 100 nm within the range in which the radius r4 is from 0.1$\sigma$ to 0.2$\sigma$. In addition, when the radius r4 is $\sigma$1 (=0.14$\sigma$), that is, when the radius r4=r5 is approximately approved, there is obtained the deepest depth of focus. In this case, even though some degree of unevenness exist on the wafer as a substrate, curvature and the like occur on the image plane within the above described exposure region by aberration of the projection optical system PL or the like, or certain degree of tracking error of the focus position remains at the time of exposure in the scanning exposure method, for instance, it is possible to transfer the one directional high density pattern with high resolution. It should be noted that when the radius r4 becomes smaller than degree of 0.1$\sigma$, the depth of focus of the focus light flux in the isolated direction of the pattern 52 in FIG. 11A becomes narrow. On the other hand, when the radius r4 becomes larger than degree of 0.2σ, the depth of focus of the focus light flux in the cyclic direction of the pattern 52 in FIG. 11A becomes narrow, by the flare effect of the light beam from the region 54 of the center of FIG. 12.

In addition, in the pattern 53 of the one directional high density contact hole existing in the position spaced from the pattern 52 of FIG. 11A, arrangement direction is the same as that of the pattern 52, and the pitch Q is larger than the pitch P, therefore, the pattern 53 is transferred on the wafer with high resolution under the above described illumination condition.

As described above, by employing the amount of light distribution on the pupil plane of this embodiment in FIG. 12, the pattern of the reticle RA including the pattern 52 of the one directional high density contact hole of FIG. 11A is capable of being transferred on the wafer W in the X direction and the Y direction with high resolution.

In addition, for instance, when one directional high density pattern with X direction as cyclic direction and one directional high density pattern with Y direction as cyclic direction are formed on the reticle RA of FIG. 11A, it is allowed that arrangement direction of three regions 54, 55A 55B through which the illumination light of FIG. 12 is passed in parallel to the cyclic direction of the pattern which has the smallest pitch among them. At this time, three regions 54, 55A and 55B are allowed to be disposed on the straight line in parallel to the cyclic direction of one pattern which is passed through the optical axis BX on the pupil plane of the illumination system 12 and whose pitch is the smallest one. At least one of 2 regions 55A and 55B except for the central region 54 is allowed that distance of the optical axis BX concerning the direction in parallel to the cyclic direction of the other pattern is not zero, or the distance is allowed to be set in accordance with the pitch of the other pattern, for instance.

Furthermore, numerical aperture $NA_{PL}$ at the image side of the projection optical system PL, the projection scale factor β, and the maximum σ value (σIL) of the illumination system 12 are capable of taking arbitrary value without restricting the value to the above described values. For instance, position (distance of the optical axis BX concerning X direction to the region 55B) in the radius direction of the regions 55A and 55B where peripheral amount of light is large among amount of light distribution of FIG. 12 is allowed to be varied while varying interval between prisms 71 and 72 of FIG. 1A to control the maximum σ value (σIL), or the interval R3 of FIG. 12. It is possible to control the maximum σ value similarly, also by employing the V-type prisms 71A and 72A of FIG. 10 instead of the prisms 71 and 72.

In addition, in the amount of light distribution of FIG. 12, it is allowed that the amount of light (for instance, intensity per unit area) of the center region 54 is made different from the amount of light of peripheral 2 regions 55A and 55B. Relative largeness of these light quantities is allowed to be adjusted so that the optimum resolution can be obtained every transferring pattern, for instance. Furthermore, in this embodiment, it is allowed that distributed light in peripheral regions 55A and 55B of FIG. 12 may be made linearly polarized light. At this occasion, it is allowed that, as one example, the light distributed on the peripheral regions 55A and 55B is made S polarization in which the polarizing direction is direction of the tangential line (vertical direction to incident plane). By this matter, in some cases, resolution and so forth to the specific pattern are improved.

In addition, when the lights which are respectively distributed at three regions having large peripheral amount of light described above while being generated from the light source 1 are non-polarized lights, or the polarizing direction thereof do not agree with the direction of the tangential line, it is preferable that the lights are converted into the light beam of the linear polarized light in which the polarizing direction approximately agrees with the direction of the tangential line upon disposing the polarization setting member such as a half-wave plate or a quarter-wave plate or so forth on the optical path through which the lights distributed at respective regions are passed between the diffraction optical element 21 (deflection member) and the fly eye lens 5, for instance. At this time, it is preferable that there is provided the polarization setting member at incident side of one prism (movable member), which is movable along the optical axis BX and disposed at the most upstream (light source side) between one pair of the prisms described above, for instance, between the movable member and the lens 4, or between the diffraction optical device described above and the lens 4. In this case, it is not necessary to move the polarization setting member in accordance with variation of direction of travel of the light beam (optical path) caused by exchange of the diffraction optical device or interval change of one pair of prisms or so forth, or it is not necessary to form the polarization setting member largely in anticipation of its variation.

In addition, the diffraction optical device 22A in this embodiment sets the amount of light distribution on the pupil plane of the illumination system 12 as the predetermined plane into predetermined condition, however, the predetermined plane is possible to be the pupil plane Q3 of the projection optical system PL of FIG. 1A. At this time, in the case that the reticle RA does not exist caused by its diffraction optical device 22A, the amount of light distribution, which becomes approximately constant in the first region including the optical axis AX and in two regions putting the first region therebetween, and becomes lower amount of light than it at the region in addition thereto, is set in the pupil plane Q3 of the projection optical system PL.

In addition, in this embodiment, the regions 54, 55A and 55B, which have approximately constant amount of light on the pupil plane, have circular form (or annular form), however, outward form of those regions are possible to be respective oval regions. Further, outward form of each region is possible to be rectangular region as described later, furthermore, outward form of each region is possible to be combined between the circular (or oval) region and the rectangular region.

Figure 15B:
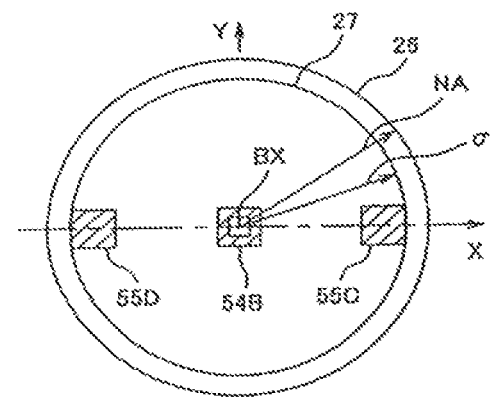

FIG. 15B shows another possible amount of light distribution on its pupil plane, as shown in FIG. 15B, the amount of light distribution becomes approximately the predetermined of light at the frame shaped region 54B of the center rectangular shape (regular hexagon or so forth is possible in addition to square), and at two rectangular regions 55C and 55D, which put the region 54B therebetween in the X direction, and the amount of light distribution becomes low at the region in addition thereto. In this case, position and area of the rectangular (or frame shape) region are allowed to be approximately the same as the position and area of the regions 54, 55A and 55B of FIG. 12.

Next, from the above described equations (27A) or (27B), in the amount of light distribution of the illumination light on the pupil plane of FIG. 12, it is seen that the larger is a to be radius of the circumference 27 and the smaller is the radius r5 of the regions 55A and 55B at both ends, the smaller it is possible to minimize the resolution limit P (or βP). However, when the radius r5 becomes smaller than degree of 0.1σ, the depth of focus becomes shallow. Consequently, there will be explained the method capable of improving the resolution while minimizing the radius r5 substantially and maintaining the depth of focus deep below. For that reason, there is provided the second diffraction optical device 22B having slightly different diffraction property in the revolver 24 of FIG. 1A. When the second diffraction optical device 22B is mounted on the optical path of the illumination light IL, there is obtained the amount of light distribution, which becomes approximately the predetermined of light at three regions 62, 63A and 63B of FIG. 16A, and becomes the amount of light lower than it (approximate zero in this embodiment) in the region in addition thereto, at the emission plane Q1 (pupil plane) of the fly eye lens 5.

FIG. 16A shows the amount of light distribution of the illumination light IL in the emission plane Q1 (the pupil plane of the illumination system 12) of the fly eye lens 5 in FIG. 1A in the case that the second diffraction optical device 22B is used. In FIG. 16A where the same sign is added to corresponding part to FIG. 12, there is set two oval regions 63A and 63B (the second region and the third region) having the shape in which slender in the Y direction is external form, width in the X direction is t, and length in the Y direction is h (h>t), so as to put the circular region 62 (the first region) of the radius r6 between these two oval regions 63A and 63B in the X direction, with the optical axis BX of the illumination system 12 in FIG. 1A as the center, so that the interval from the optical axis BX to each center becomes R4. Also in this example, the center region 62 is allowed to be the annular shape. Two slender oval regions 63A and 63B are the overlapped region in which the region in the circumference 27 having the radius σ is overlapped by the region in the circumferences 65A and 65B whose radii are NA (or σ is possible) by employing the positions 64A and 64B, which have the interval of R5 from the optical axis BX, as the center. On this occasion, the interval R4 is set longer than the interval R3 from the optical axis BX in FIG. 12 to the center of the regions 55A and 55B, the intervals R4 and R5 are capable of being expressed with the following equations.

$$R4 = (\sigma - t/2) > R3 \quad (29A)$$

$$R5 = R4 + NA - t/2 \quad (29B)$$

In order to bring the relation of R4>R3 into existence, on the assumption that the equation (22) is already brought into existence, ½ of the width t in the X direction of oval regions 63A and 63B, as one example, is set approximately to next range. Similarly, the radius r6 of the center circular region 62 is set within the range of approximately the degree of two times of t/2.

$$0.025\sigma \le t/2 \le 0.075\sigma \quad (30)$$

$$0.05\sigma \le r6 \le 0.16\sigma \quad (31)$$

More desirably, t/2 is set to the degree of 0.05σ. The resolution limit P in the X direction on the object plane of the corresponding projection optical system PL to the equation (27A) in these cases becomes smaller than the value of the equation (27A) as the following equation.

$$P = \lambda/(2 \cdot R4) < \lambda/(2 \cdot R3) \quad (32)$$

Also, concerning the illumination condition in FIG. 16A, the present inventor, in order to obtain the optimum balance between radius r6 of central region 62 and half width (t/2) of the oval regions 63A and 63B at both ends, has calculated depth of focus (DOF) of the image according to the projection optical system PL by simulation of the computer while varying the radius r6 gradually. In the illumination condition (the second illumination condition) on this occasion, the wavelength λ is set to 193.306 nm. Numerical aperture $NA_{PL}$ at the wafer side of the projection optical system PL is taken to be 0.85, projection scale factor β is taken to be ¼, σIL to be σ value of illumination system 12 is taken to be 0.93, and the half width (t/2) of the oval regions 63A and 63B is taken to be 0.05σ. In addition, the pitch P of the pattern 52, in FIG. 11A of the object of transfer is taken to be 140 nm to be approximately resolution limit, and the width a in the X direction of the aperture pattern 51 is taken to be 70 nm. It should be noted that the pitch P, and the widths a and b are lengths which are converted on the image plane of the projection optical system PL respectively.

The curved line 66 in FIG. 17 shows the simulation results, and the horizontal axis in FIG. 17 is the radius r6 (unit is σ) of the region 62 (center σ) of the center of FIG. 16A, and the vertical axis is calculation results of the depth of focus (DOF) (nm) corresponding to the value of the radius r6. As known from the curved line 66, there is obtained the depth of focus more than approximate 250 nm within the range in which the radius r6 is from degree of 0.05σ to 0.16σ. In addition, when the radius r6 is σ2 (=0.11σ), that is, when the radius r6=t is approximately brought into existence, there is obtained the deepest depth of focus (about 350 nm). Accordingly, by employing the illumination condition in FIG. 16A, there is obtained higher resolution to the one directional high density pattern, and the deep depth of focus. In this embodiment, even though the width in the X direction (cycle direction) of the regions 63A and 63B of both ends in FIG. 16A becomes narrow, the areas of the regions 63A and 63B are approximately the same degree as the areas of the regions 55A and 55B in FIG. 12, therefore, the deep depth of focus can be obtained.

In addition, instead of the center circular region 62 in FIG. 16A, as shown in FIG. 16B, it is also allowed that there may be used the amount of light distribution where the amount of light becomes large at the oval region 62A with X direction as longitudinal direction, in which X direction is direction (that is, direction in parallel to arrangement direction of three regions) perpendicular to the longitudinal direction of the peripheral oval regions 63A and 63B. In the amount of light distribution in FIG. 16B, the amount of light of two oval regions 63A and 63B, which put the oval region 62A therebetween, becomes large. Thus, by making the central region 62 oval shape, in some cases, it is possible to improve resolution in the isolated direction with respect to the one directional high density pattern without reducing the amount of light.

In addition, in the amount of light distribution of FIGS. 16A and 16B, it is allowed that the amount of light (for instance, intensity per unit area) of the center regions 62 and 62A is made different from the amount of light of peripheral regions 63A and 63B.

Furthermore, it is also allowed that distributed light in peripheral regions 63A and 63B in FIGS. 16A and 16B may be made linearly polarized light (for instance, longitudinal direction is the polarizing direction). In particular, in the amount of light distribution in FIG. 16B, as one example, it is preferable that the light distributed at the peripheral oval regions 63A and 63B is made the linear polarized light (S polarized light) in which the polarizing direction is the longitudinal direction thereof as shown by the arrows PC and PB (that is, the longitudinal direction is the direction corresponding to isolated direction of the pattern of the reticle in FIG. 11A). In this occasion, furthermore, it is preferable that the light distributed at the center oval region 62A is made the linear polarized light in which the polarizing direction is the longitudinal direction thereof (that is, the longitudinal direction is the direction corresponding to the cycle direction of pattern of the reticle in FIG. 11A) as shown in the arrow PA2. By this matter, in some cases, resolution and so forth to the specific pattern are improved.

In addition, when the lights distributed at the peripheral regions 63A and 63B are non-polarized lights, or the polarizing direction thereof do not agree with the longitudinal direction of the tangential line, in the amount of light distribution in FIGS. 16A and 16B, like the above, for instance, it is preferable that the polarization setting member is provided between the diffraction optical device and the fly eye lens 5. Similarly, in the amount of light distribution in FIG. 16B, when the lights distributed at the center region 62A are the non polarized lights, or the polarizing direction thereof does not agree with the longitudinal direction, it is preferable that its polarized condition is adjusted by the above polarization setting member.

Third Embodiment

Next, there will be explained a third embodiment of the present invention referring to FIG. 18 to FIG. 21. The first embodiment uses member including the diffraction optical devices 21, 22 as the optical member for setting the predetermined amount of light distribution, on the contrary, this embodiment uses the aperture stop as the optical member thereof, and in FIG. 18, there is attached the same symbol to a portion corresponding to FIG. 1A to omit its detailed description.

FIG. 18 shows a configuration of the projection exposure apparatus of this embodiment, in this FIG. 18, the illumination light IL from the exposure light source 1, is made incident into the fly-eye lens 5 via the beam expander 2 and the mirror 3. There is disposed the aperture stop (σ stop) 42 as the optical member for obtaining the predetermined amount of light distribution at the emission plane Q1 as the predetermined plane, in the emission plane Q1 (the pupil plane of the illumination system 12) of the fly-eye lens 5 of this embodiment. The aperture stop 42 is mounted on the revolver 41, and the revolver 41 is mounted with another aperture stop 44, and further, still another aperture stop (not shown in the drawings). The present embodiment is so constituted that the illumination condition is capable of being switched upon providing either of the aperture stops 42, 44 and so forth at the emission plane Q1 (pupil plane) while controlling the rotation angle of the revolver 41 via the driver 43 by the main control system 17.

The illumination light IL passed through the aperture stop 42 illuminates a slender illumination region of the pattern plane (reticle plane) of the reticle R as the mask with uniform intensity distribution via the condenser lens system 6, the field stops 7, 8, the image-forming lens system 9, the mirror 10 and the main condenser lens system 11. The illumination system 12 of the present embodiment is constituted by the exposure light source 1, the beam expander 2, the mirror 3, the fly-eye lens 5, the aperture stop 42 (or another aperture stop), the condenser lens system 6, the field stops 7, 8, the image-forming lens system 9, the mirror 10 and the main condenser lens system 11. The constitution in addition to the above is the same as the embodiment in FIG. 1A.

In this embodiment, the pattern on the reticle R of the object of transfer is the pattern including the contact hole having three-kind of different pitches as shown in FIG. 2. The aperture stop 42 in FIG. 18, in accordance with this, forms nine apertures in the shading plate to obtain the same amount of light distribution as the amount of light distribution in FIG. 3.

FIG. 19 shows the shape of the aperture stop 42. In FIG. 19, in the aperture stop 42 comprised of the shading plate, the aperture stop 42 is formed with nine apertures each of which is spaced mutually, which include a circular shaped aperture 45 with the optical axis BX of the illumination system 12 as the center, four circular shaped apertures 46A, 46B, 46C and 46D in which respective centers are disposed along the first circumference surrounding the aperture 45, and four circular shaped apertures 47A, 47B, 47C and 47D in which the centers thereof are disposed along the second circumference surrounding the apertures 46A to 46D. In addition, positions and shapes of the aperture 45, apertures 46A to 46D, and apertures 47A to 47D are the same as that of the region 28, region 29A to 29D, and regions 30A to 30D in which amount of light is approximately constant on the respective amount of light distribution in FIG. 3.

Accordingly, by employing the aperture stop 42, the amount of light distribution on the emission plane Q1 (pupil plane) of the fly-eye lens 5 becomes approximately constant at nine regions shown in FIG. 3 like the first embodiment, and becomes low at the region in addition thereto, therefore, it is possible to transfer the reticle pattern image including the contact hole having various kind of pitch as FIG. 2 on the wafer at once with high resolution. In the case that the aperture stop 42 is used as this embodiment, the utilization efficiency of the illumination light IL decreases, however, there is advantage that it is possible to set the amount of light distribution at the predetermined plane (the pupil plane or so forth of the illumination system 12) into the required condition accurately using simple constitution.

In addition, it is also allowed to use an aperture stop (also numbered 42) in which the center aperture is made the annular aperture 45R as shown in FIG. 20, instead of the aperture stop 42 in FIG. 19, or by combining it. In this case, the amount of light distribution, which is the same as FIG. 6A, is obtained accurately and easily, therefore, it is possible to further improve the resolution or the depth of focus. In addition, it is possible to form the amount of light distribution, which is the same as that of FIG. 6B, upon coupling two apertures respectively lined up in the radius direction at the aperture stop 42 in FIG. 20.

Further, the aperture stop 44 in FIG. 18, as shown in FIG. 21, is the stop in which the annular region 33R in FIG. 7A and corresponding parts to the regions 34A to 34D are made the bracelet shaped aperture 48R and the circular shaped apertures 49A to 49D respectively. Accordingly, by installing the aperture stop 44 on the emission plane Q1 (pupil plane) of the fly-eye lens 5, the amount of light distribution on the pupil plane, like FIG. 7A, becomes approximately constant at five regions, and becomes approximately zero at the region in addition thereto, therefore, there is obtained the wide depth of focus and high resolution with respect to the patterns having various kind of pitches.

In addition, it is possible to form the amount of light distribution, which is the same as that in FIG. 7B, upon coupling the annular shaped aperture 48R to the circular apertures 49A to 49D in the aperture stop 44 in FIG. 21.

In addition, in the present embodiment, a part other than the aperture is taken to as the light shielding part in the aperture stops 42, 44, however, it is also allowed that a part other than the aperture is taken to as a light attenuating part (a part where the light transmittance is small). In this case, in the amount of light distribution on the pupil plane of the illumination system, like FIG. 3, FIG. 6A and FIG. 7A, the amount of light does not become zero in the region other than five regions or nine regions. Further, in the present embodiment, the aperture stop is disposed on the pupil plane or the conjugated plane thereof of the illumination system 12, however, it is allowed that the aperture stop is disposed on a part adjacent to the incident plane of the fly-eye lens 5, for instance.

Fourth Embodiment

Next, referring to FIG. 22, a fourth embodiment of the present invention will be explained. The second embodiment employs the member including the diffractive optical elements 22A and 22B as the optical member for setting a predetermined distribution of amount of light, whereas this embodiment employs the aperture stop as its optical member. For this, in this embodiment, similarly to the third embodiment, the scan exposure type of the projection exposure apparatus of FIG. 18 is employed for exposure. However, in this embodiment, aperture stops 42A and 42B to be later described are used instead of the aperture stops 42 and 44 of FIG. 18 respectively, and the reticle stage RA of FIG. 11A is loaded onto the reticle stage 14 instead of the reticle R.

Also in this embodiment, it is assumed that the pattern of the reticle RA, being an object of transfer, is a pattern 52 including the pattern of one directional high density contact hole that is arranged in a pitch P in the X direction shown in FIG. 11A. In response hereto, the aperture stop 42A of FIG. 18 is produced by forming three apertures in the shading plate in order to obtain the distribution of amount of light identical to that of FIG. 12.

FIG. 22A shows a shape of its aperture stop 42A and in FIG. 22A, the aperture stops 42A to be composed of the shading plate has the three apertures including an annular aperture 66 with the optical axis BX of the illumination system 12 of FIG. 18 centered, and two circular apertures arranged so as to hold its aperture 66 between them, each of which is spaced from each other. In addition, the position and shape of the apertures 66, 67A and 67B are identical to areas 54, 55A and 55B having approximately constant amount of light on the distribution of amount of light of FIG. 12 respectively.

Accordingly, by employing the aperture stop 42, the distribution of amount of light on the exit plane Q1 (pupil plane) of the fly-eye lens 5 becomes approximately constant in three areas shown in FIG. 12 similarly to the second embodiment, and it becomes low in the area other than it, whereby the image of the pattern of the reticle including the pattern 52 of the one directional high density contact hole can be transferred onto the wafer with a high resolution in the X direction and the Y direction. In a case of employing the aperture stop 42A like the case of this embodiment, the utilization efficiency of the illumination light IL is lowered; however there exists an advantage that the simple configuration enables the distribution of amount of light on a predetermined plane (the pupil plane of the illumination system 12 or its conjugate plane) to be accurately set in a desired state.

In addition, the second aperture stop 42B of FIG. 18, as shown in FIG. 22B, is an aperture stop having the aperture 68 and slender oval apertures 69A and 69B formed responding to the circular area 62 and the slender oval areas 63A and 63B of FIG. 16A respectively. Accordingly, installing the aperture stop 42B on the exit plane Q1 (pupil plane) of the fly-eye lens 5 of FIG. 18 enables the pattern of the one directional high density contact hole to be transferred onto the wafer with a high resolution and yet at a deep depth of focus, similarly to the case of employing the illumination condition of FIG. 16A. In addition, in this embodiment, not only the aperture stops 42A and 42B shown in FIG. 22A and FIG. 22B, but also, for example, the aperture stop forming the distribution of amount of light shown in FIG. 15A to FIG. 15C and FIG. 16B can be used.

Additionally, in this embodiment, the aperture stop may be arranged not only on the pupil plane of the illumination system 12 or its conjugate plane, but also arranged closely to the incident plane of, for example, the fly-eye lens 5. In addition, in this embodiment, the section other than each of the aperture stops 42A and 42B is assumed to be a shading section; however the section other than its aperture may be assumed to be a light-reducing section (the portion having less quantity of light). In this case, with the distribution of amount of light on the pupil plane of the illumination optical-system 12, the amount of quantity does not become zero on the area other than three areas.

Fifth Embodiment

Next, referring to FIG. 23, a fifth embodiment of the present invention will be explained. The above-mentioned first to fourth embodiments employ the fly-eye lens as an optical integrator (uniformizer or homogenizer), whereas this embodiment uses an inner-plane reflection type integrator, for example, a rod type integrator as the optical integrator.

FIG. 23 shows the main part of the illumination system of the projection exposure apparatus of this embodiment, and this optical system of FIG. 23 is arranged, for example, between the mirror 3 of the illumination system 12 and the fixed field stop 7 of FIG. 1A. In FIG. 23, the illumination light IL from the exposure light source, which is not shown in the figure, enters the diffractive optical element 21 having an identical configuration to that of the first embodiment or the diffractive optical element 22A having an identical configuration to that of the second embodiment. The diffracted light from the diffractive optical element 21 (or 22A) is gathered in nine (or three) areas on the plane Q4 as a predetermined plane via a relay lens 152. In addition, the illumination light that has passed through the plane Q4 is gathered in the incident plane of a rod integrator 151 via a condenser lens 153. In this case, the plane Q4 is approximately positioned at the frontal focus plane of the condenser lens 153, and the incident plane of the rod integrator 151 is approximately positioned at the rear focus of the condenser lens 153.

In addition, the exit plane Q5 of the rod integrator 151 is a conjugate plane with the reticle plane, the fixed field stop 154 is arranged in the vicinity of this exit plane Q5, and closely hereto a movable field stop (not show in the figure) is arranged. In addition hereto, the illumination light to be injected from the rod integrator 151 illuminates a pattern of the reticle, which is not shown in the figure, through the optical system similar to the imaging lens system 9 and the main condenser lens system 11.

Also, in this embodiment, the distribution of amount of light shown in FIG. 3 (or FIG. 12) on the plane Q4 is set by using the diffractive optical element 21 (or 22A), thereby enabling the image of the pattern (or pattern including the one directional high density contact hole) including the variously pitched contact holes to be transferred onto the wafer at a time and with a high precision.

In addition, also in this embodiment, instead of employing the diffractive optical element 21, the aperture stop provided with nine apertures similar to the aperture stop 42 of FIG. 19 and FIG. 20, or the aperture stop 44 of FIG. 21 may be arranged on the plane Q4. Further, as described above, also in this embodiment, when it is necessary to adjust the polarization state of the luminous flux in at least one out of a plurality of the areas, for example, nine, five, or three areas, in which the amount of light is enhanced with the distribution of amount of light on the pupil plane of the illumination system, for example, the foregoing polarization setting member may be installed on the plane Q4.

Further, in FIG. 23, the diffractive optical element 22B of FIG. 1A for setting the distribution of amount of light of FIG. 16A may be arranged instead of the diffractive optical element 22A. In addition, as described above, when it is necessary to adjust the polarization state of the luminous flux in at least one out of three areas, in which the amount of light is enhanced with the distribution of amount of light on the pupil plane of the illumination system, for example, the foregoing polarization setting member may be installed on the plane Q4.

In addition, one pair of the interval-variable prisms 71 and 72 (movable prisms) of FIG. 1A may arranged for example, between a lens 152 of FIG. 23 and the plane Q4 to make the position in the radial direction of the area, in which the amount of light of the vicinity is large, variable.

Additionally, as the rod integrator 151 can be used the light-transmissive optical member that is of polygonal column shape, for example, of square column shape, of hexagonal column shape, etc. or the reflective member of such hollow metal etc. that is of polygonal column shape or of cylindrical column shape as mentioned above.

In addition, the focus point of the illumination light IL (diffracted light) IL by the condenser lens 153 should be deviated from the incident plane of the rod integrator 151.

Further, in this embodiment, the plane Q4 is assumed to be a predetermined plane (equivalent to the pupil plane of the optical system or its conjugate plane); however the predetermined plane is not limited hereto, and for example, it may be a plane between the rod integrator 151 and the reticle R (or the reticle RA). In addition, when, for example, any of the aperture stops 42 and 44 (or 42A and 42B) is employed instead of the diffractive optical element 21 (or 22A etc.), or in combination thereof, its aperture stop may be arranged in the downstream side (reticle side) of the rod integrator 151.

Additionally, in the above-mentioned first and fifth embodiments, in a case where both of the foregoing diffractive optical element and aperture stop are employed, thereby to set the distribution of amount of light of the illumination IL on the pupil plane of the illumination system, when the diffracted light to be generated from the diffractive optical element is distributed on the aperture stop as shown in FIG. 3 or FIG. 7A, the utilization efficiency of the illumination light becomes highest (the loss of the amount of light of the illumination light is minimized); however its diffracted light does not need to be accurately distributed as shown in FIG. 3 or FIG. 7A. That is, the utilization efficiency of the illumination light is lowered; however the diffractive optical element different from the foregoing diffractive optical elements (21 and 22) may be employed, thereby to distribute its diffracted light on a predetermined area including the area other than nine or five areas.

In addition, the aperture stop that is used in conjunction with the foregoing diffractive optical elements does not need always to have five or nine areas shown in FIG. 19 to FIG. 21, and the point is that it is enough to have the shading section or the light-reducing section for setting the distribution of amount of light of the diffracted light (illumination light IL), which is generated from the diffractive optical element and is distributed on the pupil plane of the illumination system or its conjugate plane, to the distribution of amount of light shown in FIG. 3, FIG. 6A, and FIG. 7A. For example, the diffractive optical element, which is employed for setting the distribution of amount of light of FIG. 3 or FIG. 4, may be used in conjunction with the aperture stop for partially shadowing or light-reducing the center of the center areas 29 or 33 of its distribution of amount of light, thereby to set the distribution of amount of light of FIG. 6A or FIG. 7A, and no necessity exists for forming the aperture, which corresponds to its distribution of amount of light (of five or nine areas in which the amount of light is enhanced) that should be set, on this aperture stop.

In addition, in the above-mentioned first and fifth embodiments, at least one part of the optical system (4; 152 and 153) that is provided between the diffractive optical element to be arranged within the illumination system and the optical integrator (5; 151) is assumed to be a zoom lens (afocal system), thereby to make the size of the nine or five areas, in which the illumination light IL on the pupil plane of the illumination system is distributed, variable. Further, at least one pair of the foregoing interval-variable prisms may be built in its optical system (4; 152 and 153). At this time, so as to distribute the illumination light IL on the center area (28; 33), each of the vicinities of the apexes of one pair of the prisms is cut out, thereby to assume the part, through which the illumination light IL to be distributed on the center area passes, to be an approximately vertical plane to the light axis BX of the illumination system.

Additionally, in the above-mentioned first and fifth embodiments, by means of the formation optical system (equivalent to the optical member), which is comprised of only a plurality of the diffractive optical elements that are arranged for replacement in the illumination system, or the formation optical system having its plurality of the diffractive optical elements and the optical system, in which at least one of the foregoing zoom lens and one pair of the prisms is built, combined, when the optical integrator is the fly eye lens 5, the intensity distribution of the illumination IL on its incident plane is caused to change, and when the optical integrator is the inner-plane reflection type integrator 151, the range of the incident angle of the illumination light IL that enters the its incident plane is changed, thereby allowing the distribution of amount of light (shape or size of the secondary light source) of the illumination light IL on the pupil plane of the illumination system, i.e. the illumination condition of the reticle to be changed arbitrarily. At this time, a plurality of the diffractive optical element to be hold in the revolver 24 are not limited to only the foregoing diffractive optical elements 21 and 22, and may include at least one out of the four diffractive optical elements to be used, for example, for each of the illuminating having small a, the annular illumination, the bipolar illumination, and the tetrapolar illumination. In addition, the foregoing aperture stop may be combined with its formation optical system. At this time, for example, one (including the foregoing diffractive optical element etc. except the aperture stop) out of the formation optical system may be arranged in the upstream side of the optical integrator (between the light source 1 and the optical integrator), and its aperture stop may be arranged in the downstream side of the optical integrator.

In addition, in the above-mentioned first, and third, and fifth embodiments, the pitch in the X direction of three patterns 25A to 25C shown in FIG. 2 is identical to that in the Y direction thereof respectively, whereby as shown in FIG. 3, the straight lines 31A and 31B, in which nine areas in which the illumination IL on the pupil plane of the illumination system is distributed are arranged, intersect each other in the optical axis of the illumination system; however when the pitch in the X direction of three patterns 25A to 25C differs from that in the Y direction thereof, the straight lines 31A and 31B do not intersect each other, that is, the distance in the X direction to the optical axis differs from the distance in the Y direction hereto in four middle areas 29A to 29D respectively, and yet the distance in the X direction to the optical axis differs from the distance in the Y direction hereto in four most peripheral areas 30A to 30D respectively. Additionally, the number (kind) of the pattern to be formed on the reticle is not limited to three, and it may be two or four, and the array directions of the pattern does not need always to coincide with the X direction and the Y direction respectively.

In addition, in the above-mentioned first, third, and fifth embodiments, by means of a plurality of the foregoing interval-variable prisms, each position of the four or eight areas except the center area, in which the light quantity on the pupil plane is enhanced, is made variable; however the number of its neighboring area is not limited to four or eight, and for example, two is acceptable.

Additionally, in the above-mentioned second, and fifth embodiments, in a case where both of the foregoing diffractive optical member and aperture stop are employed, thereby to set the distribution of amount of light of the illumination light IL on the pupil plane of the illumination system, when the diffracted light that is generated from the diffractive optical system is distributed on the aperture stop as shown in FIG. 12 or FIG. 16A, the utilization efficiency becomes highest (the loss of amount of light of the illumination light is minimized); however its diffracted light does not need to be accurately distributed as shown in FIG. 12 or FIG. 16A. That is, the diffractive optical element different from the foregoing diffractive optical elements 22A and 22B may be employed, thereby to distribute its diffracted light on a predetermined area including the area other than three areas even though the utilization efficiency becomes low.

In addition, the aperture stop, which is used in conjunction with the foregoing diffractive optical element, does not need always to have the three apertures shown in FIG. 22, and the point is that it is enough to have the shading section or the light-reducing section for setting the distribution of amount of light of the diffracted light (the illumination light IL), which is generated from the diffractive optical element and is distributed on the pupil plane of the illumination system or its conjugate plane, to, for example, the distribution of amount of light shown in FIG. 12, FIG. 15 and FIG. 16A. For example, the diffractive optical element, which is employed for setting the distribution of amount of light of FIG. 15A may be used in conjunction with the aperture stop for partially shading or light-reducing the center of the center area 54A of its distribution of amount of light, thereby to set the distribution of amount of light of FIG. 12, and no necessity exists for forming the aperture corresponding to its distribution of amount of light which should be set (three areas in which amount of light is enhanced), on this aperture stop.

In addition, in the above-mentioned second and fifth embodiments, at least one part of the optical system (4; 152 and 153) that is provided between the diffractive optical element to be arrange within the illumination system and the optical integrator (4; 152 and 153) may be assumed to be a zoom lens (afocal system), thereby make the size of three areas, in which the illumination light IL on the pupil plane of the illumination system is distributed, variable. Further, one pair of the foregoing interval-variable prisms may be built in its optical system (4; 152 and 153).

Additionally, in the above-mentioned second and fifth embodiments, by means of the formation optical system (equivalent to the optical member), which is comprised of only a plurality of the diffractive optical elements that are arranged for replacement in the illumination system, or the formation optical system, which has its plurality of the diffractive optical elements and the optical system, in which at least one of the foregoing zoom lens and one pair of the prisms is built, combined, when the optical integrator is the fly eye lens 5, the intensity distribution of the illumination IL on its incident plane is caused to change, and when the optical integrator is the inner-plane-reflection type integrator 151, the range of the incident angle of the illumination light IL that enters its incident plane is caused to change, thereby allowing the distribution of amount of light (shape or size of the secondary light source) of the illumination light IL on the pupil plane of the illumination system, i.e. the illumination condition of the reticle to be changed arbitrarily. At this time, a plurality of the diffractive optical element to be hold in the revolver 24 are not limited only to the foregoing diffractive optical elements 21 and 22, and may include at least one out of the four diffractive optical elements to be used for, for example, each of the small a illumination, the annular illumination, the bipolar illumination, and the tetra-polar illumination. In addition, its formation optical system and the foregoing aperture stop may be combined.

At this time, for example, one (including the foregoing diffractive optical element etc.) except the aperture stop out of the formation optical system may be arranged in the upstream side of the optical integrator (between the light source 1 and the optical integrator), and its aperture stop may be arranged in the downstream side of the optical integrator.

In addition, in the above-mentioned second, fourth, and fifth embodiments, the pattern being an object of transfer, is the pattern of the one directional high density contact hole (one directional high density contact hole); however the pattern, being an object of transfer, can be regarded as a pattern that is substantially isolated in one direction, and it is apparent that any pattern is acceptable so log as it is a pattern including the pattern to be periodically formed in the direction intersecting it (for example, orthogonal hereto).

Further, in the above-mentioned second, fourth, and fifth embodiments and its modified examples, three areas in which the amount of light is enhanced with the distribution of amount of light of the illumination light IL on the pupil plane of the illumination light system 12, which is substantially conjugate with the pupil plane Q3 of the projection optical system PL, or its conjugate plane (or predetermined plane), are adapted to be arranged along a straight line, which is parallel to the periodical direction of the foregoing one directional high density pattern, on its predetermined plane, and passes through the optical axis of the illumination optical light system, however its three areas do not need always to be arranged on the identical straight line. For example, out of the three areas, at least one of the remaining two areas except the center area may be deviated from the above-mentioned straight line in the Y direction, and its two areas are caused to differ from each other in the distances to the optical axis of the illumination system with regard to the Y direction light.

Figure 15D:
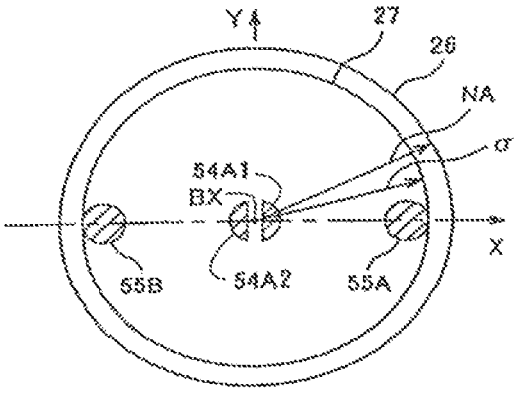

In addition, in the above-mentioned second, fourth, and fifth embodiments and its modified examples, as shown in FIG. 16C, for example, the center area out of the foregoing three areas may be not only of circle shape but also of annular shape or of square frame shape; however its shape (distribution of amount of light) is not restricted hereto. That is, with its center area, similarly to the annulus etc. the amount of light of the center thereof may be set to be smaller than that of other part, and for example, it may be comprised of a plurality of the areas (its shape is arbitrary), each of which is separated from the other as shown in FIG. 16C. At this time, its number or position of the plurality of the areas may be set so that the gravity center of amount of light of the center area approximately coincides with the optical axis of the illumination system, and for example, the number is preferably the total 2 n of n areas (n is a natural number) in which the center (gravity center) is out of the optical axis and the distances to the optical axis are approximately identical, and n areas which are symmetrically arranged to these n areas with regard to the optical axis. In addition, the plurality of the areas each of which is separated from the other in its center area may be arranged in a predetermined straight line that passes through the optical axis of the illumination system 12 on the foregoing predetermined plane, and, for example, may be arranged the identical straight line, and for example, may be two areas to be arranged along the identical straight line as shown in FIGS. 15D and 16C. Further, with the plurality of the areas each of which is separated from the other in its center area, its array direction may be decided responding to the size of its center area (equivalent to the σ value), and it is preferable that its array direction is caused to approximately coincide with that (X direction) of the foregoing three areas, for example, when the size of the center area is relatively small, and conversely, it is preferable that its array direction is caused to be approximately orthogonal to that (X direction) of the foregoing three areas (that is, it is assumed to the Y direction).

Moreover, in the above-mentioned second, fourth, and fifth embodiments and its modified examples, while the positions of the remaining areas except the center area out of the foregoing three areas, i.e. the distances to the optical axis of the illumination system with regard to the direction (X direction) parallel to the periodical direction of the foregoing one directional high density pattern are kept approximately equal, they may be made variable responding to its pitch.

In addition, in each of the above-mentioned embodiments, the formation optical system to be employed for altering the illumination condition of the reticle is adapted to include a plurality of the diffractive optical elements; however instead of these diffractive optical elements, for example, a plurality of the lens elements having different aberrations may be employed for replacement. Further, in case of employing the first and second prisms 71 and 72 of which the periphery forms a cone, altering the interval of the prisms 71 and 72, i.e. the distance of each area, in which the intensity on the pupil plane of the illumination system 12 is enhanced, to the optical axis BX allows the shape of each area to be changed responding to its alteration. Thereupon, when its change quantity exceeds a predetermined allowable value, for example, the foregoing zoom lens, the foregoing cylindrical lens or the like may be employed, thereby to suppress (lessen) a change in its shape.

In addition, the projection exposure apparatus of FIG. 1 may employ a double integrator technique in which two optical integrators are arranged along the optical axis BX within the illumination system 12, and these two optical integrators differ from each other in its kind. Additionally, in the above-mentioned embodiments, the distribution of amount of light of the illumination light on the pupil plane of the illumination system is enhanced in a plurality of the areas; however, for example, when the amount of light is reduced gradually, the so-called area in which the amount of light is enhanced points to the area in which the amount of light becomes equal to or more than a predetermined value.

Additionally, in each of the above-mentioned embodiments, in a case of employing vacuum ultraviolet light having a frequency of, for example, less than 180 nm or something like it as the illumination IL, the optical material of the refractive member such as the substrate of the diffractive optical elements 21, 22, 22A, and 22B, the glass substrate composing the reticles R and RA, and the lens composing the projection optical system PL is preferably formed of the material selected from a group of fluoride crystal such as quartzite ($CaF_2$), magnesium fluoride, and lithium fluoride, quartz glass having fluorine and hydrogen doped, quartz glass of which the structure determining temperature is 1200 K or less, and yet of which the hydroxyl group concentration is 1000 ppm or more (for example, disclosed in Japanese Patent No. 2770224 publication filed by this applicant), quartz glass of which the structure determining temperature is 1200 K or less, and yet of which the hydrogen molecule concentration is $1\times10^{17}$ molecules/$cm^3$ or more, quartz glass of which the structure determining temperature is 1200 K or less, and yet of which the base concentration is 500 ppm or less, and quartz glass of which the structure determining temperature is 1200 K or less, of which the hydrogen molecule concentration is $1\times10^{17}$ molecules/$cm^3$ or more and yet of which the chlorine concentration is 50 ppm or less (For example, disclosed in Japanese Patent No. 2936138 publication filed by this applicant (corresponding to U.S. Pat. No. 5,908,482)). On the other hand, in case of employing the ArF excimer laser beam, the KrF excimer laser beam or the like, it is possible to employ the synthesized quarts in addition to each of the above-mentioned substances as its optical material.

Next, one example of the process for fabricating the semiconductor device using the projection exposure apparatus of the above-mentioned embodiments will be explained with a reference to FIG. 24.

FIG. 24 shows an example of the process of fabricating the semiconductor device, and in FIG. 24, at first, a wafer W is fabricated from a silicon semiconductor etc. Thereafter, a photo resist is coated on the wafer W (step S10), and in a next step S12, the reticle R1 is loaded onto the reticle stage of the projection exposure apparatus of the above-mentioned embodiments (FIG. 1A or FIG. 18) to transfer (expose) the pattern (donated by a code A) of the reticle R1 (for example, the reticle R of FIG. 2) to the entire shot areas SE on the wafer WE with the scan exposure system. Additionally, the wafer W is for example, a wafer having a diameter of 300 mm (12-inch wafer), the shot area SE of which the width is 25 mm in the non-scan direction and 33 mm in the scan direction respectively, is of rectangular area. Next, in a step S14, by performing the developing, the etching, and the ion implantation, a predetermined pattern is formed in each shot area of the wafer W.

Next, in a step S16, the photo resist is coated on the wafer W (step S10), and thereafter, in a next step S18, the reticle R2 (for example, the reticle RA of FIG. 11A is loaded onto the reticle stage of the projection exposure apparatus of the above-mentioned embodiments (FIG. 1A or FIG. 18) to transfer (expose) the pattern (donated by a code B) of the reticle R2 (for example, the reticle R of FIG. 2) to the entire shot areas SE on the wafer WE with the scan exposure system. In addition hereto, in a step S20, by performing the developing, the etching, and the ion implantation, a predetermined pattern is formed in each shot area of the wafer W.

The exposure step to the pattern formation step described above (step S16 to step S20) are repeated by the number of times necessary for fabricating the desired semiconductor device. In addition hereto, through the dicing step of cutting each chip CP off the wafer W one by one (step S22), the bonding step, the packaging step (step S24) etc. the semiconductor device SP is fabricated as a product.

In addition, the illumination system to be composed of a plurality of lens and the projection optical system are built in the main frame of the exposure apparatus to make an optical adjustment, and the reticle stage and the wafer stage to be composed of a number of machine parts are mounted on the main frame of the exposure apparatus to connect the wiring cables and the pipes, and to further make a comprehensive adjustment (electric adjustment, operational confirmation, etc.), thereby enabling the projection exposure apparatus of the above-mentioned embodiments to be manufactured. Additionally, the projection exposure apparatus is desirably manufactured in a clean room in which the temperature and the cleanliness are controlled.

In addition, needless to say, the present invention can apply not only to the case of making an exposure with scan exposure type of the projection exposure apparatus, but also to the case of making an exposure with the batch exposure type of the projection exposure apparatus such as the stepper. The scale factor of the projection optical system in these cases may be a one-to-one factor, and may be an enlarged scale factor. Further, the present invention can apply, for example, to the case of making an exposure with the liquid-immersion type of projection exposure apparatus disclosed in international Publication Number (WO) 99/49504 etc., in which liquid LQ is provided between the projection system Pl and the wafer W (see FIG. 1D). The liquid-immersion type of projection exposure apparatus may be of the scan exposure technique employing the reflective/refractive type of the projection optical system, or may be of the static exposure technique employing the projection optical system of which the projection scale factor is ⅛. In the latter liquid-immersion type of projection exposure apparatus, so as to form a large pattern on the substrate, the step and stitch technique explained in the above-mentioned embodiment is preferably employed.

Additionally, the application of the liquid-penetration type of the projection exposure apparatus of the above-mentioned embodiment is not limited to that of the exposure apparatus for fabricating the semiconductor element, and for example, it can be widely applied for the exposure apparatus for the display apparatus such as the liquid display element or the plasma display, which is formed on the angular glass plate, or the exposure apparatus for fabricating the various devices such as the imaging element (CCD etc.), the micromachine, the thinly coated magnetic head, and the DNA chip. Further, the present invention can apply to the exposure step (exposure apparatus) in fabricating the reticle having the reticle pattern of the various devices using the photolithography step.

The aforementioned disclosures of all the United States Patents etc. are incorporated herein by reference, as far as the national laws of the designated states designated in the present international application or the elected states elected in the present international application permit.

The present invention is not limited to the above-mentioned embodiments, and the invention may, as a matter of course, be embodied in various forms without departing from the gist of the present invention. Furthermore, the entire disclosure of Japanese Patent Applications 2003-105920 filed on Apr. 9, 2003, 2003-299628 filed on Aug. 25, 2003, 2003-307806 filed on Aug. 29, 2003, 2003-329194 filed on Sep. 19, 2003, 2003-329309 filed on Sep. 22, 2003 including description, claims, drawings and abstract are incorporated herein by reference in its entirety.

INDUSTRIAL APPLICABILITY

In addition, in accordance with the method of fabricating the device, the device including the various patterns can be manufactured with a high precision and yet with a high throughput.

In addition, in the method of fabricating the device of the present invention, when the distribution of amount of light on a predetermined plane with regard to the illumination system is set so that the amount of light is enlarged in a predetermined three areas, the device including the one-direction mass pattern can be fabricated at a high precision.

The invention claimed is:
1. An illumination optical apparatus which illuminates a pattern on a mask with illumination light, the illumination optical apparatus comprising:
   an optical integrator arranged in an optical path of the illumination light;
   a deflecting member arranged in the optical path on an incidence side of the optical integrator, which deflects the illumination light so that the illumination light is distributed in a region on a pupil plane of the illumination optical apparatus, the region being away from an optical axis of the illumination optical apparatus;
   an optical system comprising a lens element, the optical system being arranged in the optical path between the deflecting member and the optical integrator so that a lens optical axis of the lens element is coincident with the optical axis of the illumination optical apparatus; and
   a polarization member arranged in the optical path between the lens element and the optical integrator, which changes a polarization state of the illumination light so that a polarization direction of the illumination light passing through the region is substantially coincident with a circumferential direction about the optical axis on the pupil plane,
   wherein the deflecting member is capable of modifying the region on the pupil plane by changing a deflecting property thereof.

2. The illumination optical apparatus according to claim 1, wherein
   an entrance surface of the optical integrator is arranged substantially at a back focal position of the optical system.

3. The illumination optical apparatus according to claim 1, wherein
   the optical system puts the deflecting member and an exit surface of the optical integrator into conjugation optically.

4. The illumination optical apparatus according to claim 1, wherein
   the deflecting member includes a diffractive element.

5. The illumination optical apparatus according to claim 1, wherein
   the region on the pupil plane includes at least one area located on a predetermined circumference around the optical axis.

6. The illumination optical apparatus according to claim 5, wherein
the at least one area includes a first area on a first straight line intersecting with the optical axis on the pupil plane, and
the polarization member changes the polarization state of the illumination light which is distributed to the first area on the pupil plane.

7. The illumination optical apparatus according to claim 6, wherein
the first area includes a pair of areas which are located at positions mutually symmetric with respect to the optical axis.

8. The illumination optical apparatus according to claim 6, wherein
the at least one area includes a second area on a second straight line intersecting with the optical axis and the first straight line on the pupil plane, and
the polarization member changes the polarization state of the illumination light which is distributed to the second area.

9. The illumination optical apparatus according to claim 8, wherein
the second area includes a pair of areas which are located at positions mutually symmetric with respect to the optical axis.

10. The illumination optical apparatus according to claim 9, wherein
the first straight line and the second straight line are substantially perpendicular to each other.

11. The illumination optical apparatus according to claim 1, further comprising a movable member arranged in the optical path between the lens element and the polarization member, which is movable along the optical axis and which is capable of modifying the region on the pupil plane.

12. The illumination optical apparatus according to claim 1, wherein:
the optical system comprises a zoom lens being capable of modifying the region on the pupil plane.

13. The illumination optical apparatus according to claim 1, wherein
the polarization member includes a ½ wave plate.

14. The illumination optical apparatus according to claim 1, wherein
the polarization member includes a ¼ wave plate.

15. The illumination optical apparatus according to claim 1, wherein
the optical integrator includes a fly's eye lens, and
an exit surface of the fly's eye lens is arranged so as to be substantially coincident with the pupil plane.

16. The illumination optical apparatus according to claim 1, wherein
the optical integrator includes a fly's eye lens, and
an exit surface of the fly's eye lens is arranged so as to be substantially coincident with an optical Fourier transform plane with respect to a plane on which the pattern is arranged.

17. An exposure apparatus which exposes a substrate with light from a pattern on a mask, the exposure apparatus comprising:
a stage which holds the substrate,
the illumination optical apparatus as defined in claim 1 which illuminates the pattern with the light; and
a projection optical system which projects an image of the pattern illuminated with the light onto the substrate held by the stage.

18. The exposure apparatus according to claim 17, wherein
the substrate is exposed with the light through liquid.

19. The exposure apparatus according to claim 17, wherein
an entrance surface of the optical integrator is arranged substantially at a back focal position of the optical system.

20. The exposure apparatus according to claim 17, wherein
the optical system puts the deflecting member and an exit surface of the optical integrator into conjugation optically.

21. The exposure apparatus according to claim 17, wherein
the deflecting member includes a diffractive element.

22. The exposure apparatus according to claim 21, wherein
the diffractive element includes a first diffractive element and a second diffractive element which are mutually interchangeable and arranged in the optical path.

23. The exposure apparatus according to claim 17, wherein
the region on the pupil plane includes at least one area located on a predetermined circumference around the optical axis.

24. The exposure apparatus according to claim 23, wherein
the at least one area includes a first area on a first straight line intersecting with the optical axis on the pupil plane, and
the polarization member changes the polarization state of the illumination light which is distributed to the first area on the pupil plane.

25. The exposure apparatus according to claim 24, wherein
the first areas includes a pair of areas which are located at positions mutually symmetric with respect to the optical axis.

26. The exposure apparatus according to claim 24, wherein
the at least one area includes a second area on a second straight line intersecting with the optical axis and the first straight line on the pupil plane, and
the polarization member changes the polarization state of the illumination light which is distributed to the second area.

27. The exposure apparatus according to claim 26, wherein
the second area includes a pair of areas which are located at positions mutually symmetric with respect to the optical axis.

28. The exposure apparatus according to claim 26, wherein
the first straight line and the second straight line are substantially perpendicular to each other.

29. The exposure apparatus according to claim 17, wherein
the polarization member includes a ½ wave plate.

30. The exposure apparatus according to claim 17, wherein
the polarization member includes a ¼ wave plate.

31. The exposure apparatus according to claim 17, wherein
the optical integrator includes a fly's eye lens, and
an exit surface of the fly's eye lens is arranged so as to be substantially coincident with the pupil plane.

32. The exposure apparatus according to claim 17, wherein the optical integrator includes a fly's eye lens, and an exit surface of the fly's eye lens is arranged so as to be substantially coincident with an optical Fourier transform plane with respect to a plane on which the pattern is arranged.

33. An exposure method for exposing a substrate with light from a pattern on a mask, the exposure method comprising:

holding the substrate by a stage;

illuminating the pattern with the light by using the illumination optical apparatus as defined in claim 1; and projecting an image of the pattern illuminated with the light onto the substrate held by the stage.

34. The exposure method according to claim 33, wherein the substrate is exposed with the light through liquid.

35. A device manufacturing method, comprising:

transferring a pattern to a substrate by using the exposure method as defined in claim 33; and developing the substrate to which the pattern is transferred.

36. The device manufacturing method according to claim 35, wherein the pattern is transferred to the substrate with light through liquid.

37. A device manufacturing method, comprising:

transferring a pattern to a substrate by using the exposure apparatus as defined in claim 17; and developing the substrate to which the pattern is transferred.

38. The device manufacturing method according to claim 37, wherein the pattern is transferred to the substrate with light through liquid.

* * * * *